United States Patent
Nakamura et al.

(10) Patent No.: US 7,064,998 B2
(45) Date of Patent: Jun. 20, 2006

(54) SEMICONDUCTOR MEMORY

(75) Inventors: Toshikazu Nakamura, Kawasaki (JP); Satoshi Eto, Kawasaki (JP); Toshiya Miyo, Kawasaki (JP)

(73) Assignee: Fujitsu Limited, Kawasaki (JP)

(*) Notice: Subject to any disclaimer, the term of this patent is extended or adjusted under 35 U.S.C. 154(b) by 0 days.

(21) Appl. No.: 11/215,045

(22) Filed: Aug. 31, 2005

(65) Prior Publication Data
US 2006/0023547 A1   Feb. 2, 2006

Related U.S. Application Data

(60) Division of application No. 10/965,951, filed on Oct. 18, 2004, which is a continuation of application No. PCT/JP03/01853, filed on Feb. 20, 2003.

(30) Foreign Application Priority Data
Jun. 25, 2002   (WO) ............. PCT/JP02/06327

(51) Int. Cl.
G11C 7/00   (2006.01)
(52) U.S. Cl. .............. 365/222; 365/189.08; 365/233.5
(58) Field of Classification Search .............. 365/233, 365/222, 230.05, 230.08, 189.08, 189.05, 365/233.5
See application file for complete search history.

(56) References Cited

U.S. PATENT DOCUMENTS

| | | | |
|---|---|---|---|
| 5,301,278 A | 4/1994 | Bowater et al. | |
| 6,324,113 B1* | 11/2001 | Tomita | 365/222 |
| 6,515,928 B1 | 2/2003 | Sato et al. | |
| 6,697,910 B1 | 2/2004 | Tsukude et al. | |
| 6,813,212 B1 | 11/2004 | Takahashi et al. | |
| 6,826,104 B1* | 11/2004 | Kawaguchi et al. | 365/222 |
| 6,834,021 B1* | 12/2004 | Mori et al. | 365/222 |
| 6,876,592 B1* | 4/2005 | Takahashi et al. | |
| 2002/0064079 A1 | 5/2002 | Sato et al. | |
| 2002/0067648 A1 | 6/2002 | Hyoung | |
| 2002/0159318 A1 | 10/2002 | Arimoto et al. | |
| 2002/0181301 A1 | 12/2002 | Takahashi et al. | |

(Continued)

FOREIGN PATENT DOCUMENTS
CN   1355536   6/2002

(Continued)

OTHER PUBLICATIONS

Data Sheet Mos Intergrated Circuit uPD4632312-X 32M-BIT CMOS Mobile Specified RAM 2M-WORD by 16-BIT Extended Temperature Operation, Document No. M15406EJ8V0DS00 (8th Edition), Oct. 2002, pp. 1-47.

Primary Examiner—Anh Phung
Assistant Examiner—Hien Nguyen
(74) Attorney, Agent, or Firm—Arent Fox PLLC

(57) ABSTRACT

A timer measures a predetermined time from the reception of an external access signal, and outputs an access request signal after the predetermined time has elapsed. The external access signal causes a memory core to execute a read operation, and the access request signal causes the memory core to operate. The predetermined time is set to be longer than a core operation time for the memory core to perform a single operation. The memory core thus performs no operation when the external access signal varies in a time shorter than the predetermined time. Consequently, it is possible to prevent the memory core from malfunctioning and data retained therein from crashing even when external access signals are supplied at intervals at which the memory core is unable to properly operate.

20 Claims, 64 Drawing Sheets

U.S. PATENT DOCUMENTS

2003/0227810 A1 * 12/2003 Fujioka ................. 365/222
2006/0007770 A1 * 1/2006 Shinozaki et al. ......... 365/222

FOREIGN PATENT DOCUMENTS

| EP | 1 225 589 A2 | 7/2002 |
| EP | 1 235 228 | 8/2002 |
| EP | 1 267 344 A1 | 12/2002 |
| EP | 1 282 133 A1 | 2/2003 |
| JP | 63-106993 | 5/1988 |
| JP | 10-247399 | 9/1989 |
| JP | 2001-332088 A | 11/2001 |
| JP | 2001-357670 | 12/2001 |
| JP | 2000-3270677 | 9/2003 |
| WO | 01/41149 A1 | 6/2001 |
| WO | 01/67461 A1 | 9/2001 |
| WO | 01/69606 A1 | 9/2001 |

* cited by examiner

SEMICONDUCTOR MEMORY

CROSS REFERENCE TO RELATED APPLICATION

This is a Divisional Application, which claims the benefit of pending U.S. patent application Ser. No. 10/965,951, filed Oct. 18, 2004. Which is also a continuation application of International Application PCT/JP03/01853, filed Feb. 20, 2003, and designating the U.S. The disclosure of the prior application is hereby incorporated herein in its entirety by reference.

BACKGROUND OF THE INVENTION

1. Field of the Invention

The present invention relates to a semiconductor memory which has volatile memory cells having capacitors and has an SRAM interface.

2. Description of the Related Art

Recently, mobile devices such as a cellular phone have been sophisticated in service facilities, and the amounts of data to be handled continue growing. Then, higher capacities are required of the work memories to be mounted on the mobile devices accordingly.

Conventionally, the work memories of the mobile devices have used SRAMs which allow easy system configuration. The SRAMs are, however, greater than DRAMs in the number of devices for constituting each single bit of cell, and thus are disadvantageous for higher capacities. On this account, semiconductor memories referred to as pseudo SRAMs, having both the high capacities of DRAMs and the usability of SRAMs, have been developed. The pseudo SRAMs have DRAM memory cells and SRAM interfaces. An overview of a pseudo SRAM is disclosed, for example, in U.S. Pat. No. 6,392,958.

Since the pseudo SRAMs have DRAM memory cores, the memory cells must be rewritten to avoid data crash after data read. Consequently, in a read operation, if a word line is selected and a different address signal is supplied to select another word line, the rewrite fails to be performed properly and the data in the memory cells crashes. That is, the pseudo SRAM malfunctions. In contrast, since SRAM memory cells are made of latches, the data in the memory cells will not crash even if a read operation is interrupted by the supply of another address signal during the read operation.

To avoid the foregoing malfunction, pseudo SRAMs have the timing specification that disables such a change in the address signal as reselects word lines during a read cycle.

The pseudo SRAMs have SRAM interfaces, and are basically compatible with SRAMs. As compared to SRAMs, however, there are some restrictions such as the timing specification as to the address change mentioned above. Thus, when the SRAMs mounted on systems are replaced with the pseudo SRAMs, the controllers for controlling the memories sometimes require modification.

Meanwhile, when a pseudo SRAM has 16 bits of I/O terminals (two bytes), external terminals for inputting a lower byte signal /LB and an upper byte signal /UB are typically formed so that data is input/output in units of a single byte. When lower eight bits of data are written to the memory cells or read from the memory cells, the lower byte signal /LB is enabled. When upper eight bits of data are written to the memory cells or read from the memory cells, the upper byte signal /UB is enabled. The product specifications on the pseudo SRAMs of this type are described, for example, in the data sheet of μPD4632312-X, a pseudo SRAM from NEC Corporation.

Nevertheless, while the pseudo SRAMs of this type can input and output data in units of bytes, the memory cores operate in response to 16 bits of data. Thus, for example, in writing lower 1-byte data alone to a memory core, upper 1-byte data must be masked from being written to the memory core. In addition, if the enable periods of the lower byte signal /LB and the upper byte signal /UB overlap in part, the write operation to the memory core must be started in time with the signal of slower disable timing between the lower byte signal /LB and the upper byte signal /UB.

As above, the conventional pseudo SRAMs of 16-bit configuration require a circuit for controlling the data mask and a circuit for controlling the start of a write operation (write wait circuit) for the sake of byte write. This has grown the control circuits in scale, producing the problem of greater chip size. In addition, the complicated write control at the time of byte write decreases the timing margin.

SUMMARY OF THE INVENTION

It is an object of the present invention to improve SRAM compatibility and usability of a semiconductor memory having both high capacity of a DRAM and the interface of an SRAM. In particular, an object is to prevent data retained in the memory cells from crashing due to a change in the address signal.

Another object of the present invention is to control, with a simple control circuit, the write operation of pseudo SRAMs capable of writing a plurality of data groups to their memory core independent of each other.

According to one of the aspects of the semiconductor memory of the present invention, a timer measures a predetermined time from the reception of an external access signal, and outputs an access request signal after the predetermined time has elapsed. The external access signal causes a memory core to execute a read operation, and the access request signal causes the memory core to operate. The predetermined time is set to be longer than a core operation time for the memory core to perform a single operation. The memory core thus performs no operation when the external access signal varies in a time shorter than the predetermined time. Consequently, it is possible to prevent the memory core from malfunctioning and data retained therein from crashing even when external access signals are supplied at intervals at which the memory core is unable to properly operate.

According to another aspect of the semiconductor memory of the present invention, an edge detecting circuit outputs a transition detected signal when it detects a transition edge of the external access signal. The timer starts measuring the predetermined time in response to the transition detected signal. It is therefore possible to detect the change in the external access signal with reliability and to start the operation of the timer.

According to another aspect of the semiconductor memory of the present invention, a reset circuit generates a reset signal for resetting the timer, in synchronization with the transition detected signal. A set circuit generates a set signal for start of the timer, in synchronization with the transition detected signal with a delay from the generation of the reset signal. Since the timer is surely reset, before started, by the reset signal, it is possible to always measure the predetermined time correctly.

According to another aspect of the semiconductor memory of the present invention, the reset circuit generates the reset signal in response to the access request signal output from the timer. Alternatively, the reset circuit outputs the reset signal while a chip enable signal as the external access signal is in inactivation. Alternatively, the reset circuit outputs the reset signal while the external access signal for making the memory core perform a write operation is being supplied. Since the timer is reset when the timer does not need to operate, the timer is avoided from malfunctioning with reliability.

According to another aspect of the semiconductor memory of the present invention, the timer has an oscillator and a counter. The oscillator starts in response to the transition detected signal, and generates an internal clock signal. The counter measures the predetermined time by counting the number of pulses of the internal clock signal, and outputs the access request signal after the measurement of the predetermined time. The timer is made of the oscillator and the counter in combination so that the predetermined time can be measured easily with a high degree of precision.

According to another aspect of the semiconductor memory of the present invention, a refresh request circuit periodically outputs a refresh request for refreshing the memory cell. A refresh hold circuit holds the refresh request. A refresh mask circuit outputs the refresh request held in the refresh hold circuit as a refresh start signal while the memory core is not in operation or the counter is not measuring the predetermined time. In addition, the refresh mask circuit disables the output of the refresh start signal while the memory core is in operation or the counter is measuring the predetermined time. That is, the refresh mask circuit functions as an arbiter circuit to determine priority between the refresh operation and an access operation. This makes it possible to avoid a conflict between the refresh operation and the access operation.

Moreover, the start timings of the access operation and the refresh operation can be set to come after the measurement of the predetermined time by disabling the start of the refresh operation during the measurement of the predetermined time. This enables easy control over the arbitration between the access operation and the refresh operation which occurs in response to refresh requests occurring at random.

According to another aspect of the semiconductor memory of the present invention, an access hold circuit holds the access request signal. An access mask circuit outputs the access request signal held in the access hold circuit as an access start signal for start of operation of the memory core while the memory core is not in operation. Besides, the access mask circuit disables the output of the access start signal while the memory core is in operation. That is, the access mask circuit functions as an arbiter circuit to determine priority between the refresh operation and the access operation. It is therefore possible to avoid a conflict between the access operation and the refresh operation which occurs in response to refresh requests occurring at random.

According to another aspect of the semiconductor memory of the present invention, an address signal as the external access signal is permitted to be held only for a period shorter than the predetermined time or longer than a cycle time necessary for a single read operation. The address signal is prohibited from being held for a period longer than the predetermined time and shorter than the cycle time. If the address signal is held longer than the predetermined time and shorter than the cycle time, the memory core starts operation. However, the hold time for the address signal is shorter than the cycle time so that output data will be invalid. Setting the cycle time to include a time taken for invalid memory core operations is a waste of time because the invalid memory core operations do not contribute to any access. According to the present invention, it is able to disable invalid memory core operations, thereby reducing the cycle time.

According to another aspect of the semiconductor memory of the present invention, a disable terminal receives a disable signal for disabling the timer from measuring the predetermined time. A start signal output circuit outputs the access request signal forcefully in response to the reception of the external access signal while the disable signal is being supplied. Consequently, a system on which the semiconductor memory is mounted, for example, can access the semiconductor memory in accordance with the actual operational performance of the memory core.

According to another aspect of the semiconductor memory of the present invention, a refresh request circuit periodically outputs a refresh request for refreshing the memory cell. A refresh hold circuit holds the refresh request. A refresh mask circuit outputs the refresh request held in the refresh hold circuit as a refresh start signal while the disable signal is not being supplied. In addition, the refresh mask circuit disables the output of the refresh start signal while the disable signal is being supplied. Temporarily disabling the refresh operation which responds to the refresh requests occurring at random makes it possible to access the semiconductor memory in a shortest time according to the actual operational performance of the memory core.

According to another aspect of the semiconductor memory of the present invention, a test mode circuit enters into a test mode when an external terminal receives in succession a plurality of signals having predetermined logic values. Consequently, the semiconductor memory can be easily brought into the test mode without having a dedicated test terminal.

According to another aspect of the semiconductor memory of the present invention, when or after entering the test mode, a test decode circuit can select a test to perform from among a plurality of tests in accordance with the logic value of a signal supplied to the external terminal.

According to another aspect of the semiconductor memory of the present invention, a write mask circuit disables a write operation in response to a write enable signal supplied at the time of the entry into the test mode. This can prevent erroneous write operation at the time of entry into the test mode, which destroys the data retained in the memory cell.

According to another aspect of the semiconductor memory of the present invention, in the test mode a first test circuit disables the timer from measuring the predetermined time and outputs the access request signal forcefully in response to the reception of the external access signal. Therefore, it is easy to evaluate the actual value of the access time to the memory core.

According to another aspect of the semiconductor memory of the present invention, in the test mode a second test circuit outputs to an external terminal a measurement signal indicating that the timer is measuring the predetermined time. The predetermined time can thus be measured easily.

According to another aspect of the semiconductor memory of the present invention, the second test circuit has a reset disable circuit and a timer output circuit. The reset disable circuit disables the timer from being reset after the predetermined time has elapsed, in order to measure the predetermined time repeatedly. The timer output circuit receives the access request signals output in every predetermined time in accordance with the operation of the reset disable circuit, outputs the measurement signal in response to the first access request signal, and receives the access request signal a predetermined number of times before it stops outputting the measurement signal. The measurement signal is output until a plurality of number of predetermined times have elapsed. Consequently, the predetermined time can be measured with a high degree of precision.

According to another aspect of the semiconductor memory of the present invention, in the test mode a third test circuit generates a refresh request forcefully in response to the external access signal. Next, the third test circuit starts a refresh operation according to the refresh request upon the completion of a read operation corresponding to the external access signal. Furthermore, the third test circuit generates a request for a read operation forcefully in response to the refresh operation, and performs the read operation. In general, the worst access time occurs when a refresh request is issued in a read operation. Nevertheless, since the refresh request occurs at random, it is difficult to make the semiconductor memory perform the worst access operation by external control. According to the present invention, the third test circuit can realize the worst access operation easily, thereby measuring the worst access time.

According to another aspect of the semiconductor memory of the present invention, a write control circuit outputs a first write signal for operation of a first memory unit of the memory core in response to a write enable signal and a first data enable signal. The write control circuit also outputs a second write signal for operation of a second memory unit of the memory core in response to the write enable signal and a second data enable signal.

The first memory unit writes first write data to the memory cell in response to the first write signal. The second memory unit writes second write data to the memory cell in response to the second write signal. The first and second memory units operate independent of each other in accordance with the first and second write signals, respectively. Consequently, no matter what timing the write enable signal and the first and second data enable signals are supplied at, the write control circuit has only to output the first and second write signals at predetermined timing in accordance with these control signals. In other words, the write control circuit need not make a control such as shifting of the start timing of a write operation in accordance with the supply timing of the control signals. This allows a reduction in the circuit scale of the semiconductor memory and improves the timing margin of the write control circuit. As a result, it is possible to reduce the write cycle time.

According to another aspect of the semiconductor memory of the present invention, an input control circuit outputs the first and second write data to the first and second memory units in response to the first and second write signals, respectively. This eliminates, for example, the necessity of formation of mask logic on the semiconductor memory for inhibiting data write to the second memory unit when writing data to the first memory unit. As a result, the semiconductor memory can be reduced in circuit scale. Since the data mask control is made unnecessary, it is possible to improve the timing margin of the circuits pertaining to a write operation, with a reduction in write cycle time.

According to another aspect of the semiconductor memory of the present invention, the semiconductor memory has a sub state machine and a main state machine. A memory core has a memory cell that requires a refresh for the sake of data retention. A refresh control circuit generates a refresh command to refresh the memory cell at predetermined intervals.

The sub state machine has a ready state to which it makes a transition when no read command is supplied, and a reserve state to which it makes a transition from the ready state in response to a read command. The sub state machine issues a refresh permission, a read permission, and a write permission to operate the memory core in accordance with a refresh command occurring inside the semiconductor memory, and a read command and a write command supplied from exterior, respectively.

The main state machine has an idle state in which it puts the memory core into nonoperation, a read state in which it makes the memory core perform a read operation, a write state in which it makes the memory core perform a write operation, and a refresh state in which it makes the memory core perform a refresh operation. The main state machine transits from the idle state to the refresh state according to the refresh permission, thereby making the memory core perform a refresh operation. The main state machine transits from the idle state to the read state according to the read permission, thereby making the memory core perform a read operation. The main state machine transits from the idle state to the write state according to the write permission, thereby making the memory core perform a write operation.

The state machine controlling the operation of the semiconductor memory is composed of the main state machine directly controlling the operation of the memory core and the sub state machine controlling the operation of the internal circuits according to the operational commands from the memory core, so that it is possible to prevent the state machine from being complex in configuration. Simplification of the individual state machines enables a simple configuration of the control circuits formed in the semiconductor memory corresponding to the respective state machines. As a result, it is possible to reduce the time taken for the circuit design of the semiconductor memory.

In general, the memory core is often used commonly for a plurality of types of semiconductor memories. Here, the main state machines controlling the operation of the memory cores correspond to almost the same control circuits, therefore, previously designed control circuits can be also used for them. That is, the development of a new semiconductor memory is realized by designing only a new sub state machine related to command input specifications. This makes it possible to reduce the period and cost for the development of the semiconductor memory because verification needs to be done intensively only for the sub state machine. In contrast, if the state machine is one integrated machine, it is necessary to distinguish portions that are convertible and portions that have to be created newly, which lengthens the time taken for the verification of the state machine.

According to another aspect of the semiconductor memory of the present invention, the sub state machine issues a read permission a predetermined time after transiting to the reserve state in response to the read command, and transiting from the reserve state to the ready state. The main state machine makes a transition from the idle state to the read state in order to perform the read operation in response to the read permission. When the sub state machine receives a new read command in the reserve state responding to the read command, it resets the reserve state, and makes a transition to a new reserve state in order to measure the predetermined time again. Thus, with the read commands supplied at intervals shorter than a predetermined interval, the memory core performs no operation. This accordingly prevents malfunction of the memory core when read commands are supplied at intervals at which the memory core is unable to properly operate. As a result, the semiconductor memory having the memory cell that requires a refresh can operate with the same timing specification as that of a static RAM.

According to another aspect of the semiconductor memory of the present invention, the sub state machine receives the refresh command in the reserve state, and issues the read permission and the refresh permission after the predetermined time has elapsed. After the read operation in response to the read permission, the main state machine makes a transition from the idle state to the refresh state in order to perform the refresh operation in response to the refresh permission. Thus, when the refresh command is supplied in the reserve state, the read operation can be performed with priority over the refresh operation. As a result, it is possible to shorten the time from the supply of the read command to the output of the read data (read access time).

According to another aspect of the semiconductor memory of the present invention, the sub state machine, when receiving the refresh command and a new read command in succession in the reserve state before the predetermined time has elapsed, issues a refresh permission, resets the reserve state, and makes a transition to a new reserve state. The main state machine transits from the idle state to the refresh state in order to perform the refresh operation in response to the refresh permission. Thus, when the refresh command and a new read command are supplied successively in the reserve state, the refresh operation is performed with priority. Since the refresh operation can be performed within the reserve period, it is possible to hide the refresh cycle from external systems. That is, the semiconductor memory having the memory cell that requires a refresh can perform the same operation as that of a static RAM.

According to another aspect of the semiconductor memory of the present invention, the sub state machine, when receiving the write command in the reserve state before the predetermined time has elapsed, issues a write permission and transits to the ready state. The main state machine transits from the idle state to the write state in order to perform the write operation in response to the write permission. Consequently, while the memory core is in the idle state, the write operation is immediately performed, responding to the write command.

According to another aspect of the semiconductor memory of the present invention, the main state machine can make a transition to the refresh state, the read state, and the write state only from the idle state. On this account, when the read permission, the refresh permission, or the write permission is issued in any of the refresh state, the read state, and the write state, the main state machine transits to the idle state first after the memory core completes its operation, and then transits to a new state.

According to another aspect of the semiconductor memory of the present invention, the sub state machine, when receiving the refresh command in the ready state, remains in the ready state and issues a refresh permission. The main state machine makes a transition from the idle state to the refresh state in order to perform the refresh operation in response to the refresh permission. Thus, while the memory core is in the idle state, the refresh operation is immediately performed, responding to the refresh command.

According to another aspect of the semiconductor memory of the present invention, the sub state machine, when receiving the refresh command and a standby command successively in the reserve state, issues a refresh permission and makes a transition from the reserve state to the ready state. The main state machine makes a transition from the idle state to the refresh state in order to perform the refresh operation in response to the refresh permission. Thus, when the refresh command and the standby command are supplied in the reserve state, the refresh operation is performed with priority. In the ready state the read operation corresponding to the read command is started after the predetermined time has elapsed. Starting the refresh operation in the ready state makes it possible to hide the refresh cycle from external systems.

The write operation requires the specification up to the reception timing of the write data (timing specification of the semiconductor memory). Meanwhile, the time from the reception of the write data to the start of the write operation can be set according to the internal state of the semiconductor memory. Thus, the write operation corresponding to the write command supplied during a refresh operation can be performed after the refresh operation.

According to another aspect of the semiconductor memory of the present invention, the sub state machine, when receiving the write command in the ready state, remains in the ready state and issues a write permission. The main state machine makes a transition from the idle state to the write state in order to perform the write operation in response to the write permission. Consequently, while the memory core is in the idle state, the write operation is performed immediately, responding to the write command.

BRIEF DESCRIPTION OF THE DRAWINGS

The nature, principle, and utility of the invention will become more apparent from the following detailed description when read in conjunction with the accompanying drawings in which like parts are designated by identical reference numbers, in which.

DESCRIPTION OF THE PREFERRED EMBODIMENTS

Hereinafter, embodiments of the present invention will be described with reference to the drawings.

Figure 1:
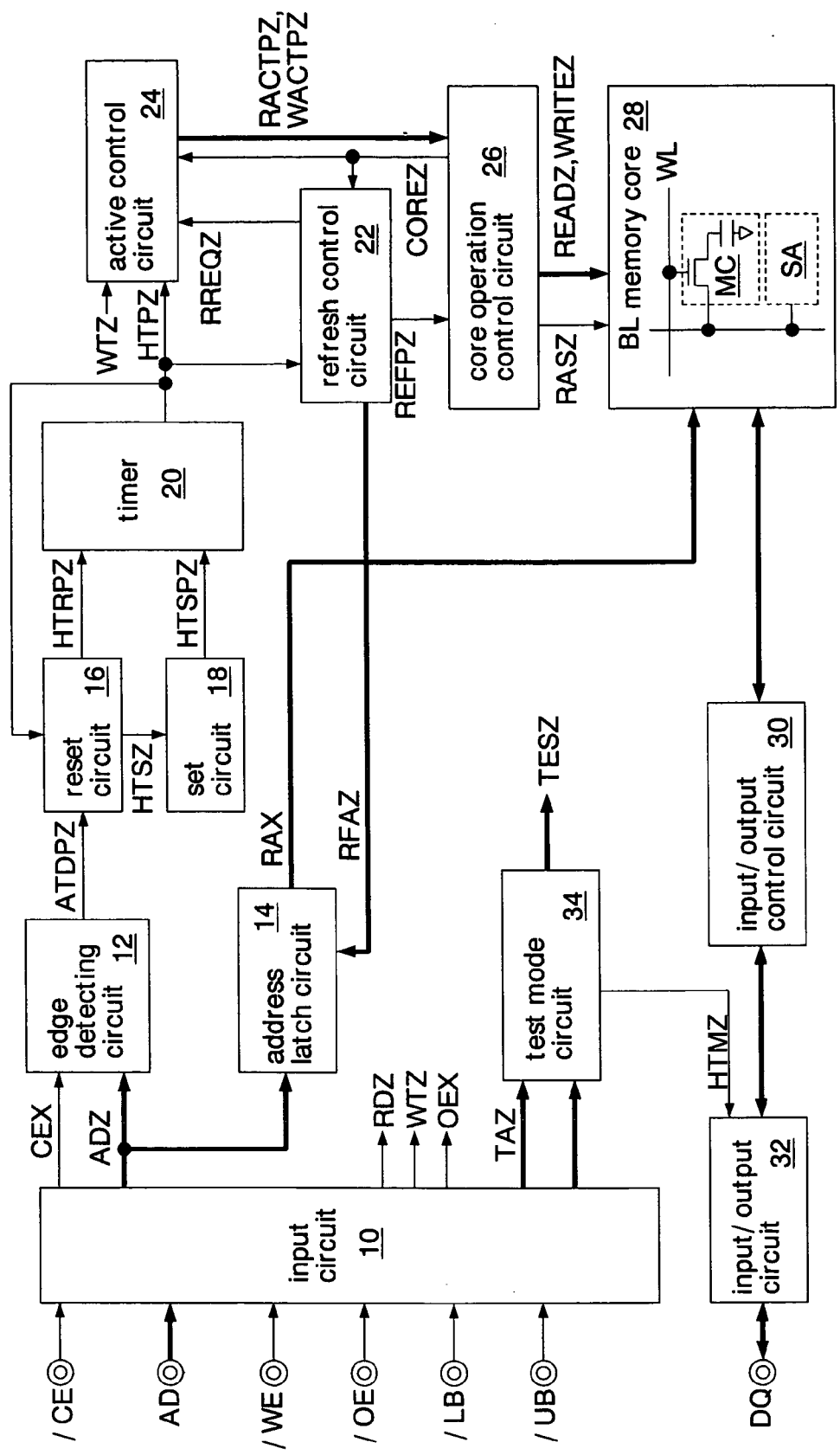
FIG. 1 is a block diagram showing a first embodiment of the semiconductor memory of the present invention.

FIG. 1 shows a first embodiment of the semiconductor memory of the present invention. In the drawings, each thick line represents a signal line that consists of a plurality of lines. Double circles in the drawings represent external terminals. Signals with a leading "/" and signals ending in "X" are of negative logic. Signals ending in "Z" are of positive logic. Signals ending in "PZ" are output as positive pulse signals. In the following description, signal names may be abbreviated like a "/CE signal" for a "chip enable signal /CE".

This semiconductor memory is formed as a clock asynchronous FCRAM (Fast Cycle RAM) on a silicon substrate by using CMOS processes. The FCRAM is a pseudo SRAM having a DRAM memory core and a SRAM interface.

The FCRAM has an input circuit 10, an edge detecting circuit 12, an address latch circuit 14, a reset circuit 16, a set circuit 18, a timer 20, a refresh control circuit 22, an active control circuit 24, a core operation control circuit 26, a memory core 28, an input/output control circuit 30, an input/output circuit 32, and a test mode circuit 34. FIG. 1 shows essential signals alone. The signals input/output to/from the individual circuit blocks will be detailed in FIG. 2 and later.

The input circuit 10 receives a chip enable signal /CE, an address signal AD, a write enable signal /WE, an output enable signal /OE, a lower byte signal /LB, and an upper byte signal /UB which are supplied from external terminals. According to the received signals, the input circuit 10 outputs an internal chip enable signal CEX, an internal address signal ADZ, a test address signal TAZ, a read signal RDZ, a write signal WTZ, an internal output enable signal OEX, and so on. The chip enable signal /CE, the address signal AD, and the write enable signal /WE are external access signals for making the memory core 28 perform a read operation or a write operation. Note that the present invention may be applied to an FCRAM that is supplied with two chip enable signals /CE1 and CE2.

The edge detecting circuit 12 outputs an address transition signal ATDPZ (transition detected signal) when it detects a transition edge of the internal address signal ADZ or the internal chip enable signal CEX.

The address latch circuit 14 latches the internal address signal ADZ and a refresh address signal RFAZ which is generated by a refresh address counter in the refresh control circuit 22, and outputs either of the latched signals as a latched address signal RAX.

The reset circuit 16 outputs a timer set signal HTSZ in response to the address transition signal ATDPZ. In a read operation, the reset circuit 16 outputs a timer reset signal HTRPZ in response to the address transition signal ATDPZ or a hold end signal HTPZ from the timer 20. In a write operation, the timer reset signal HTRPZ is fixed to high level. The set circuit 18 outputs a timer set signal HTSPZ in response to the timer set signal HTSZ.

The timer 20 initializes its interior when it receives the timer reset signal HTRPZ, and starts operation when it receives the timer set signal HTSPZ. The timer reset signal HTRPZ is fixed to high level during a write operation, so that the timer 20 makes no operation. The hold end signal HTPZ for starting a read operation is output a predetermined time after the start of operation of the timer 20. In this way, the hold end signal HTPZ is output a predetermined time (hold time) after the change in the address signal AD or the chip enable signal /CE.

The refresh control circuit 22 contains a self-refresh timer (refresh request circuit), and outputs a refresh request signal RREQZ and a refresh start signal REFPZ in accordance with a refresh request (a self-refresh signal SRTZ in FIG. 7 to be seen later) for the self-refresh timer to output periodically. The output of the refresh start signal REFPZ is masked during the output of a core signal COREZ, which shows that the memory core 28 is in operation, and during the output of the hold end signal HTPZ.

The active control circuit 24 outputs a read start signal RACTPZ for requesting a read operation when it receives the hold end signal HTPZ which shows the request for the start of a read operation. That is, the hold end signal HTPZ is an access request signal for operating the memory core 28. The active control circuit 24 also outputs a write start signal WACTPZ when it receives the write signal WTZ which shows the request for the start of a write operation. The output of the RACTPZ signal and the WACTPZ signal is masked during the output of the core signal COREZ, which shows that the memory core 28 is in operation, and the refresh request signal RREQZ.

The core operation control circuit 26 outputs the core signal COREZ and a core operation signal RASZ when it receives any of the RACTPZ signal, the WACTPZ signal, and the REFPZ signal. The activation period of the core signal COREZ shows that the memory core 28 is in operation. The core operation control circuit 26 outputs a read signal READZ and a write signal WRITEZ in response to the RACTPZ signal and the WACTPZ signal, respectively.

The memory core 28 has a plurality of volatile memory cells MC arranged in a matrix, a plurality of word lines WL and a plurality of bit lines BL connected to the memory cells MC, and a plurality of sense amplifiers SA connected to the bit lines BL. The memory cells MC are the same as typical DRAM memory cells, each having a capacitor for retaining data in the form of a charge and a transfer transistor arranged between this capacitor and a bit line BL. The gate of the transfer transistor is connected to a word line WL.

The memory core 28 starts operation upon in response to the core operation signal RASZ, and selects a word line WL according to the latched address signal RAX. Through the selection of the word line WL, any of a read operation, a write operation, and a refresh operation is performed. Specifically, the memory core 28 performs a read operation when it receives the RASZ signal and the READZ signal, performs a write operation when it receives the RASZ signal and the WRITEZ signal, and performs a refresh operation when it receives the RASZ signal alone (the READZ signal and the WRITEZ signal are inactivated). After any of the read operation, the write operation, and the refresh operation, the memory core 28 performs a precharge operation for resetting the bit lines BL to a predetermined voltage. The precharge operation is executed automatically without receiving an external command.

The input/output control circuit 30, in a read operation, transfers read data from the memory core 28 to the input/output circuit 32. In a write operation, the input/output control circuit 30 transfers write data supplied through the input/output circuit 32 from exterior to the memory core 28.

The input/output circuit 32 receives write data through the external terminal, and outputs read data to the external terminal. The input/output circuit 32 also outputs a hold measurement signal HTMZ from the test mode circuit 34 to the least significant bit of the data terminal DQ.

The test mode circuit 34 brings the FCRAM into a test mode in accordance with the signals supplied through the external terminals and the input circuit 10, and outputs a test control signal TESZ (such as TES64Z, TES65Z, and TES03Z to be described later) for performing an internal test. Entering the test mode (test TES65) for measuring a hold cycle, the test mode circuit 34 functions as a second test circuit for outputting the hold measurement signal HTMZ, which shows that the timer 20 is measuring the hold time, to the data terminal DQ.

Figure 2:
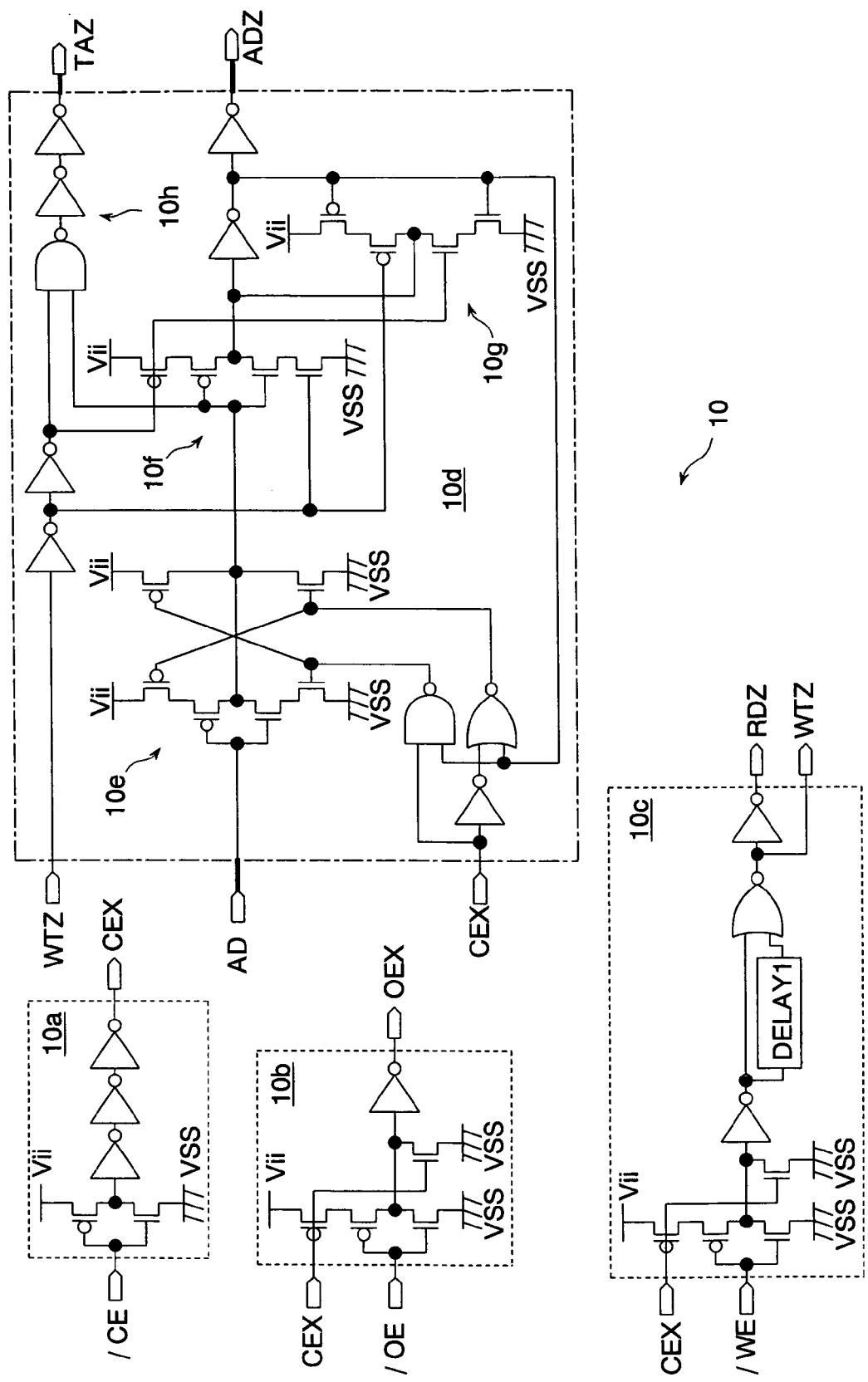
FIG. 2 is a circuit diagram showing the details of the input circuit of FIG. 1.

FIG. 2 shows the details of the input circuit 10 shown in FIG. 1. Blocks shown in dashed lines (such as 10d) are formed in plurality. The input circuit 10 has a CE buffer 10a, an OE buffer 10b, a WE buffer 10c, and an address buffer 10d for receiving the /CE signal, the /OE signal, the /WE signal, and the address signal AD, respectively.

The CE buffer 10a outputs the /CE signal as the CEX signal. Since the CE buffer 10a is not gated by any other signal, the CEX signal varies directly with the change in the /CE signal. The OE buffer 10b makes operation when the CEX signal is at low level, and outputs the /OE signal as the OEX signal.

The WE buffer 10c makes operation when the CEX signal is at low level, and outputs the WTZ signal or the RDZ signal. The WTZ signal (a positive pulse signal having a high level period) is output in synchronization with the /WE signal (a negative pulse signal having a low level period) when the /WE signal is supplied in a write operation. In a read operation, the RDZ signal is maintained at high level according to the /WE signal of high level. The DELAY1 of the WE buffer 10c represents a delay circuit. The delay circuit DELAY1 prevents the WTZ signal from being output due to noise of the /WE signal. Specifically, the WE buffer 10c will not generate the WTZ signal when it receives the /WE signal that has a pulse width smaller than or equal to the delay time of the delay circuit DELAY1. Incidentally, in the subsequent diagram, delay circuits will be denoted as DELAYn (n: integer).

The address buffer 10d has a latch 10e, a clocked inverter 10f, a latch 10g, and a gate circuit 10h. The latch 10e receives the address signal AD when the CEX signal is at low level, and latches the AD signal when the CEX signal is at high level. The clocked inverter 10f turns on when the WTZ signal is at low level, thereby transferring the AD signal to the latch 10g. That is, the clocked inverter 10f turns on during the period when the write enable signal /WE is at high level. The AD signal transferred to the latch 10g is output as the address signal ADZ. The latch 10g latches the address signal AD in synchronization with the rising edge of the WTZ signal. That is, the latch 10g latches the address signal AD only in a write operation. The gate circuit 10h outputs the AD signal as the test address signal TAZ when the WTZ signal is at high level. The test address signal TAZ is output to the test mode circuit 34, and used as an address signal for use in entering the test mode, selecting a test to be performed in the test mode, and exiting from the test mode (entering a normal operation mode).

Figure 3:
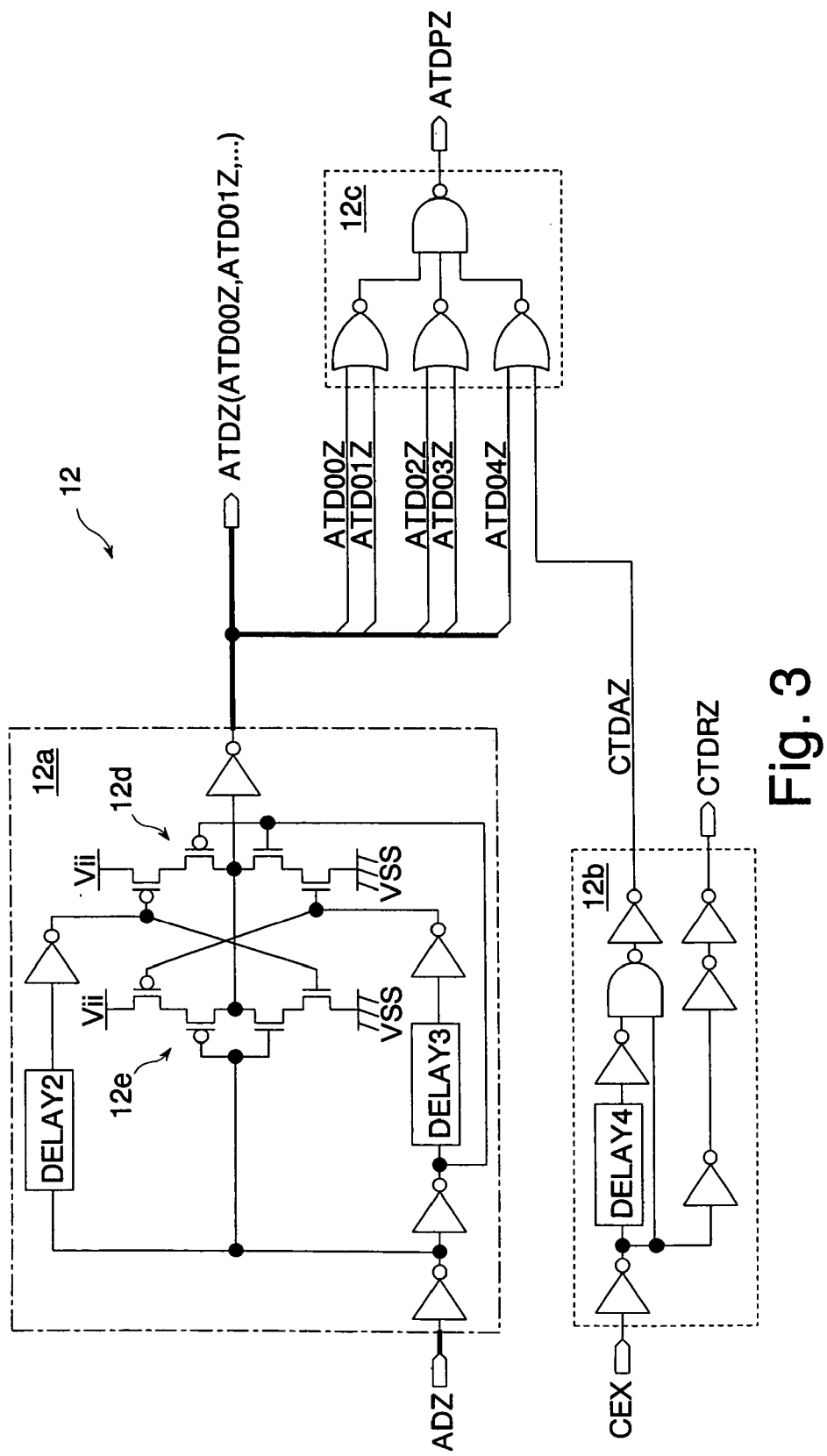
FIG. 3 is a circuit diagram showing the details of the edge detection circuit of FIG. 1.

FIG. 3 shows the details of the edge detecting circuit 12 shown in FIG. 1.

The edge detecting circuit 12 has an edge detection part 12a of the ADZ signal, an edge detection part 12b of the CEX signal, and an OR circuit 12c. The edge detection part 12a has a clocked inverter 12d for detecting the rising edge of the ADZ signal, and a clocked inverter 12e for detecting the falling edge of the ADZ signal. The edge detection part 12a outputs an address transition signal ATDZ (ATD00Z, ATD01Z . . . : positive pulse) when it detects the rising edge and the falling edge of the ADZ signal.

The edge detection part 12b outputs a chip enable transition signal CTDAZ in synchronization with the falling edge of the CEX signal. The edge detection part 12b also outputs an internal chip enable signal CTDRZ which has the same logic as that of the CEX signal. The CTDRZ signal is used as a reset signal of the timer 20.

The OR circuit 12c outputs any of the plurality of bits of address transition signal ATDZ and the chip enable transition signal CTDAZ as the address transition signal ATDPZ. In the diagram, the OR circuit 12c receives five bits of address transition signal ATDZ, whereas it actually receives the same number of bits of address transition signal ATDZ as that of the external address terminal.

Figure 4:
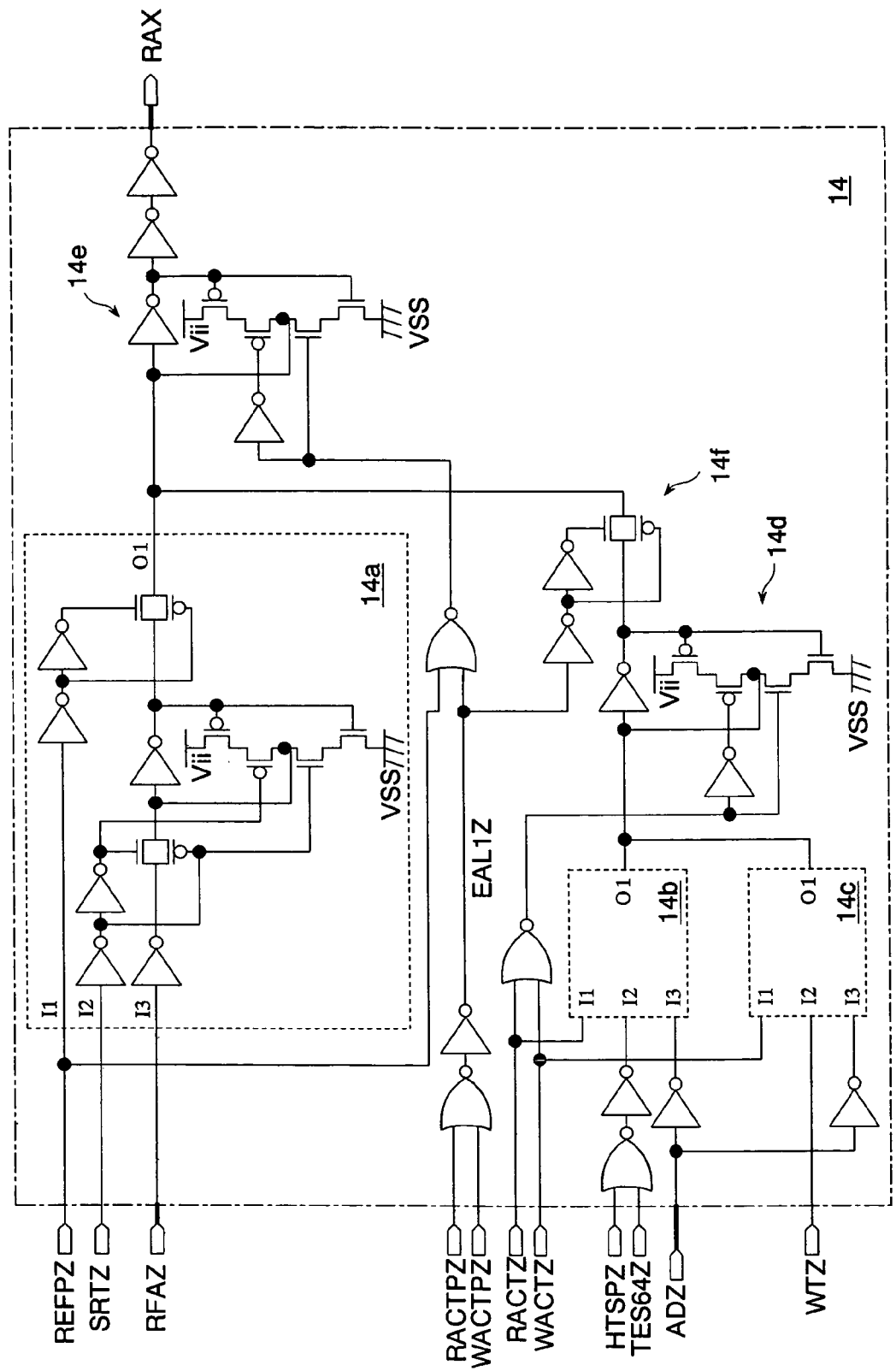
FIG. 4 is a circuit diagram showing the details of the address latch circuit of FIG. 1.

FIG. 4 shows the details of the address latch circuit 14 shown in FIG. 1.

The address latch circuit 14 has latch parts 14a, 14b, 14c, 14d, and 14e, and a switch 14f. The latch part 14a receives the RFAZ signal during the high-level period of the self-refresh signal SRTZ which is output periodically from the self-refresh timer of the refresh control circuit 22, and latches the RFAZ signal in synchronization with the falling edge of the SRTZ signal. The latched RFAZ signal is output in synchronization with the refresh start signal REFPZ for starting a refresh operation. The circuits for generating the SRTZ signal and the REFPZ signal will be described in FIG. 7 to be seen later.

The latch part 14b is the same circuit as the latch part 14a. The latch part 14b receives a read address (ADZ signal) during the high-level period of the timer set signal HTSPZ or the test control signal TEST64Z, and latches the read address in synchronization with the falling edge of the HTSPZ signal or the TEST64Z signal. That is, the latch part 14b will not make any latch operation when the HTSPZ signal or the TEST64Z is at high level. The latched read address is output in synchronization with a RACTZ signal which is a signal for requesting a read operation.

The latch part 14c is the same circuit as the latch part 14a. The latch part 14c receives a write address (ADZ signal) during the high-level period of the write signal WTZ, and latches the write address (ADZ signal) in synchronization with the falling edge of the WTZ signal (the rising edge of the /WE signal). The latched write address is output in synchronization with a WACTZ signal which is a signal for requesting a write operation.

The latch part 14d latches the output level of the latch part 14b or the latch part 14c in synchronization with the falling edge of the RACTZ signal or the WACTZ signal. The switch 14f turns on when the read start signal RACTPZ for starting a read operation or the write start signal WACTPZ for starting a write operation is at high level, thereby connecting the output of the latch part 14d to the latch part 14e. The latch part 14e latches either the output of the latch part 14a or the output of the latch part 14d in synchronization with the falling edge of any of the REFPZ signal, the RACTZ signal, and the WACTPZ signal. The address signal latched in the latch part 14e is used as a row address signal for selecting the word lines WL of the memory core 28.

Figure 5:
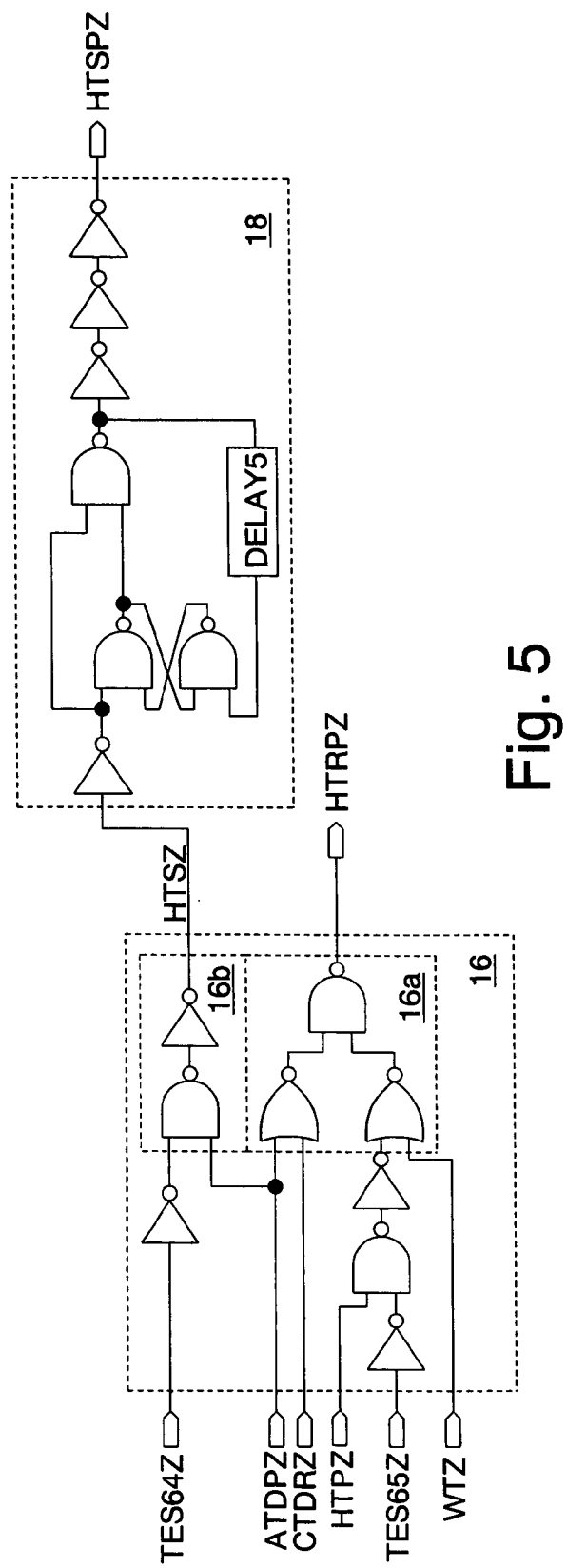
FIG. 5 is a circuit diagram showing the details of the reset circuit and the set circuit of FIG. 1.

FIG. 5 shows the details of the reset circuit 16 and the set circuit 18 shown in FIG. 1.

The reset circuit 16 has an OR circuit 16a and an AND circuit 16b. The OR circuit 16a outputs the timer reset signal HTRPZ when any of the address transition signal ATDPZ, the internal chip enable signal CTDRZ, the hold end signal HTPZ, and the write signal WTZ is at high level. Note that the hold end signal HTPZ is masked by the test control signal TES65Z which changes to high level when a test TES65 is conducted. Thus, in the test mode for conducting the test TES65, the timer reset signal HTRPZ will not be output. That is, the reset circuit 16 also function as a reset disable circuit (second test circuit) for disabling the timer 20 from being reset after a lapse of the hold time. Here, as will be described later, the timer 20 outputs the hold end signal HTPZ each time the hold time elapses.

The AND circuit 16b outputs the address transition signal ATDPZ as the timer set signal HTSZ when a test control signal TES64Z is at low level. The AND circuit 16b functions as a first test circuit for masking the address transition signal ATDPZ with the test control signal TES64Z which changes to high level when a test TES64 is conducted, and outputting the timer set signal HTSZ of low level to disable the operation of the timer 20.

The set circuit 18 outputs the timer set signal HTSPZ in synchronization with the falling edge of the timer reset signal HTSZ (positive pulse). That is, the timer reset signal HTRPZ is always output after the output of the timer reset signal HTRPZ. This prevents the set terminal and the reset terminal of a flip-flop 20f of the timer 20 shown in FIG. 6 from being supplied with the signals simultaneously. As a result, the timer 20 is prevented from malfunctioning.

Figure 6:
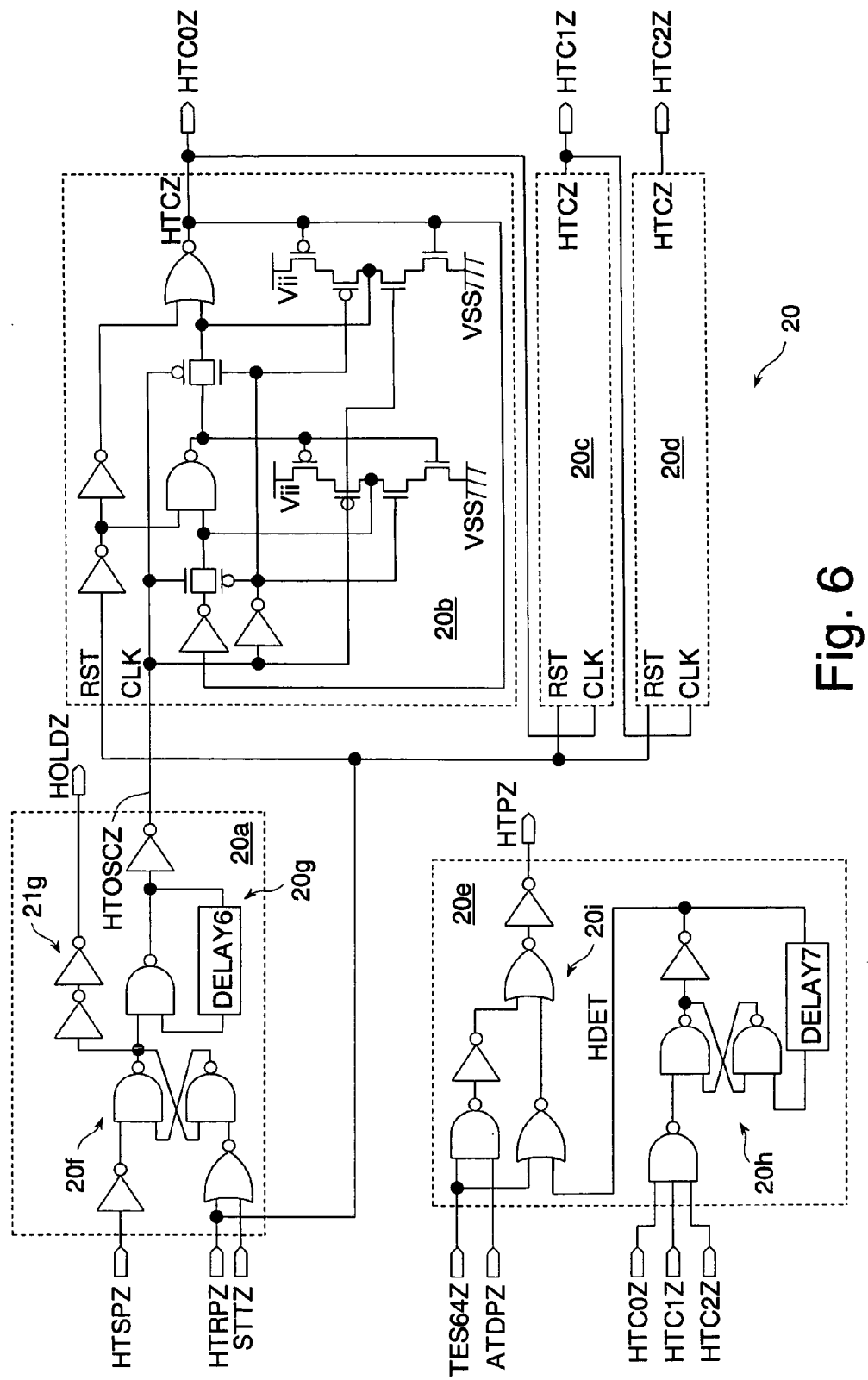
FIG. 6 is a circuit diagram showing the details of the timer of FIG. 1.

FIG. 6 shows the details of the timer 20 shown in FIG. 1.

The timer 20 has a clock generation circuit 20a, three 1-bit counters 20b, 20c, and 20d, and a hold output circuit 20e. The clock generation circuit 20a has the flip-flop 20f and an oscillator 20g whose operation is controlled by the output of the flip-flop 20f. The flip-flop 20f is set in synchronization with the rising edge of the timer set signal HTSPZ, and reset in synchronization with the rising edge of the timer reset signal HTRPZ or a starter signal STTZ. The oscillator 20g starts operation when the flip-flop 20f is set, thereby generating an internal clock signal HTOSCZ having a period twice the delay time of a delay circuit DELAY6. Moreover, the oscillator 20g stops operation when the flip-flop 20f is reset. The starter signal STTZ is a signal which changes to high level for a predetermined period when the FCRAM is powered on. A logic circuit 21g outputs a hold signal HOLDZ which shows that the oscillator 20g is in operation (the hold time is under measurement).

The 1-bit counter 20b is a typical circuit, and detailed description thereof will thus be omitted. The three 1-bit counters 20b, 20c, and 20d are connected in series to constitute a 3-bit counter, outputting carry signals HTC0Z, HTC1Z, and HTC2Z, respectively. The 1-bit counters 20b, 20c, and 20d are reset upon receiving the timer reset signal HTRPZ.

The hold output circuit 20e has a detection circuit 20h and a selector 20i. The detection circuit 20h outputs a hold detected signal HDET of low level to the selector 20i when it detects that all the carry signals HTC0Z, HTC1Z, and HTC2Z are changed to high level. The flip-flop of the detection circuit 20h is self-reset by the hold detected signal HDET, so that the hold detected signal HDET changes to low level after the delay time of a delay circuit DELAY7 has elapsed. The selector 20i outputs the hold end signal HTPZ in synchronization with the hold detected signal HDET when the test control signal TES64Z is at low level (in the normal operation mode). That is, the 1-bit counters 20b, 20c, and 20d, and the hold output circuit 20e function as a counter for measuring the hold time by counting the number of pulses of the internal clock signal HTOSCZ, and outputting the hold end signal HTPZ after a lapse of the hold time. Moreover, the selector 20i functions as a first test circuit for outputting the hold end signal HTPZ (access request signal) forcefully in synchronization with the address transition signal ATDPZ when it receives the test control signal TES64Z which changes to high level while the test TES64 is conducted (the test mode in which the hold time is not measured).

Incidentally, the delay circuit DELAY6 of the clock generation circuit 20a may be made of a variable delay circuit having fuses so that the delay time of the variable delay circuit is changed according to the fuse programming.

Figure 7:
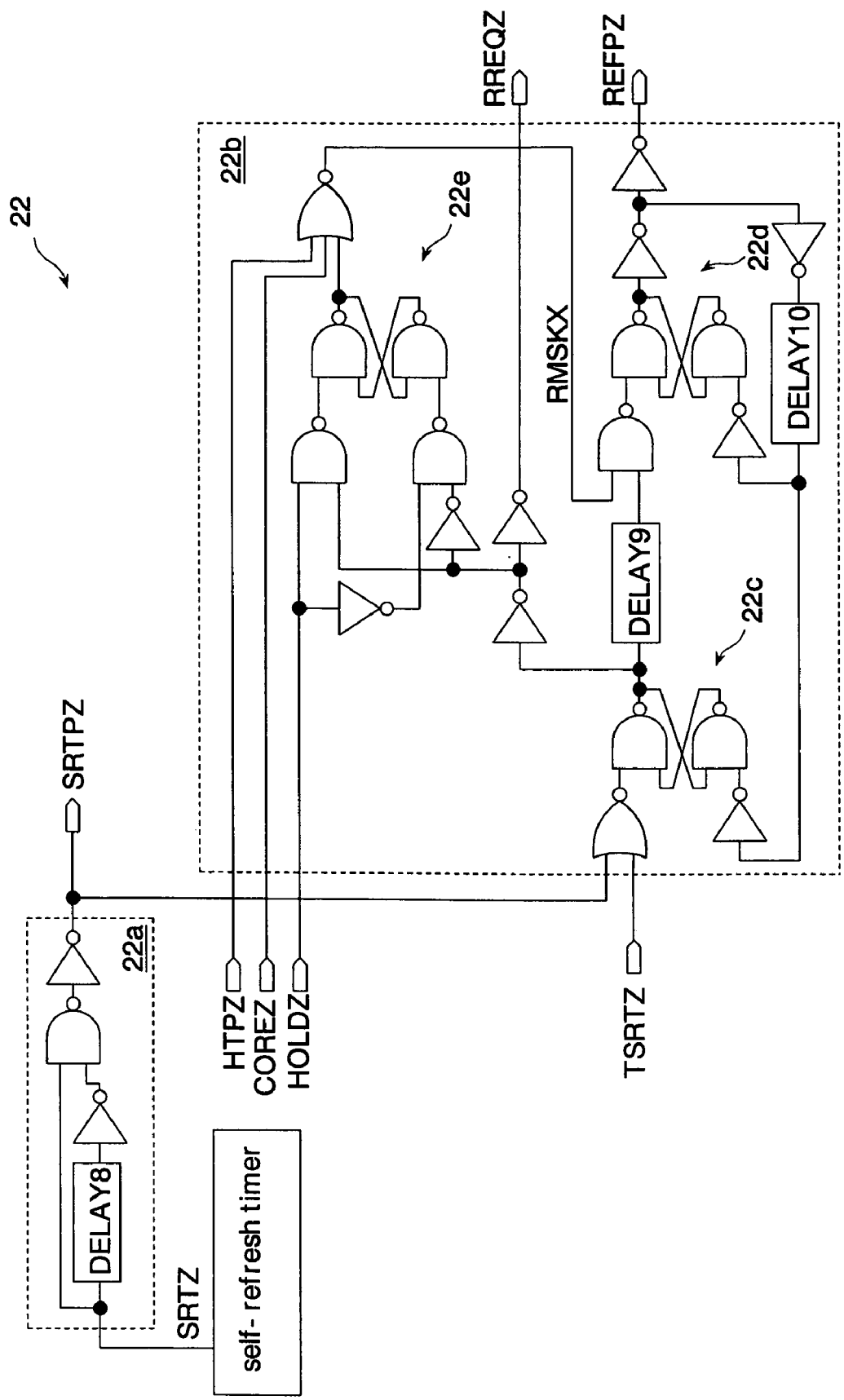
FIG. 7 is a circuit diagram showing the details of the refresh control circuit of FIG. 1.

FIG. 7 shows the details of the refresh control circuit 22 shown in FIG. 1.

The refresh control circuit 22 has a pulse generation circuit 22a and a refresh start circuit 22b. The pulse generation circuit 22a outputs a self-refresh signal SRTPZ in synchronization with the rising edge of the self-refresh signal SRTZ (refresh request signal) which is output periodically from the self-refresh timer.

The refresh start circuit 22b has a first hold circuit 22c (refresh hold circuit), a second hold circuit 22d, and a mask circuit 22e. The flip-flop of the first hold circuit 22c is set in synchronization with the rising edge of the self-refresh signal SRTPZ or the self-refresh signal TSRTZ, and is reset a predetermined time after the rising edge of the refresh start signal REFPZ. Setting the flip-flop changes the refresh request signal RREQZ to high level. The self-refresh signal TSRTZ is a refresh request signal that is output in synchronization with the hold end signal HTPZ during a test TES03 to be described later. That is, the refresh start circuit 22b also functions as a third test circuit for starting a refresh operation corresponding to the refresh request (TSRTZ signal) that is output forcefully in response to a read request.

The output of the first hold circuit 22c is connected to the set terminal of the second hold circuit 22d through a delay circuit DELAY9 and a NAND gate. The NAND gate transmits the output level of the first hold circuit 22c to the second hold circuit 22d when a mask signal RMSKX is at high level, and masks the transmission of the output level of the first hold circuit 22c to the second hold circuit 22d when the mask signal RMSKX is at low level.

The flip-flop of the second hold circuit 22d is set the delay time of the delay circuit DELAY9 after the setting of the flip-flop of the first hold circuit 22c. Setting the flip-flop changes the refresh start signal REFPZ for starting a refresh operation to high level. The flop-flop of the second hold circuit 22d is reset the delay time of a delay circuit DELAY10 after the rising edge of the refresh start signal REFPZ. Resetting the flip-flop changes the refresh request signal REFPZ to low level. That is, the second hold circuit 22d also functions as a pulse generation circuit.

Since the set timing of the second hold circuit 22d (from the occurrence of a refresh request to the start of the refresh operation) is delayed by the delay circuit DELAY9, a write operation is performed with priority over the refresh operation when the write request and the refresh request occur simultaneously. That is, the write operation is performed with priority over the refresh operation by means of the delay circuit DELAY9. More specifically, the delay time of the delay circuit DELAY9 is set longer than or equal to the time from the write request signal WACTZ to the generation of the core signal COREZ, whereby a malfunction due to the conflict between the write operation and the refresh operation is avoided.

The mask circuit 22e changes the mask signal RMSKX to low level during the period when the hold end signal HTPZ and the core signal COREZ are at high level. In addition, the mask circuit 22e sets its flip-flop in synchronization with the rising edge of the hold signal HOLDZ when the refresh request signal RREQZ is at low level, and resets the flip-flop in synchronization with the falling edge of the hold signal HOLDZ when the refresh request signal RREQZ is at high level. The setting and resetting of the flip-flop change the mask signal RMSKX to low level and high level, respectively. Moreover, after the first hold circuit 22c holds a refresh request (=the refresh request signal RREQZ changes to high level), the activation of the mask signal RMSKX is disabled by the hold signal HOLDZ. That is, the NAND gate connected to the output of the three-input NOR gate functions as a refresh mask circuit for disabling the output of the refresh start signal REFPZ while the memory core 28 is in operation and the hold time is under measurement, and enabling the output of the refresh start signal REFPZ when a refresh request is held by the first hold circuit 22c while the memory core 28 is not in operation and while the hold time is not under measurement.

Figure 8:
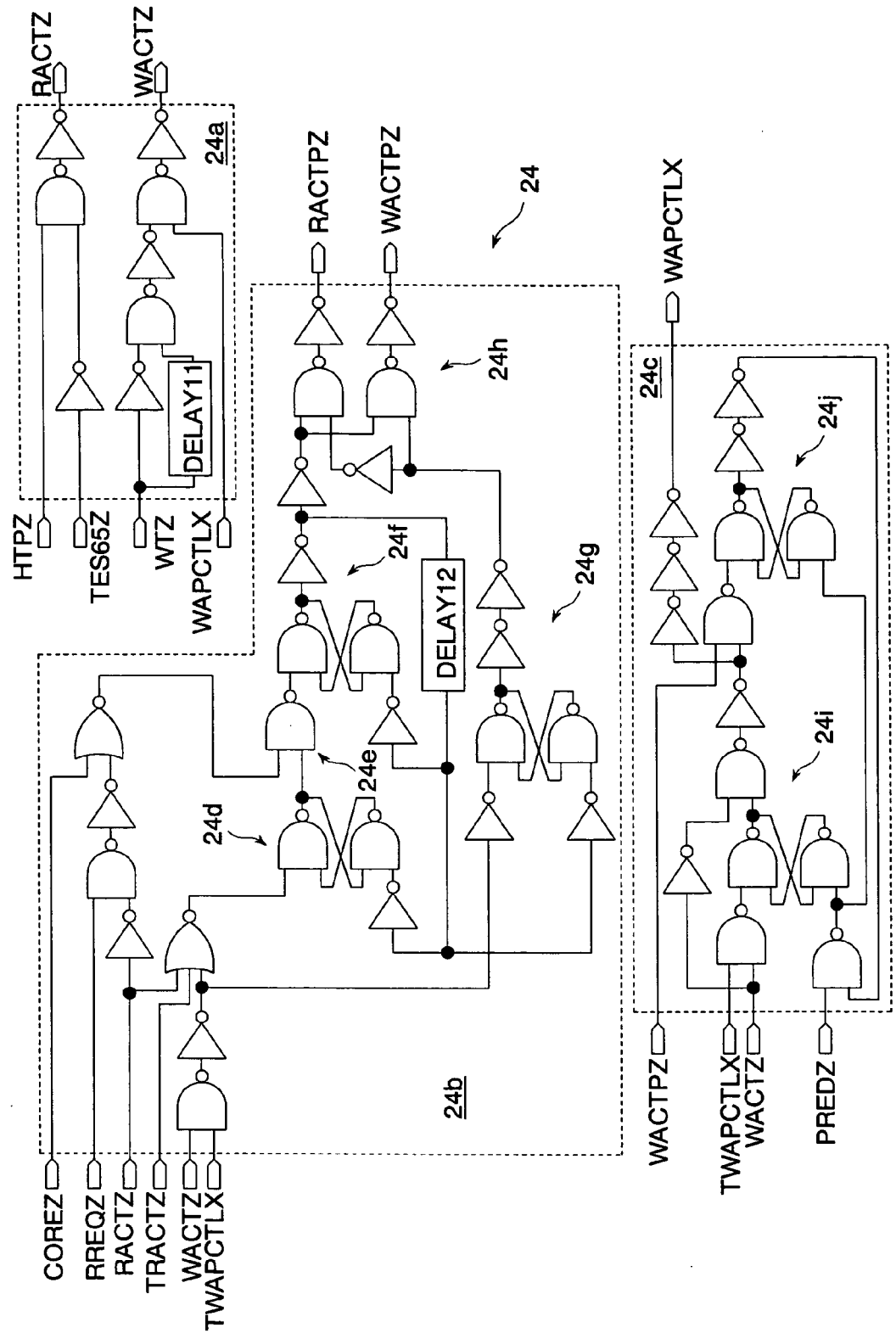
FIG. 8 is a circuit diagram showing the details of the active control circuit of FIG. 1.

FIG. 8 shows the details of the active control circuit 24 shown in FIG. 1. The active control circuit 24 has an active generation circuit 24a, an active output control circuit 24b, and a write control circuit 24c.

The active generation circuit 24a outputs the hold end signal HTPZ as the read request signal RACTZ (access request signal) in the normal operation, and fixes the read request signal RACTZ to low level in the test mode (when the TES65Z signal is at high level). The active generation circuit 24a also outputs the write request signal WACTZ (access request signal) in synchronization with the falling edge of the write signal WTZ (the rising edge of the write enable signal /WE) when a write disable signal WAPCTLX is at low level. That is, the active generation circuit 24a functions as a write control circuit for outputting the write request signal WACTZ in synchronization with the end of the active period of the /WE signal. The write request signal WACTZ is fixed to low level when the write disable signal WAPCTLX is at low level.

The active output control circuit 24b has a flip-flop 24d (access hold circuit), a NAND gate 24e, a flip-flop 24f, a flip-flop 24g, and a gate circuit 24h. The flip-flop 24d holds any of the read request signal RACTZ, the write request signal WACTZ, and a test read request signal TRACTZ which is output in response to the refresh start signal REFPZ in the test mode (when TES03Z is at high level). That is, the active output control circuit 24b also functions as a third test circuit for starting the read operation corresponding to the test read request signal TRACTZ which is output in response to a refresh operation in the test mode. While entering the test mode, the input of the write request signal WACTZ to the flip-flops 24d and 24g is masked by the low level of a write disable signal TWAPCTLX. That is, the active output control circuit 24b also functions as a write mask circuit for disabling a write operation from being performed in response to the /WE signal that is supplied for the sake of entering the test mode.

The NAND gate 24e masks the transmission of the output level of the flip-flop 24d to the flip-flop 24f while the core signal COREZ is output (the memory core 28 is in operation) and while the read request signal RACTZ is at low level and the refresh request signal RREQZ is output. That is, the NAND gate 24e functions as an access mask circuit for disabling the output of the read start signal RACTPZ and the write start signal WACTPZ (access start signals) when the memory core 28 is in operation, and enabling the output of the read start signal RACTPZ and the write start signal WACTPZ while the memory core 28 is not in operation.

The flip-flop 24f latches the output of the -NAND gate 24e. The flip-flop 24g outputs low level when the write request signal WACTZ is at low level (read operation), and outputs high level when the write request signal WACTZ is at high level (write operation). The gate circuit 24h outputs the read start signal RACTPZ or the write start signal WACTPZ in accordance with the output of the flip-flop 24g. The flip-flops 24d, 24f, and 24g are reset with as much delay as the delay time of a delay circuit DELAY12 after the flip-flop 24f is set.

The write control circuit 24c has flip-flops 24i and 24j. The flip-flop 24i is set upon receiving the write request signal WACTZ, and is reset when it receives a precharge signal PREDZ while the flip-flop 24j is set. The write disable signal WAPCTLX changes to low level in response to the flip-flop 24i. The precharge signal PREDZ is output after the memory core 28 completes a precharge operation.

The flip-flop 24j is set when the write request signals WACTZ and WACTPZ both are at high level, and is reset upon receiving the precharge signal PREDZ. In this way, the write control circuit 24c disables the write request signal WACTZ from being output as the write start signal WACTPZ when the next write enable signal /WE is supplied before the completion of the write operation. That is, malfunction ascribable to the noise of the /WE signal is avoided.

Figure 9:
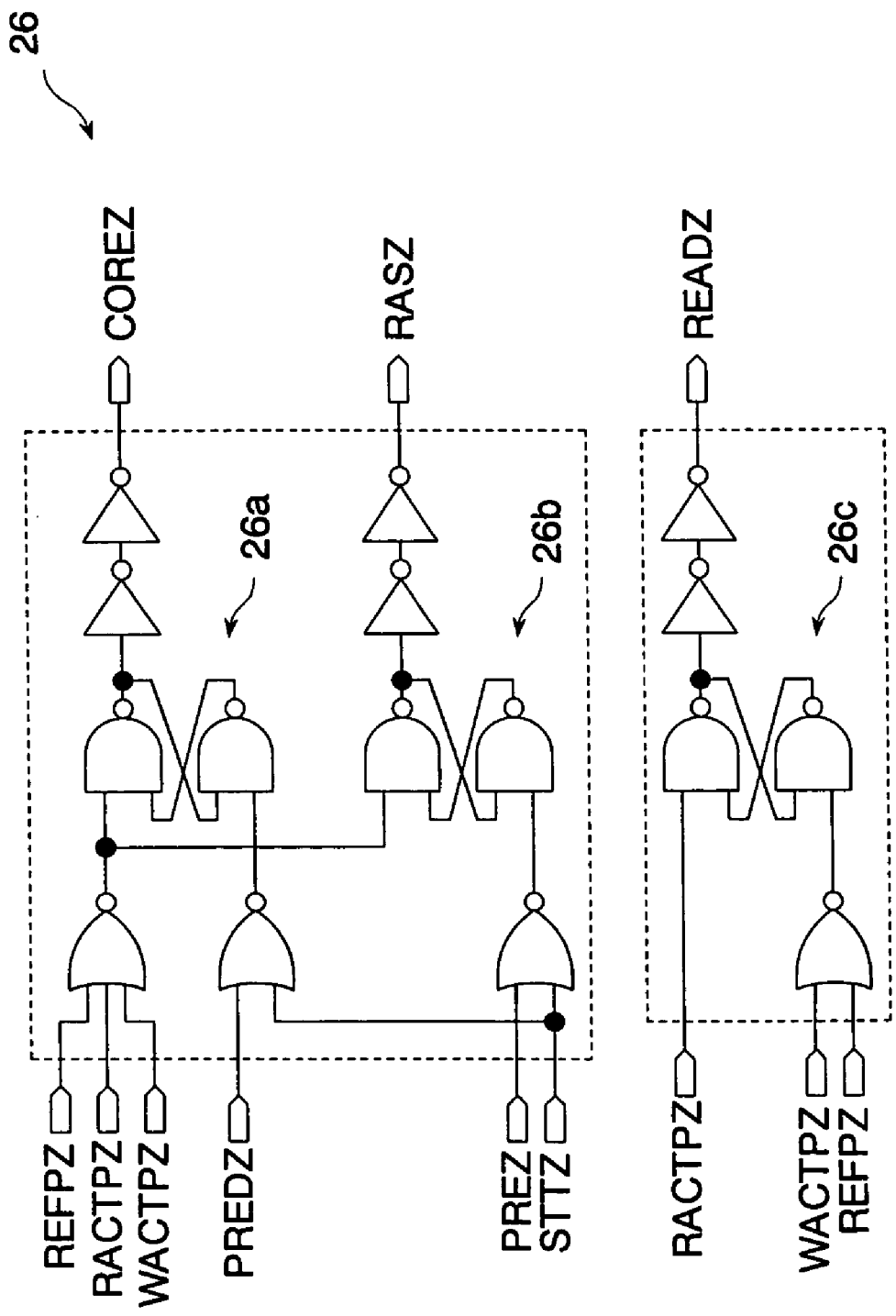
FIG. 9 is a circuit diagram showing the details of the core operation control circuit of FIG. 1.

FIG. 9 shows the details of the core operation control circuit 26 shown in FIG. 1.

The core operation control circuit 26 has flip-flops 26a, 26b, and 26c. The flip-flop 26a is set upon receiving the refresh start signal REFPZ, the read start signal RACTPZ, or the write start signal WACTPZ, and outputs the core signal COREZ which shows that the memory core 28 shown in FIG. 1 is in operation. The flip-flop 26a is reset upon receiving the starter signal STTZ or the precharge signal PREDZ.

The flip-flop 26b is set upon receiving the refresh start signal REFPZ, the read start signal RACTPZ, or the write start signal WACTPZ, and outputs the core operation signal RASZ for making the memory core 28 perform any of a read operation, a write operation, and a refresh operation. The flip-flop 26b is reset upon receiving the starter signal STTZ or a precharge signal PREZ which shows that a precharge operation is under execution.

The flip-flop 26c is set upon receiving the read start signal RACTPZ, and outputs the read signal READZ for controlling a read operation inside the memory core 28. The flip-flop 26c is reset upon receiving the refresh start signal REFPZ or the write start signal WACTPZ.

Figure 10:
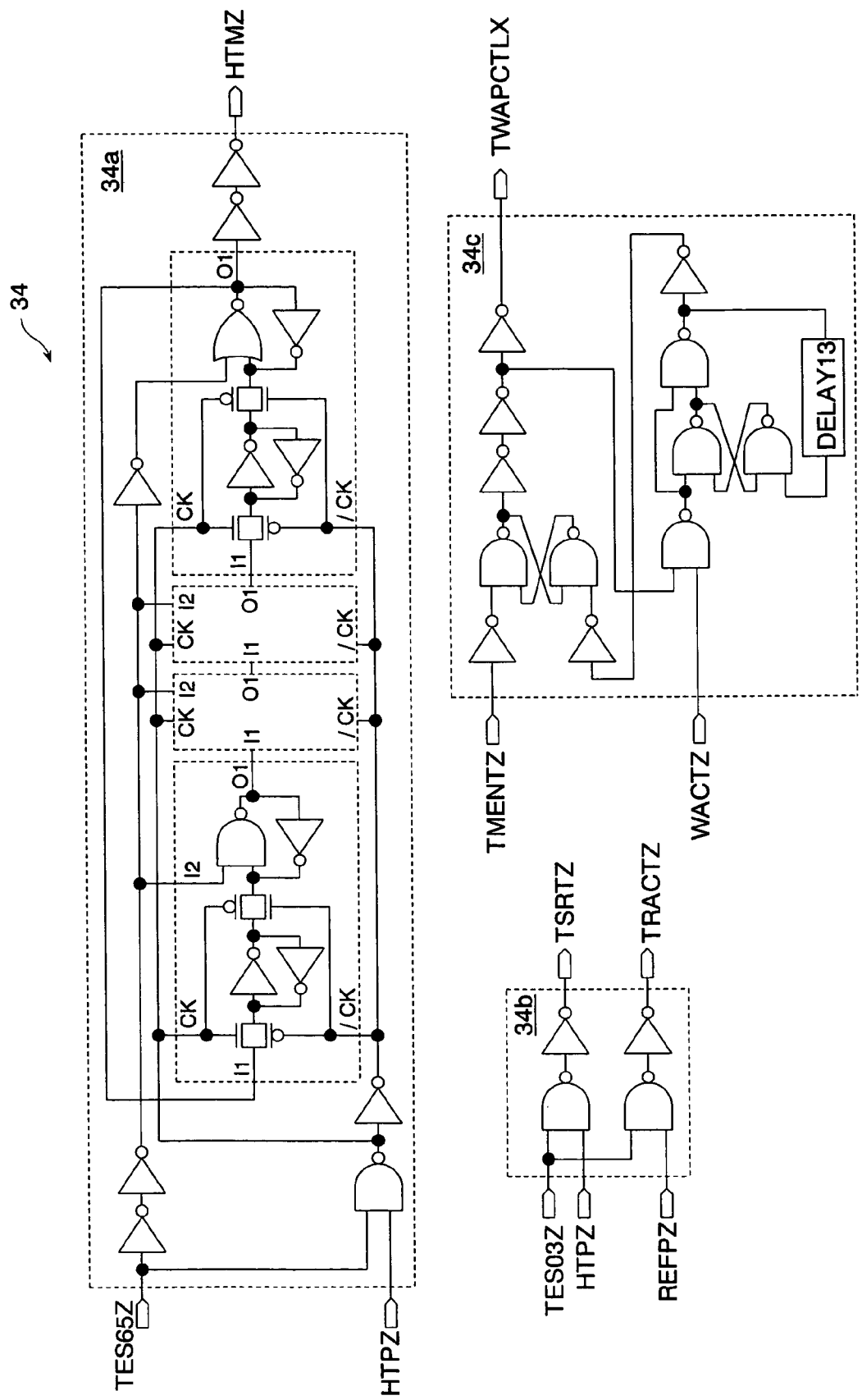
FIG. 10 is a circuit diagram showing the details of the test mode circuit of FIG. 1.
Figure 11:
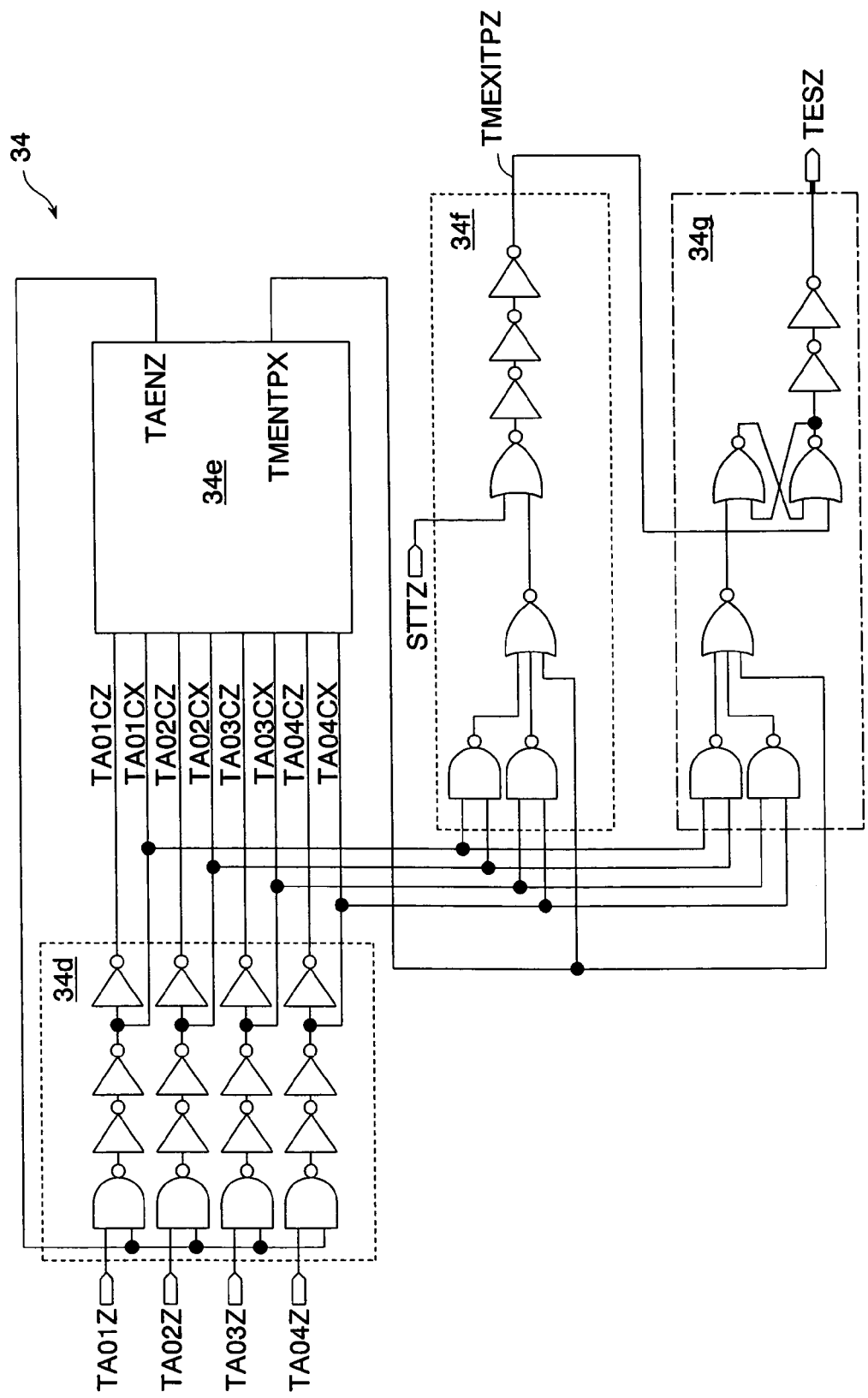
FIG. 11 is a circuit diagram showing the details of the test mode circuit of FIG. 1.
Figure 12:
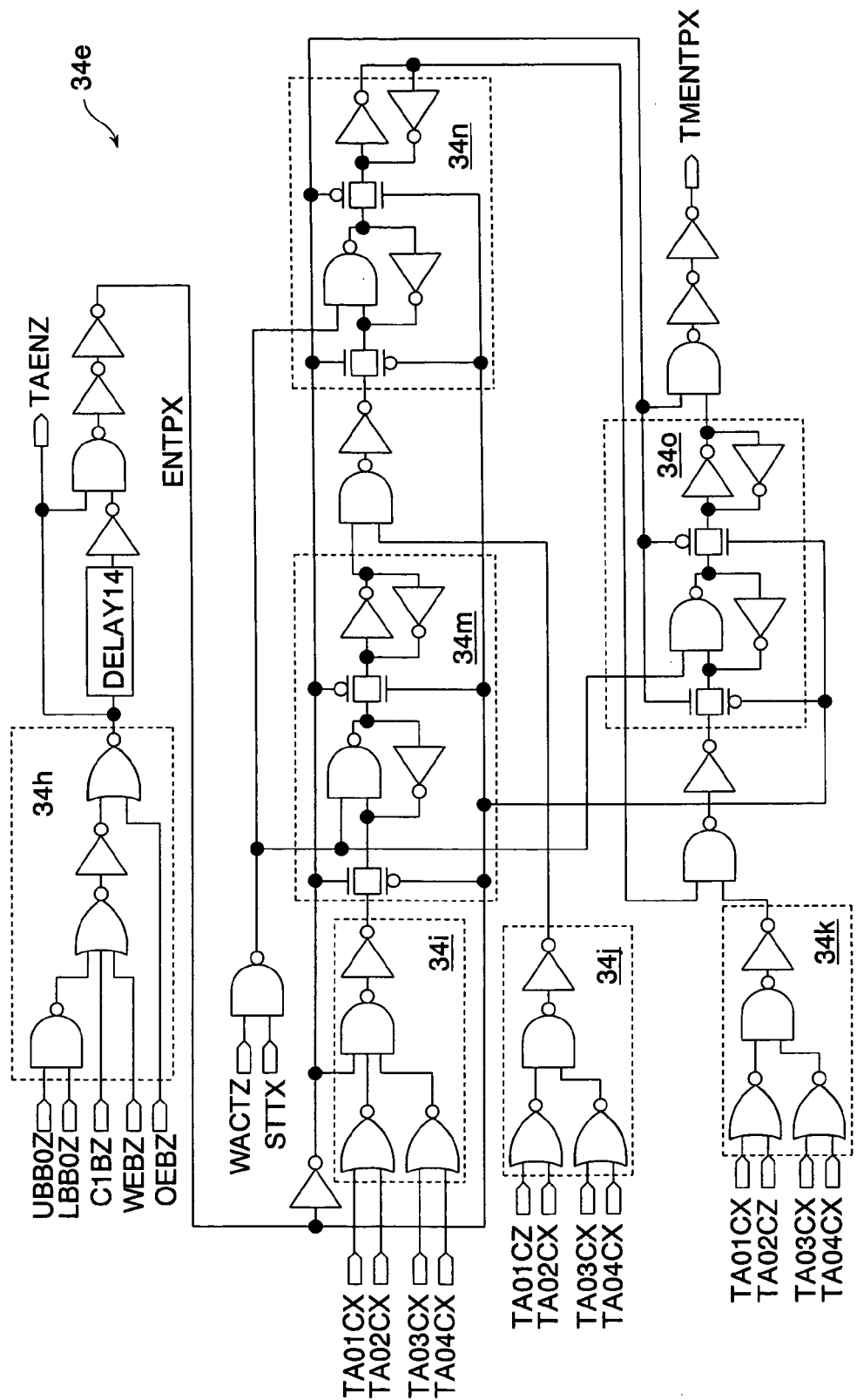
FIG. 12 is a circuit diagram showing the details of the test mode circuit of FIG. 1.

FIGS. 10 to 12 show the details of the test mode circuit 34 shown in FIG. 1. The FCRAM of the present embodiment has a plurality of test modes including the three test modes (TES65, TES64, and TES03) pertaining to the operation of the memory core 28. In a test TES65, the timer 20 shown in FIG. 1 is not reset but forcefully kept operating to measure the hold time. In a test TES64, the operation of the timer 20 is disabled forcefully, and the hold end signal HTPZ is generated in synchronization with the address transition signal ATDPZ. That is, a read operation is started in synchronization with the address transition signal ATDPZ, whereby the memory core 28 is measured for the actual value of the read operation time. In a test TES03, the worst access time which determines the cycle time of the FCRAM is measured.

In FIG. 10, a hold measurement circuit 34a which makes operation during the test TES65 has a 4-bit shift register. The hold measurement circuit 34a changes a hold measurement signal HTMZ to high level upon receiving the hold end signal HTPZ for the first time, and changes the hold measurement signal HTMZ to low level upon receiving the hold end signal HTPZ for the fourth time. Consequently, the high-level period of the hold measurement signal HTMZ is three times the timer cycle. That is, the hold measurement circuit 34a functions as a timer output circuit (second test circuit) for outputting the hold measurement signal HTMZ in response to the first hold end signal HTPZ, and stopping the output of the hold measurement signal HTMZ when it subsequently receives the hold end signal HTPZ three times.

In the test TES65, the level of the hold measurement signal HTMZ is output to the least significant bit (DQ0) of the data terminal DQ. It is therefore possible to bring the FCRAM into the test mode by using an LSI tester, and measures the high-level period of the data terminal DQ to evaluate the operation time of the timer 20. When the delay circuit DELAY6 shown in FIG. 6 is made of a variable delay circuit having fuses, the hold time from when the address transition signal ATDPZ varies to when the memory core 28 starts a read operation can be set to an optimum value by adjusting the delay time of the delay circuit DELAY6 in the testing process, for example, in accordance with the actual value of the access time for each manufacturing lot.

A refresh control circuit 34b (third test circuit) which makes operation during the test TES03 outputs the hold end signal HTPZ and the refresh start signal REFPZ as the self-refresh signal TSRTZ and the test read request signal TRACTZ, respectively. That is, in the test TES03 for evaluating the worst access time, a refresh request is issued to the refresh control circuit 22 forcefully in synchronization with the hold end signal HTPZ which is output from the timer 20, so that a read operation is requested forcefully in synchronization with the refresh start signal REFPZ which is output from the refresh control circuit 22.

A write mask circuit 34c changes the write disable signal TWAPCTLX to low level in entering the test mode (an entry signal TMENTZ is at high level). The low level of the TWPACTLX signal masks the supply of the write request signal WACTZ to the active output control circuit 24b shown in FIG. 8. This prevents the memory core 28 from starting a write operation in response to the /WE signal that varies in entering the test mode. The write mask circuit 34c returns the write disable signal TWAPCTLX to high level with as much delay as the delay time of a delay circuit DELAY13 since the output of the write request signal WACTZ.

In FIG. 11, a test address generation circuit 34d makes operation when a test enable signal TAENZ is at high level, thereby receiving four bits of address signals TA01Z–TA04Z supplied through the address terminal AD, and generating address signals TA01CZ–TA04CZ having the same logic as that of the address signals TA01Z–TA04Z and address signals TA01CX–TA04CX having the inverted logic of the address signals TA01Z–TA04Z.

A test entry circuit 34e, as shown in FIG. 12 to be seen later, changes the test enable signal TAENZ to high level in accordance with the upper byte signal /UB (UBB0Z), the lower byte signal /LB (LBB0Z), the chip enable signal /CE (C1BZ), an output enable signal (OEBZ), and the write enable signal /WE (WEBZ), and outputs a test entry signal TMENTPX in accordance with the address signals TA01CZ–TA04CZ and TA01Z–TA04Z which are supplied when the test enable signal TAENZ is at high level.

A test exit circuit 34f outputs a test exit signal TMEXITPZ when it receives a predetermined combination of address signals TA01Z-TA04Z in the test mode (during entry), or when it receives the starter signal STTZ.

A test start circuit 34g outputs a test signal TESZ (such as TES03Z, TES64Z, and TES65Z) for performing a predetermined test when it receives a predetermined combination of address signals TA01Z–TA04Z in the test mode (during entry). That is, the test start circuit 34g functions as a test decode circuit for selecting a predetermined test. When the test start circuit 34g receives the test exit signal MEXITPZ, it stops outputting the test signal TESZ.

FIG. 12 shows the details of the test entry circuit 34e shown in FIG. 11.

The test entry circuit 34e has a combination circuit 34h, address decoders 34i, 34j, and 34k which are activated when an entry pulse signal ENTPX is at low level, and latches 34m, 34n, and 34o which are connected in series via gate circuits and operate with the entry pulse signal ENTPX. The combination circuit 34h outputs the test enable signal TAENZ when the upper byte signal /UB and the lower byte signal /LB are at high level and the chip enable signal /CE, the write enable signal /WE, and the output enable signal /OE are at low level. The entry pulse signal ENTPX is output in response to the output of the test enable signal TAENZ.

The address decoder 34i outputs a high level when the address signals AD1–AD4 are "1111". The address decoder 34j outputs a high level when the address signals AD1–AD4 are "0111". The address decoder 34k outputs a high level when the address signals AD1–AD4 are "1011". The address decoders 34i, 34j, and 34k make latch operations when the /OE signal is clocked.

The latch 34m latches the output level of the address decoder 34i. The latch 34n latches the output level of the address decoder 34j when a high level is latched in the latch 34m. The latch 34o latches the output level of the address decoder 34k when a high level is latched in the latch 34n. Then, only when the latch 34o latches a high level, the test entry signal TMENTPX changes to low level during the high-level period of the entry pulse signal ENTPX. The change in the test entry signal TMENTPX to low level brings the FCRAM from the normal operation mode into the test mode. That is, the test entry circuit 34e makes the FCRAM enter the test mode only when the predetermined addresses are supplied to the address decoders 34i, 34j, and 34k in succession. Incidentally, the latches 34m, 34n, and 34o are initialized by the write request signal WACTZ after power-on (the starter signal STTX is at high level).

Hereinafter, description will be given of the operation of the FCRAM according to the present embodiment.

Figure 13:
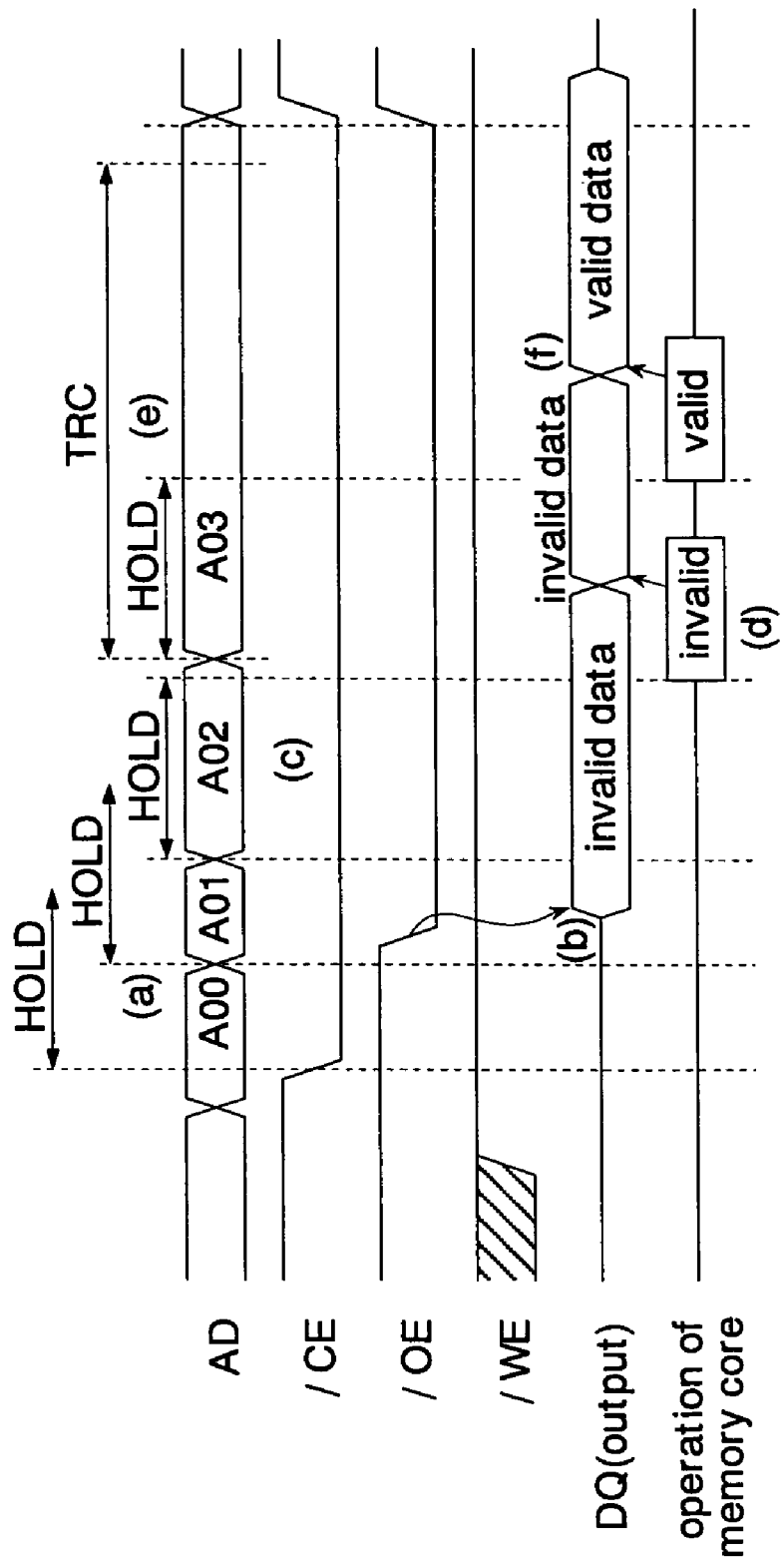
FIG. 13 is a timing chart showing the basic operation of the present invention.

FIG. 13 shows a basic operation (read operation) of the present invention.

The timer 20 measures a hold time HOLD slightly longer than the time of a single operation of the memory core 28 which is shown boxed in the chart. Then, when the hold time HOLD is longer than the valid period of the address signal AD and the active period of the chip enable signal /CE, the memory core 28 operates to perform a read operation. Moreover, when the valid period of the address signal AD and the active period of the chip enable signal /CE are longer than the cycle time TRC, the operation of the memory core 28 becomes invalid, and invalid data is output to the data terminal DQ.

When the valid periods of the addresses A00, A01 are shorter than the hold time HOLD (FIG. 13(a)), the memory core 28 makes no operation. Invalid data is output to the data terminal DQ when the /OE signal changes to low level (FIG. 13(b)). Since the memory core 28 will not start operation when the valid period of the address signal AD is shorter than the hold time HOLD, the data in the memory cells is prevented from crashing even if the address signal AD varies during the read cycle. The interface of the FCRAM according to the present invention can be tailored to the interface of an SRAM, and the SRAM can be easily replaced with the FCRAM without system modification.

When the valid period of the address A02 is longer than the hold time HOLD (FIG. 13(c)), the memory core 28 starts operation (FIG. 13(d)). Since the valid period of the address A02 is shorter than the cycle type TRC, however, the operation of the memory core 28 becomes invalid. The valid period of the address A03 is longer than the hold time HOLD and longer than the cycle time TRC (FIG. 13(e)). On this account, the data read by the operation of the memory core 28 is output to the data terminal DQ as valid data (FIG. 13(f)).

The cycle time TRC is determined based on the worst access time which is evaluated by the test TES03. The value of the worst access time is the memory core operation time added with the memory core operation time and refresh operation time of the previous access cycle. It is almost equal to three times of the memory core operation time.

Figure 14:
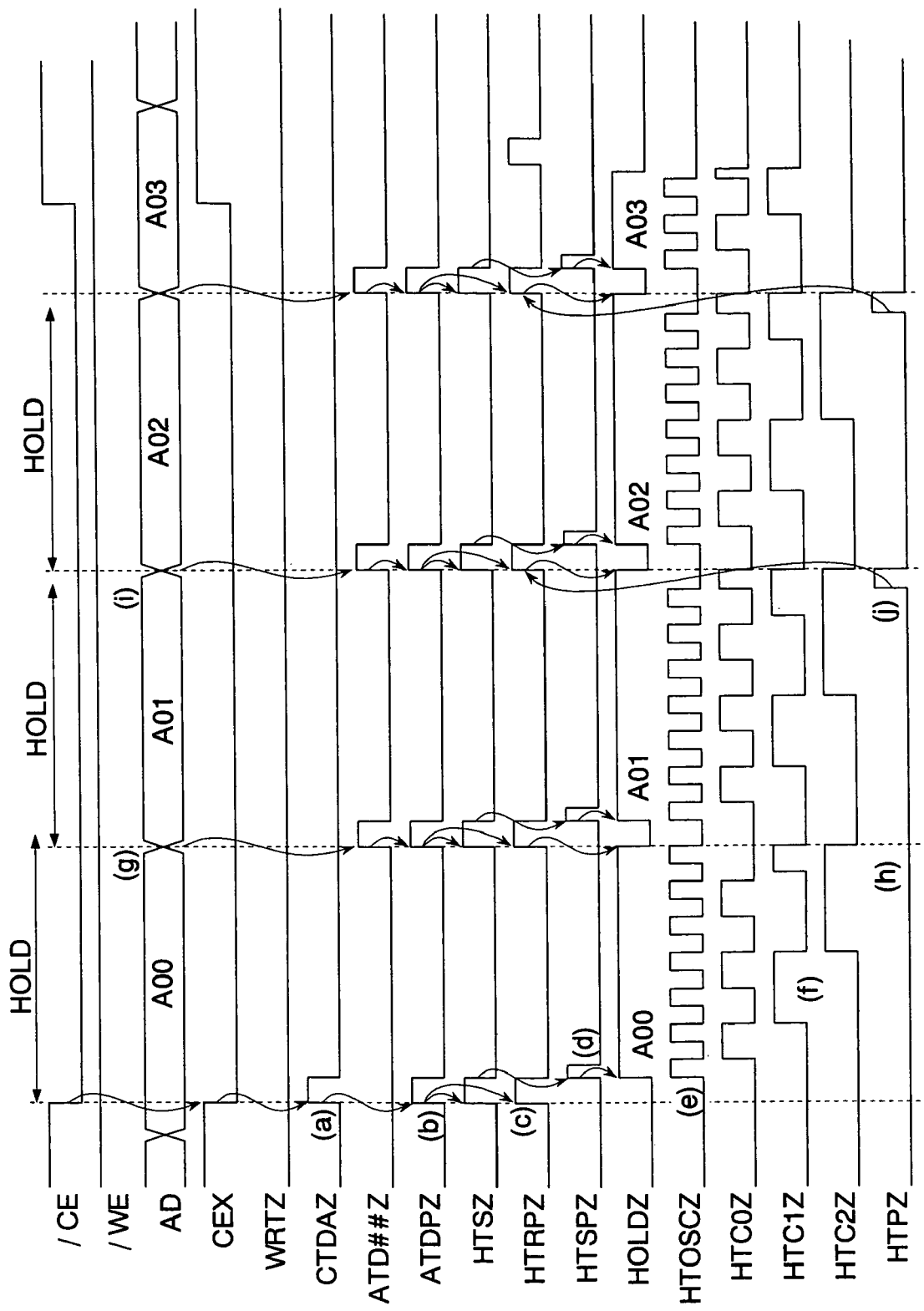
FIG. 14 is a timing chart showing the operation of the timer in the read operation.

FIG. 14 shows the operation of the timer 20 in the read operation.

Initially, the edge detection part 12b of the edge detecting circuit 12 shown in FIG. 3 outputs the chip enable transition signal CTDAZ in synchronization with the falling edge of the /CE signal (FIG. 14(a)). The OR circuit 12c outputs the address transition signal ATDPZ in response to CTDAZ (FIG. 14(b)).

The reset circuit 16 shown in FIG. 5 outputs the timer set signal HTSZ and the timer reset signal HTRPZ in response to the ATDPZ signal (FIG. 14(c)). The set circuit 18 outputs the timer set signal HTSPZ in synchronization with the falling edge of the HTSZ signal (FIG. 14(d)).

The timer 20 shown in FIG. 6 is reset by HTRPZ before it starts the operation of the oscillator 20g in response to the HTSPZ signal (FIG. 14(e)). The operation of the oscillator 20g operates the counters 20b, 20c, and 20d, whereby the carry signals HTC0Z, HTC1Z, and HTC2Z are output (FIG. 14(f)). The address A00 changes before HTC0Z, HTC1Z, and HTC2Z all become high in level (FIG. 14(g)). That is, since the valid period of the address signal AD does not satisfy the hold time HOLD, the hold end signal HTPZ will not be output (FIG. 14(h)). As a result, the read cycle of the address A00 is regarded as invalid, and the memory core 28 makes no operation.

In the subsequent cycles, the valid period of the address signal AD (A01, A02) satisfies the hold time HOLD, so that the hold end signal HTPZ is output (FIG. 14(i)). Then, the memory core 28 performs the read operation.

Figure 15:
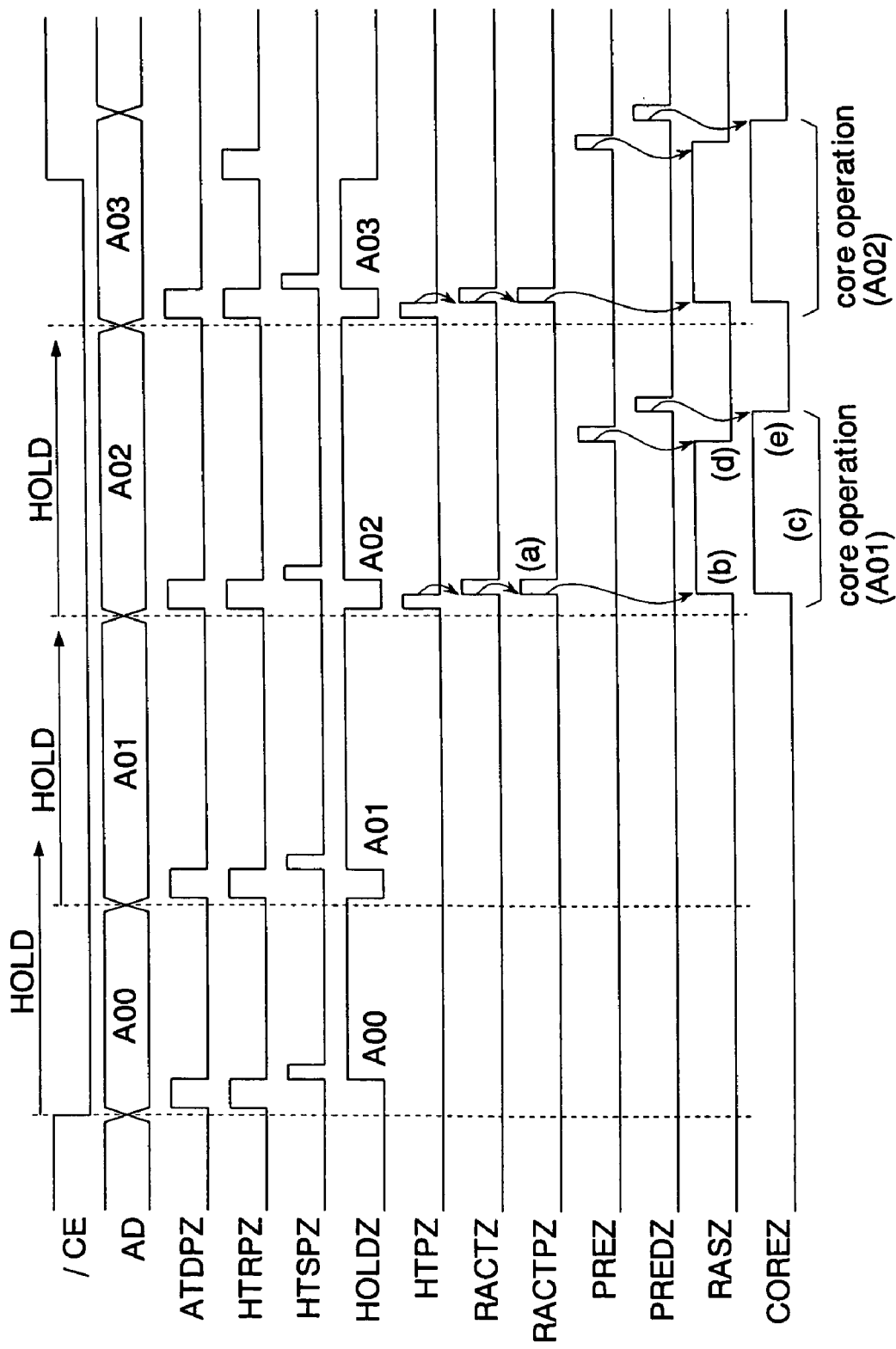
FIG. 15 is a timing chart showing the operation of the memory core in the read operation.

FIG. 15 shows the operation of the memory core 28 in the read operation. In this example, as in FIG. 14, the addresses A00 and A03 do not satisfy the hold time HOLD while the addresses A01 and A02 satisfy the hold time HOLD. Description will be omitted of the same operations as in FIG. 14.

In the read cycle where the address A01 is supplied, the read request signal RACTZ and the read start signal RACTPZ are output in response to the hold end signal HTPZ shown in FIG. 8 (FIG. 15(a)). The core operation control circuit 26 shown in FIG. 9 outputs the core operation signal RASZ and the core signal COREZ in response to the read start signal RACTPZ (FIG. 15(b)). The memory core 28 selects a word line WL according to the address A02 in response to the RASZ signal, and performs a read operation (FIG. 15(c)). The high-level period of the RASZ signal shows the selection period of the word line WL. The data read from the memory cells to the bit lines BL and amplified by the sense amplifiers is transmitted to the input/output control circuit 30 shown in FIG. 1. The data amplified on the bit lines BL is rewritten to the memory cells.

The core operation control circuit 26 changes the RASZ signal to low level in response to the output of the precharge signal PREZ (FIG. 15(d)). The word line WL is inactivated by the inactivation of the RASZ signal. The bit lines BL are precharged to a predetermined voltage in response to the precharge signal PREZ. The core operation control circuit 26 changes the COREZ signal to low level in response to the output of the precharge signal PREDZ (FIG. 15(e)). Then, the memory core 28 completes the read operation.

In the read cycle where the address A02 is supplied, a read operation is also performed in the same way as described above.

Figure 16:
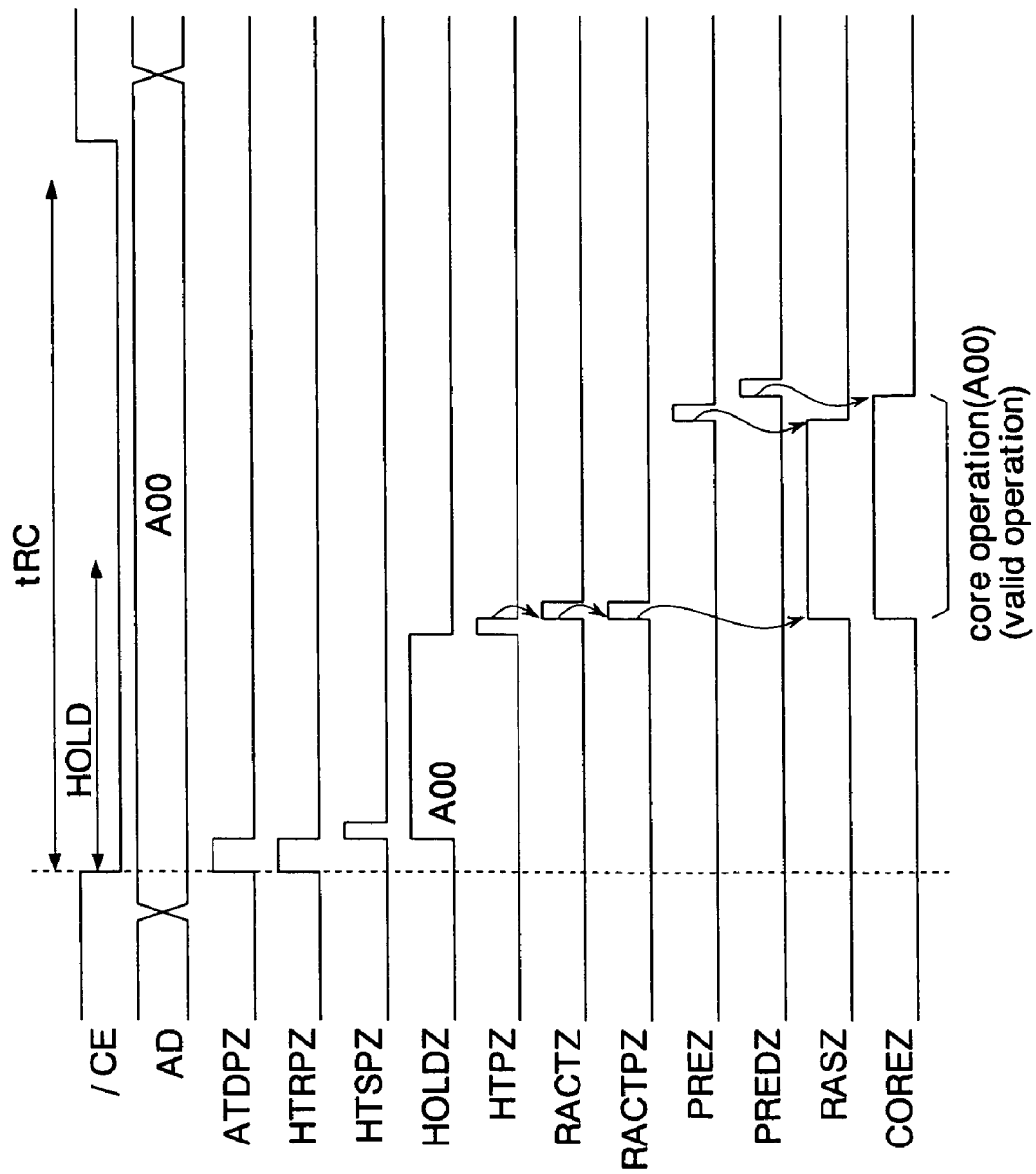
FIG. 16 is a timing chart showing the read operation in the case where the cycle time is satisfied.

FIG. 16 shows a read operation when the cycle time tRC is satisfied. The operation leading up to that of the memory core 28 is the same as in FIG. 15. In this example, the active period of the /CE signal and the valid period of the address signal AD (A00) are longer than the cycle time tRC, and thus the operation of the memory core 28 becomes valid. Consequently, after the read data is transferred to the input/output circuit 32 of FIG. 1, the /OE signal is lowered to output the read data to the data terminal DQ.

Figure 17:
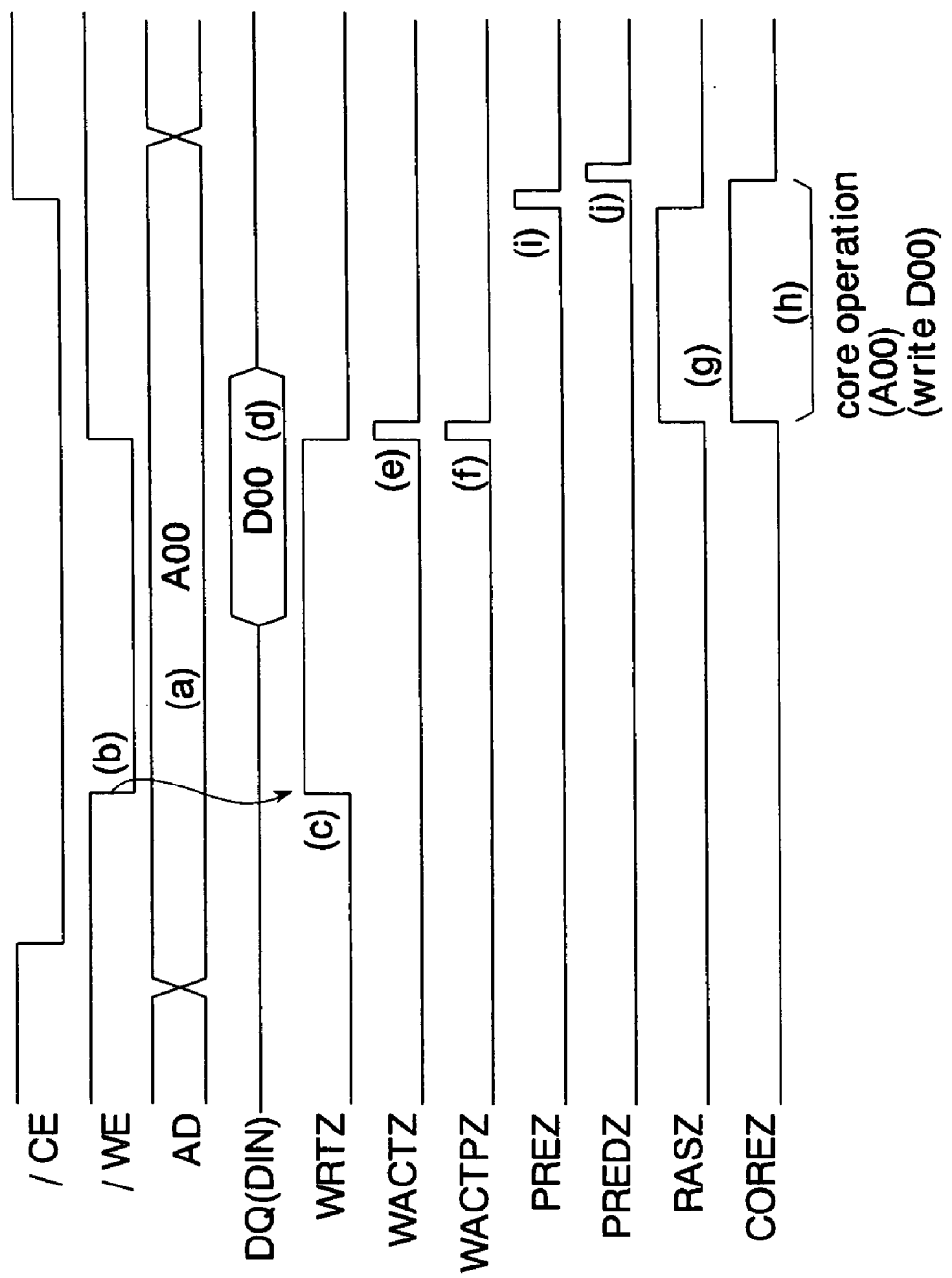
FIG. 17 is a timing chart showing an overview of the write operation.

FIG. 17 shows an overview of the write operation.

The address signal AD (A00) is held unchanged during the active period of the /CE signal (FIG. 17(a)). The /WE signal changes to low level during the active period of the /CE signal (FIG. 17(b)). The WE buffer 10c shown in FIG. 2 outputs the write signal WTZ in response to the /WE signal (FIG. 17(c)). The address buffer 10d shown in FIG. 2 latches the address signal AD in synchronization with the rising edge of the WTZ signal. Subsequently, during the high-level period of the WTZ signal (during the low-level period of the /WE signal), the clocked inverter 10f of the address buffer 10d turns off. Thus, the address transition signal ATDPZ will not occur even if the address signal AD varies in the write operation (in the period where the /WE signal is at low level).

Next, write data D00 is supplied to the data terminal DQ in synchronization with the rising edge of the /WE signal (FIG. 17(d)). The active control circuit 24 shown in FIG. 8 outputs the write request signal WACTZ in response to the falling edge of the WTZ signal (FIG. 17(e)), and outputs the write start signal WACTPZ in synchronization with the WACTZ signal (FIG. 17(f)).

The core operation control circuit 26 shown in FIG. 9 outputs the core operation signal RASZ and the core signal COREZ in response to the write start signal WACTPZ (FIG. 17(g)). The memory core 28 selects a word line WL according to the address A02 in response to the RASZ signal, and performs a write operation (FIG. 17(h)). Subsequently, the core operation control circuit 26 changes the RASZ signal to low level in response to the output of the precharge signal PREZ (FIG. 17(i)). The word line WL is inactivated by the inactivation of the RASZ signal. The bit lines are precharged to a predetermined voltage in response to the precharge signal PREZ. The core operation control circuit 26 changes the COREZ signal to low level in response to the output of the precharge signal PREDZ (FIG. 17(j)). Then, the memory core 28 completes the write operation.

Figure 18:
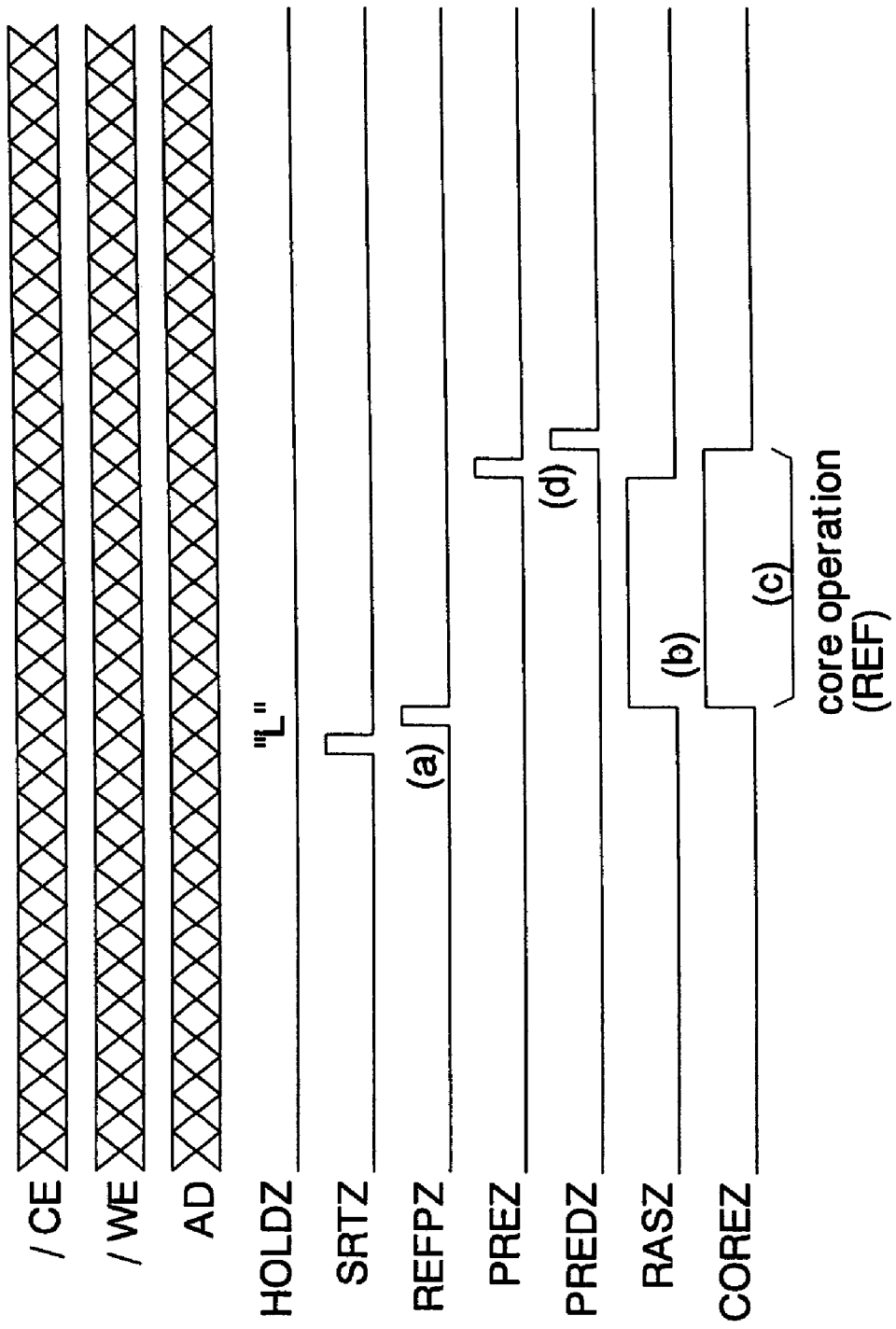
FIG. 18 is a timing chart showing an overview of the refresh operation.

FIG. 18 shows an overview of the refresh operation. The refresh operation is started by the self-refresh signal SRTZ being output at predetermined intervals by the refresh timer which is formed inside the refresh control circuit 22 shown in FIG. 1.

The refresh control circuit 22 shown in FIG. 7 outputs the refresh start signal REFPZ a predetermined time after the rising edge of the SRTZ signal (FIG. 18(a)). The core operation control circuit 26 shown in FIG. 9 outputs the core operation signal RASZ and the core signal COREZ in response to the REFPZ signal (FIG. 18(b)). The memory core 28 selects a word line WL according to the refresh address signal RFAZ generated by the refresh address counter in response to the RASZ signal, and performs the refresh operation REF (FIG. 18(c)). Subsequently, as in the read operation and write operation described above, the precharge signals PREZ and PREDZ are output to perform a precharge operation (FIG. 18(d)), completing the refresh operation REF.

Figure 19:
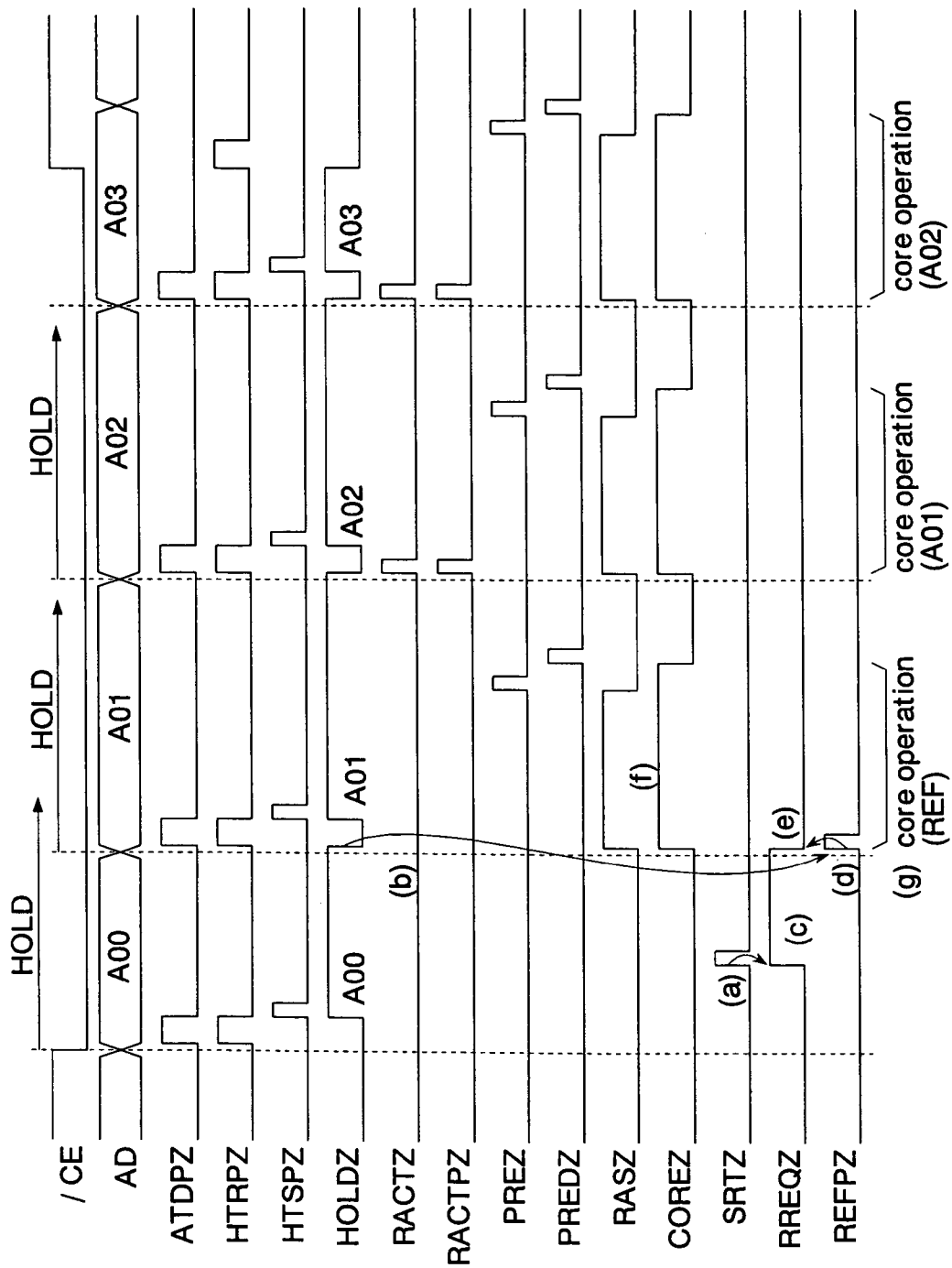
FIG. 19 is a timing chart showing an example of occurrence of the refresh request during the hold time in the read operation.

FIG. 19 shows an example where a refresh request occurs during the hold time in a read operation. The /CE signal and the AD signal vary as in FIG. 15 seen above.

The refresh request (SRTZ signal) occurs during the measurement of the hold time for the supply of the address A00 (FIG. 19(a)). Since the address A00 does not satisfy the hold time HOLD, the read request signal RACTZ will not be output in this cycle (FIG. 19(b)). The refresh control circuit 22 shown in FIG. 7 outputs the refresh request signal RREQZ in synchronization with the SRTZ signal (FIG. 19(c)).

The refresh control circuit 22 masks the output of the refresh request signal RREQZ during the output of the hold signal HOLDZ. The HOLDZ signal changes to low level when the timer 20 is reset by the change from the address A00 to the address A01. The refresh control circuit 22 releases the mask in response to the inactivation of the HOLDZ signal, and outputs the refresh start signal REFPZ (FIG. 19(d)). The refresh request signal RREQZ is reset by the output of the refresh start signal REFPZ (FIG. 19(e)).

The core operation control circuit 26 shown in FIG. 9 outputs the core operation signal RASZ and the core signal COREZ in response to the REFPZ signal (FIG. 19(f)). Then, the memory core 28 operates to perform the refresh operation REF (FIG. 19(g)). The hold time HOLD is set slightly longer than the operation time of the memory core 28. On this account, the refresh operation REF is sure to be completed during the measurement of the hold time HOLD of the address A01. The memory core operations for the addresses A01 and A02 are thus performed with the same timing as in FIG. 15.

Figure 20:
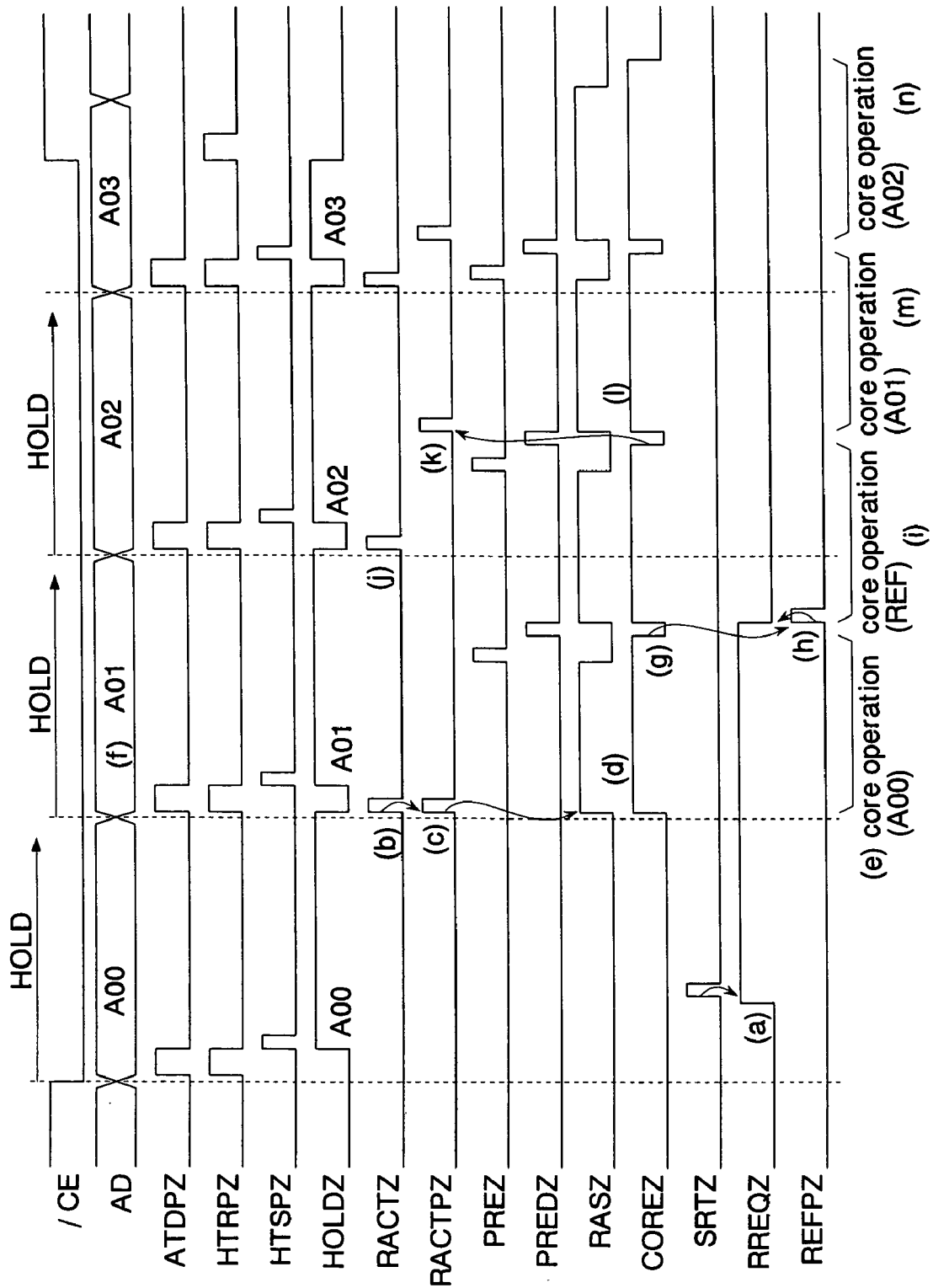
FIG. 20 is a timing chart showing another example of occurrence of the refresh request during the hold time.

FIG. 20 shows an example where a refresh request occurs during the hold time in a read operation that satisfies the hold time HOLD.

The refresh control circuit 22 outputs the refresh request signal RREQZ in synchronization with the SRTZ signal (FIG. 20(a)). The refresh control circuit 22 masks the output of the refresh start signal REFPZ during the output of the hold signal HOLDZ. Since the address A00 satisfies the hold time HOLD, the timer 20 outputs the hold end signal HTPZ (not shown). The active control circuit 24 shown in FIG. 8 outputs the read request signal RACTZ in response to the hold end signal HTSPZ (FIG. 20(b)). The NAND gate 24e of the active control circuit 24 is activated in response to the high level of the RACTZ signal. The read request (RACTZ signal) held in the flip-flop 24d is transferred to the flip-flop 24f, and the read start signal RACTPZ is output (FIG. 20(c)).

The core operation control circuit 26 shown in FIG. 9 outputs the core operation signal RASZ and the core signal COREZ in response to the read start signal RACTPZ (FIG. 20(d)). That is, in this example, the read operation corresponding to the address A00 is performed before the refresh operation REF (FIG. 20(e)). During the read operation corresponding to the address A00, the next address A01 is supplied and the timer 20 starts to measure the hold time HOLD (FIG. 20(f)).

The core signal COREZ changes to low level at the same time with the completion of the read operation (FIG. 20(g)). The refresh control circuit 22 releases the mask in response to the inactivation of the CORE signal, and outputs the refresh start signal REFPZ (FIG. 20(h)). The refresh operation REF is performed in response to the output of the refresh start signal REFPZ (FIG. 20(i)).

The measurement of the hold time HOLD is completed during the execution of the refresh operation REF, and the read request signal RACTZ is output (FIG. 20(j)). The NAND gate 24e of the active control circuit 24 shown in FIG. 8 is inactivated during the output of the COREZ signal. The active control circuit 24 outputs the read start signal RACTPZ in response to the inactivation of the COREZ signal resulting from the completion of the refresh operation REF (FIG. 20(k)).

The core operation control circuit 26 shown in FIG. 9 outputs the core operation signal RASZ and the core signal COREZ in response to the read start signal RACTPZ (FIG. 20(l)). Then, the read operation corresponding to the address signal A01 is performed (FIG. 20(m)). Subsequently, the read operation corresponding to the address signal A02 is performed (FIG. 20(n)).

The hold time HOLD is set slightly longer than the operation time of the memory core 28. Consequently, even if a refresh request occurs during consecutive read operations of the memory core 28 and delays the operation of the memory core 28, the delay can be eliminated in several cycles.

Figure 21:
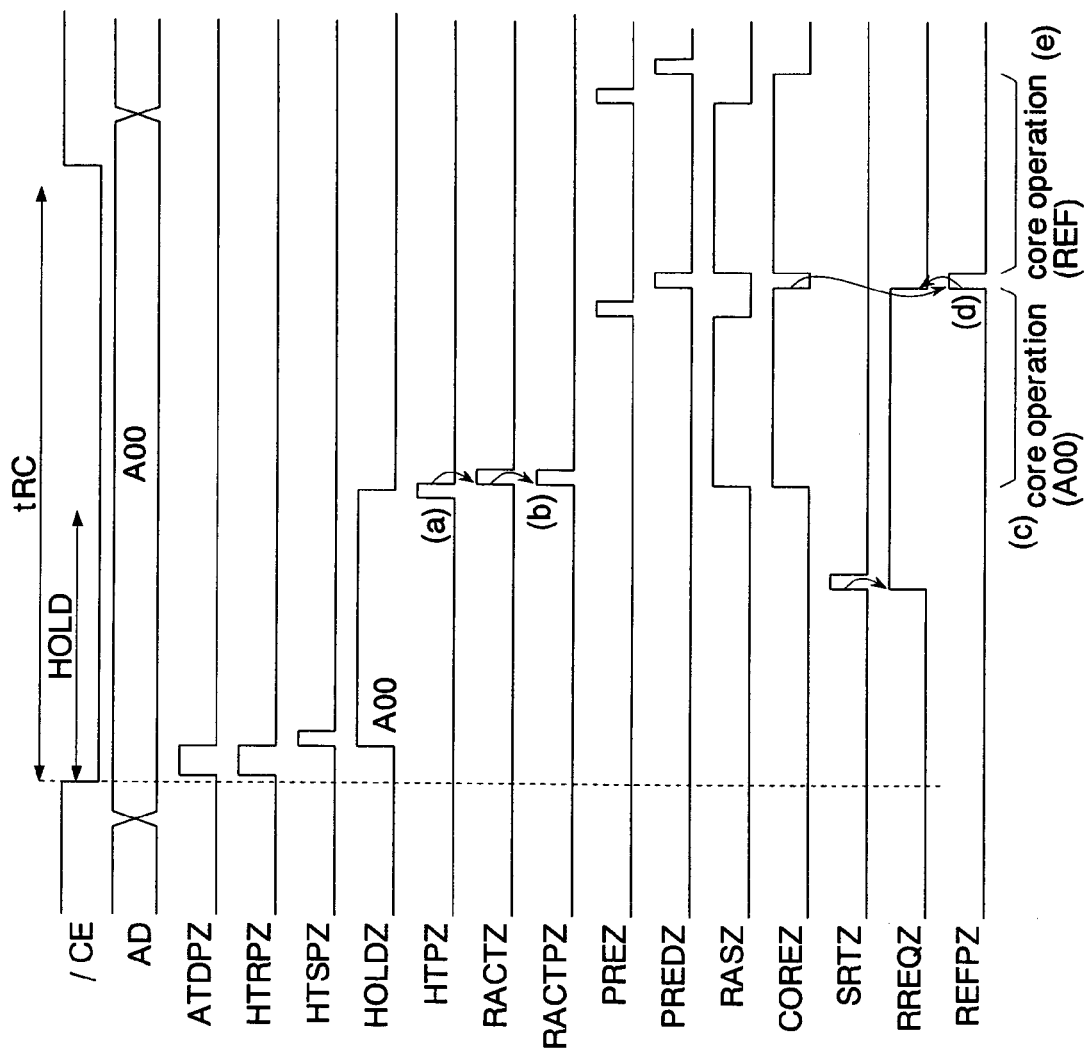
FIG. 21 is a timing chart showing another example of occurrence of the refresh request during the hold time.

FIG. 21 shows an example where a refresh request occurs during the hold time in a read cycle that satisfies the cycle time tRC.

Initially, as in FIG. 20 seen above, the hold end signal HTPZ is output since the address A00 satisfies the hold time HOLD (FIG. 21(a)). In response to the hold end signal HTPZ, the read request signals RACTZ and RACTPZ are output in succession (FIG. 21(b)), and a read operation is performed (FIG. 21(c)).

Next, the refresh start signal REFPZ is output in response to the inactivation of the CORE signal resulting from the completion of the read operation (FIG. 21(d)). Then, the refresh operation REF is performed in response to the output of the refresh start signal REFPZ (FIG. 21(e)).

Figure 22:
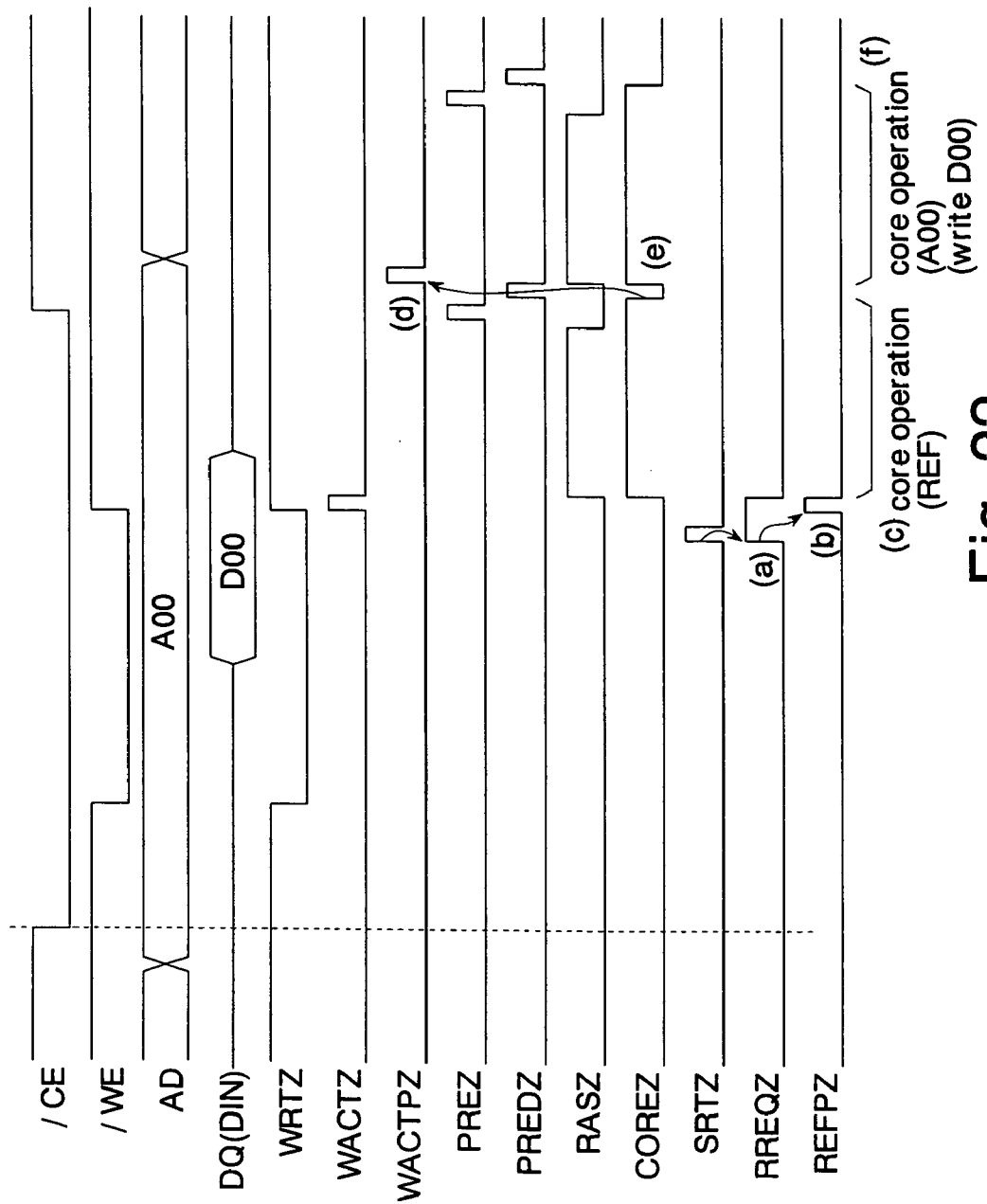
FIG. 22 is a timing chart showing an example of occurrence of the refresh request just before the rising edge of /WE signal in the write operation.

FIG. 22 shows an example where a refresh request (SRTZ signal) occurs immediately before the rising edge of the /WE signal in a write operation.

Initially, the refresh request signal RREQZ is output in response to the SRTZ signal (FIG. 22(a)). Here, the memory core 28 is not in operation, and the hold time HOLD is not under measurement, either. The refresh control circuit 22 shown in FIG. 7 thus outputs the refresh start signal REFPZ with a predetermined time of delay after the RREQZ signal (FIG. 22(b)). Then, the refresh operation REF is performed before the write operation (FIG. 22(c)).

The NAND gate 24e of the active control circuit 24 shown in FIG. 8 is inactivated during the output of the COREZ signal. The active control circuit 24 outputs the write start signal WACTPZ in response to the inactivation of the COREZ signal resulting from the completion of the refresh operation REF (FIG. 22(d)).

The core operation control circuit 26 shown in FIG. 9 outputs the core operation signal RASZ and the core signal COREZ in response to the write start signal WACTPZ (FIG. 22(e)). Then, the write operation corresponding to the address signal A00 is performed (FIG. 22(f)).

Figure 23:
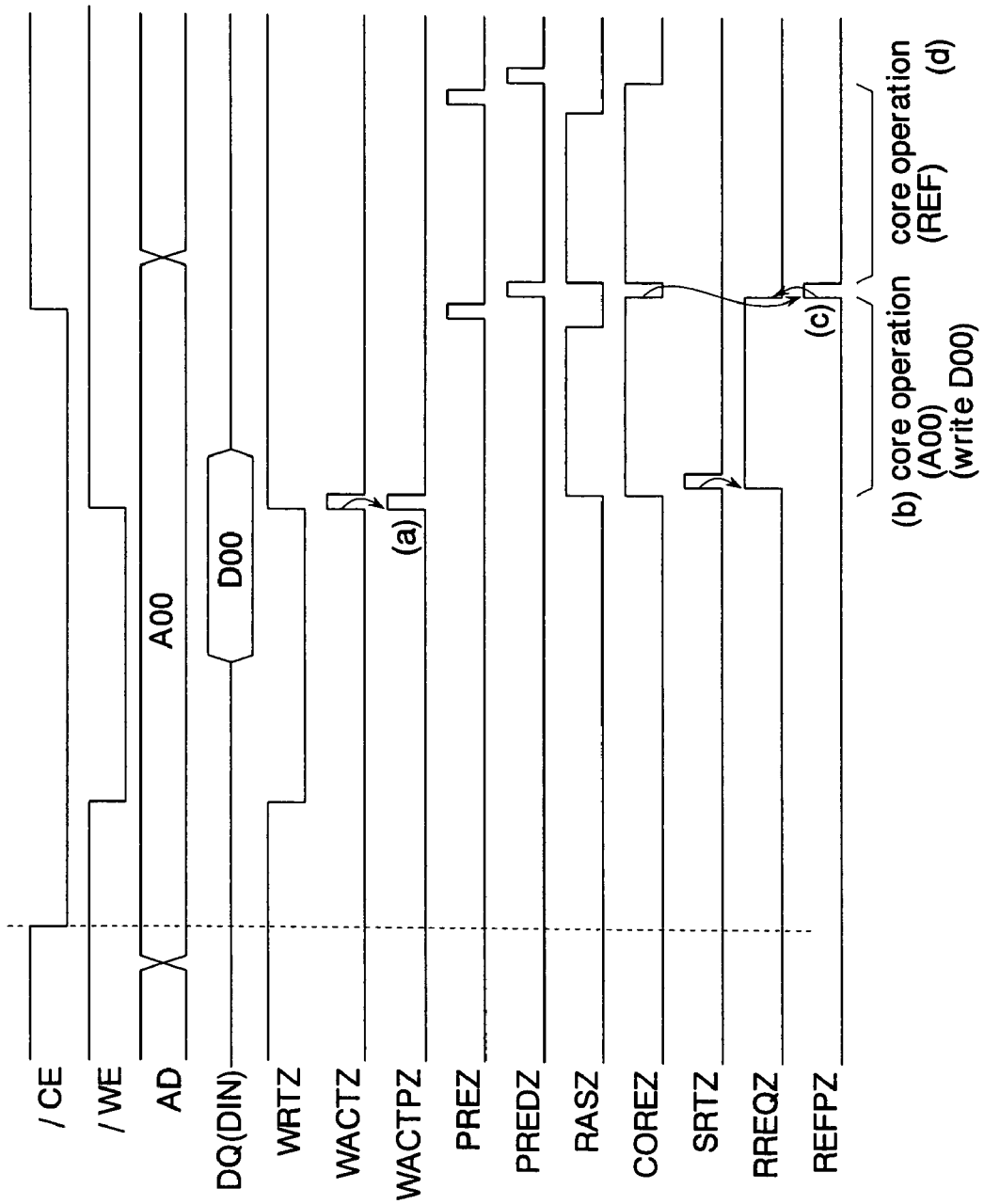
FIG. 23 is a timing chart showing an example of occurrence of the refresh request just after the rising edge of /WE signal in the write operation.

FIG. 23 shows an example where a refresh request (SRTZ signal) occurs immediately after the rising edge of the /WE signal in a write operation.

In this example, the write request signal WACTZ is supplied to the active control circuit 24 (FIG. 8) before the refresh request signal RREQZ is. The active control circuit 24 thus outputs the write start signal WACTPZ (FIG. 23(a)). Then, the write operation is performed before the refresh operation REF (FIG. 23(b)).

The refresh control circuit 22 shown in FIG. 7 releases the mask in response to the inactivation of the COREZ signal resulting from the write operation, and outputs the refresh start signal REFPZ (FIG. 22(c)). Then, the refresh operation REF is performed (FIG. 23(d)).

Figure 24:
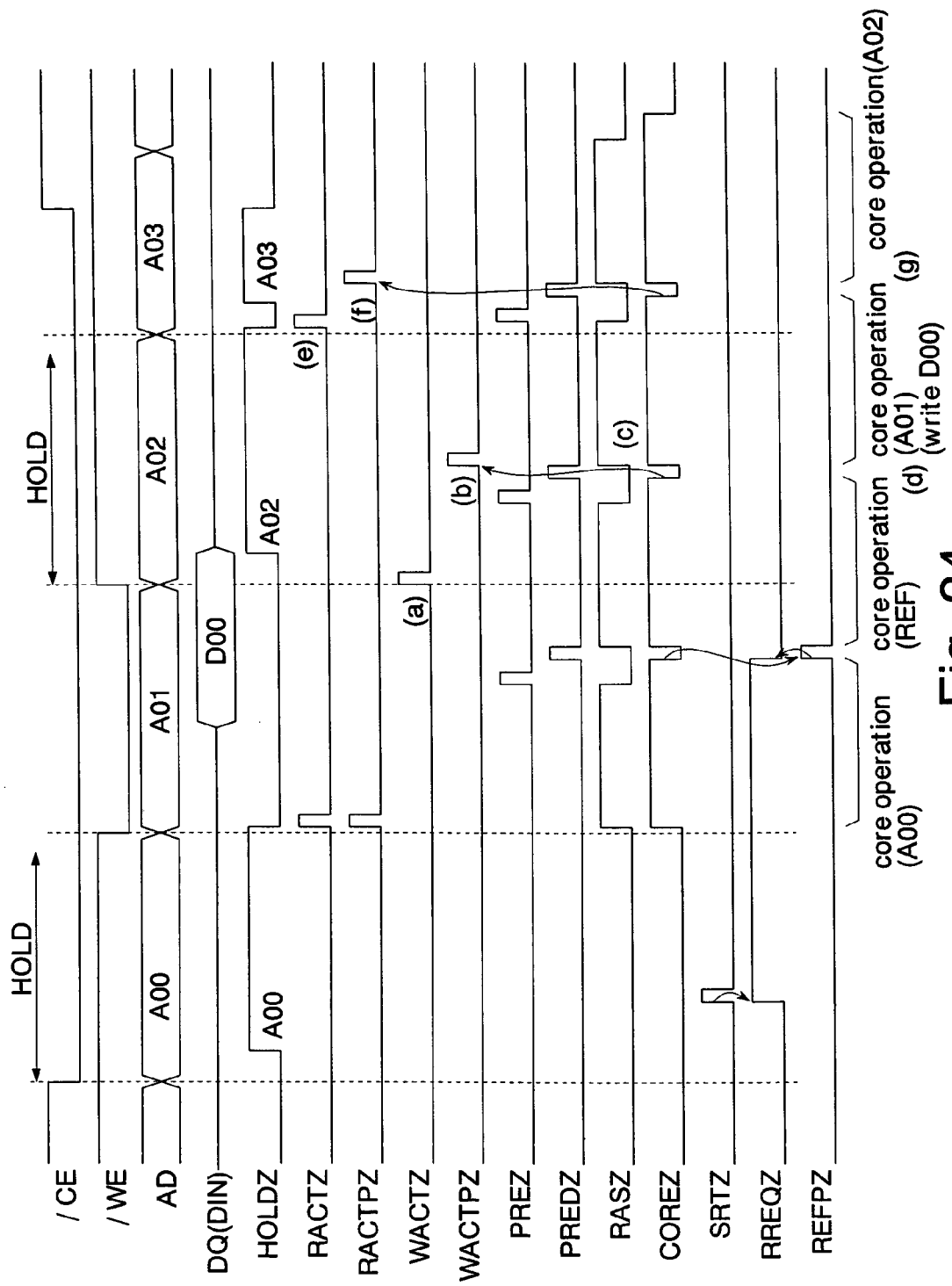
FIG. 24 is a timing chart showing an example of sequentially performing the read operation, write operation and read operation which satisfy the hold time.

FIG. 24 shows an example where a read operation, a write operation, and a read operation that satisfy the hold time HOLD are performed in succession, and a refresh request occurs during the hold time of the first read operation.

The read operation corresponding to the address A00 and the refresh operation are the same as in FIG. 20 seen above, and description thereof will thus be omitted. The /WE signal changes to high level during the refresh operation REF, and the write request signal WACTZ is output (FIG. 24(a)). As in FIG. 22, the active control circuit 24 shown in FIG. 8 outputs the write start signal WACTPZ in response to the inactivation of the COREZ signal resulting from the completion of the refresh operation REF (FIG. 24(b)). Then, the core operation signal RASZ and the core signal COREZ are output in response to the write start signal WACTPZ (FIG. 24(c)), and the write operation corresponding to the address A01 is performed (FIG. 24(d)).

The hold time HOLD after the supply of the address A02 during the refresh operation and the write operation, the read request signal RACTZ is output (FIG. 24(e)). Here, the memory core 28 is executing the write operation. The active control circuit 24 thus outputs the read start signal RACTPZ in response to the inactivation of the COREZ signal resulting from the completion of the write operation (FIG. 24(f)). Then, the read operation corresponding to the address signal A02 is performed (FIG. 24(g)).

Figure 25:
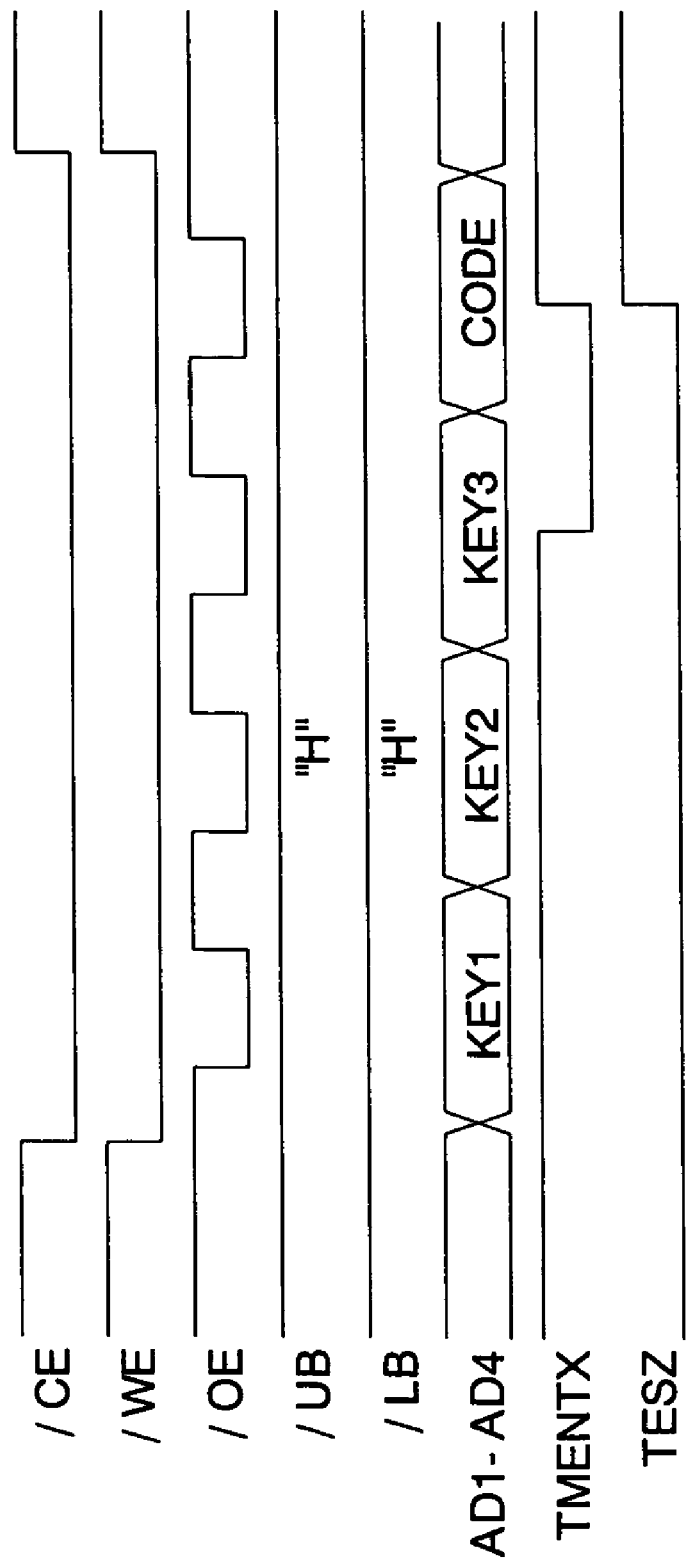
FIG. 25 is a timing chart showing a method of shifting the FCRAM from the normal operation mode to the test mode.

FIG. 25 shows a method of shifting the FCRAM from the normal operation mode (standby mode) to the test mode.

In the state where the /CE signal and the /WE signal are held at low level and the /UB signal and the /LB signal are held at high level, the FCRAM clocks the /OE signal three times and supplies the address terminal AD with 4-bit address signals AD1–AD4 indicating predetermined logic values KEY1, KEY2, and KEY3 in succession, thereby entering the test mode. In this embodiment, KEY1 is "1111", KEY21 is "0111", and KEY3 is "1011". The test entry circuit 34e shown in FIG. 12 changes the test entry signal TMENTPX to low level when it receives the correct KEY1, KEY2, and KEY3.

Subsequently, the test start circuit 34g shown in FIG. 11 receives the test code CODE (predetermined logic value) which is supplied in synchronization with the fourth /OE signal, and activates a test signal TESZ corresponding to the test code CODE. For example, the test start circuit 34g activates the test signal TES64Z for conducting the test TES64.

Moreover, if the test code CODE is one for exiting the test mode, the test exit circuit 34f shown in FIG. 11 outputs the test exit signal TMEXITPZ. Then, the FCRAM shifts from the test mode to the normal operation mode.

Figure 26:
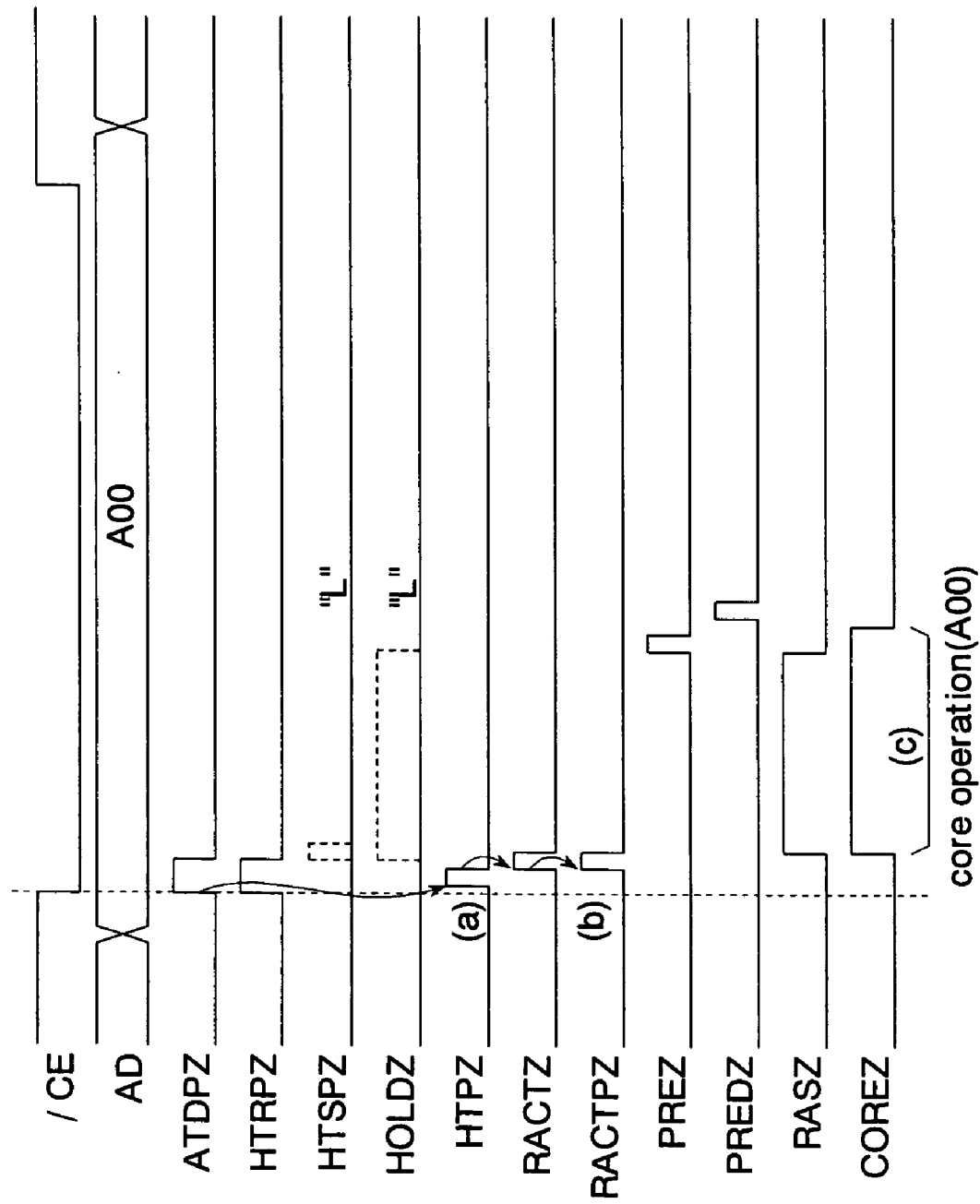
FIG. 26 is a timing chart showing an overview of the test TES64.

FIG. 26 shows an overview of the test TES64. When the test TES64 is performed in the test mode by using an LSI tester, it is possible to evaluate the actual value of the operation time of the memory core 28.

In the test TES64, the oscillator 20g of the timer 20 will not operate in the read operation, and the hold end signal HTPZ is generated by the hold output circuit 20e in response to the address transition signal ATDPZ (FIG. 26(a)). In response to the hold end signal HTPZ, the read request signals RACTZ and RACTPZ are output in succession (FIG. 26(b)), and the read operation is performed (FIG. 26(c)). That is, the test TES64 can evaluate the actual value of the read operation time of the memory core 28. Since the actual value can be evaluated, it is possible to determine if the oscillator 20g of the timer 20 has an optimum cycle.

Figure 27:
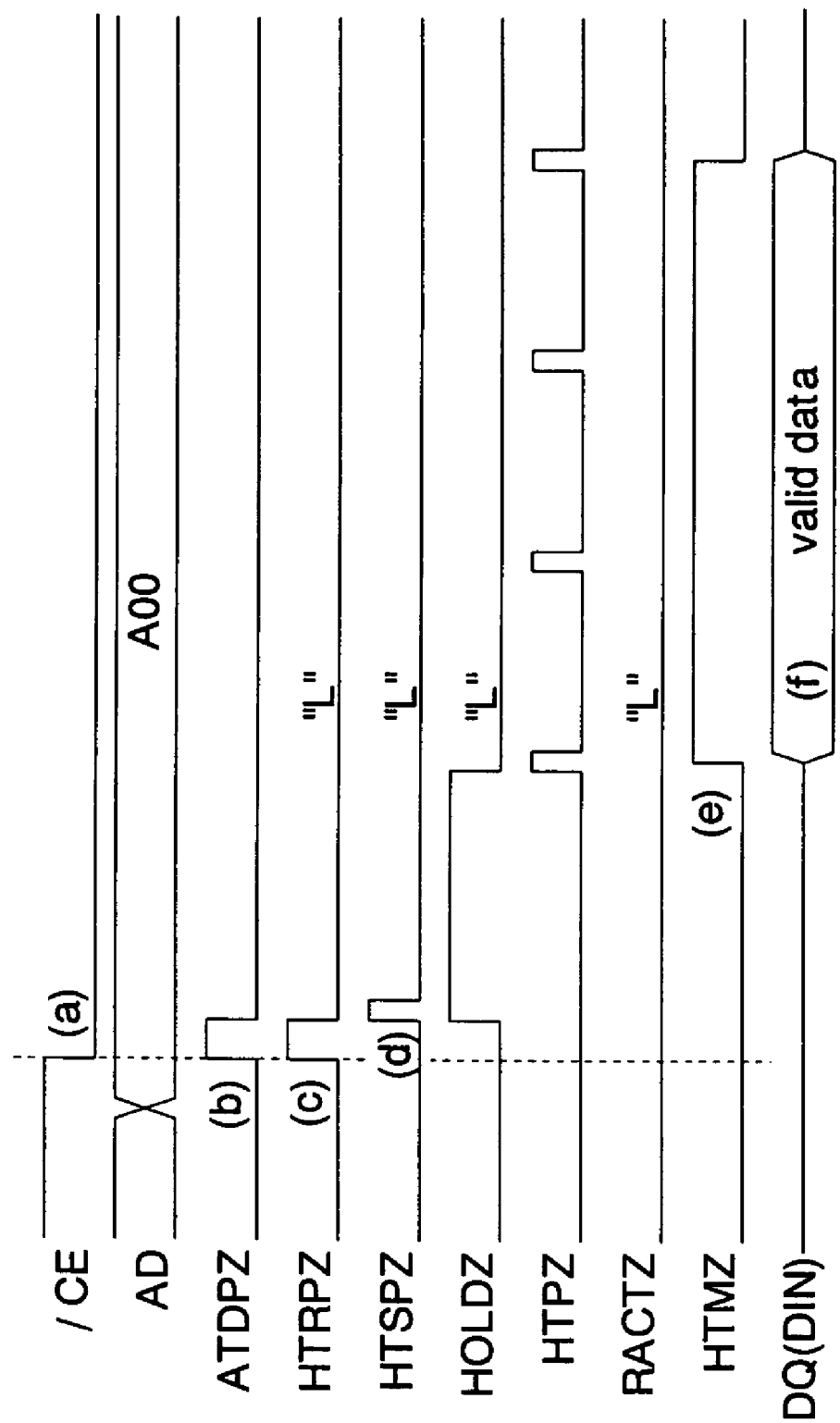
FIG. 27 is a timing chart showing an overview of the test TES65.

FIG. 27 shows an overview of the test TES65. When the test TES65 is performed in the test mode by using an LSI tester, it is possible to measure the hold time HOLD.

Initially, after the shift to the test mode (test TES65), the /CE signal is changed to low level (FIG. 27(a)). Due to the change in the /CE signal, the address transition signal ATDPZ is output (FIG. 27(b)). The timer reset signal HTRPZ is output in response to the address transition signal ATDPZ (FIG. 27(c)), so that the timer 20 shown in FIG. 6 is reset. The timer start signal HTSPZ is also output in response to the address transition signal ATDPZ, and the timer 20 starts operation.

In the test TES65, the active generation circuit 24a of the active control circuit 24 shown in FIG. 8 masks the read request signal RACTZ from being output in response to the hold end signal HTPZ that indicates that the hold time HOLD is satisfied. That is, no read operation will be performed even if the hold end signal HTPZ is output. Besides, the reset circuit 16 shown in FIG. 5 receives the high level of the test control signal TES65Z, and masks the timer reset signal HTRPZ from being output in response to the hold end signal HTPZ. Consequently, the timer 20 keeps operating without being reset. As a result, the timer 20 outputs the hold end signal HTPZ each time the hold time HOLD is reached.

The hold measurement circuit 34a shown in FIG. 10 changes the hold measurement signal HTMZ to high level while it receives the hold end signal HTPZ four times (FIG. 27(e)). The hold measurement signal HTMZ forces, for example, the least significant bit (DQ0) of the data terminal DQ to output a high level (FIG. 27(f)). Measuring the high-level period of the data terminal DQ0 by an LSI tester thus allows evaluation on the operation time of the timer 20. As a result, in combination with the result of evaluation of the foregoing test TES64, it is easily possible to evaluate if the hold time HOLD is optimum.

Figure 28:
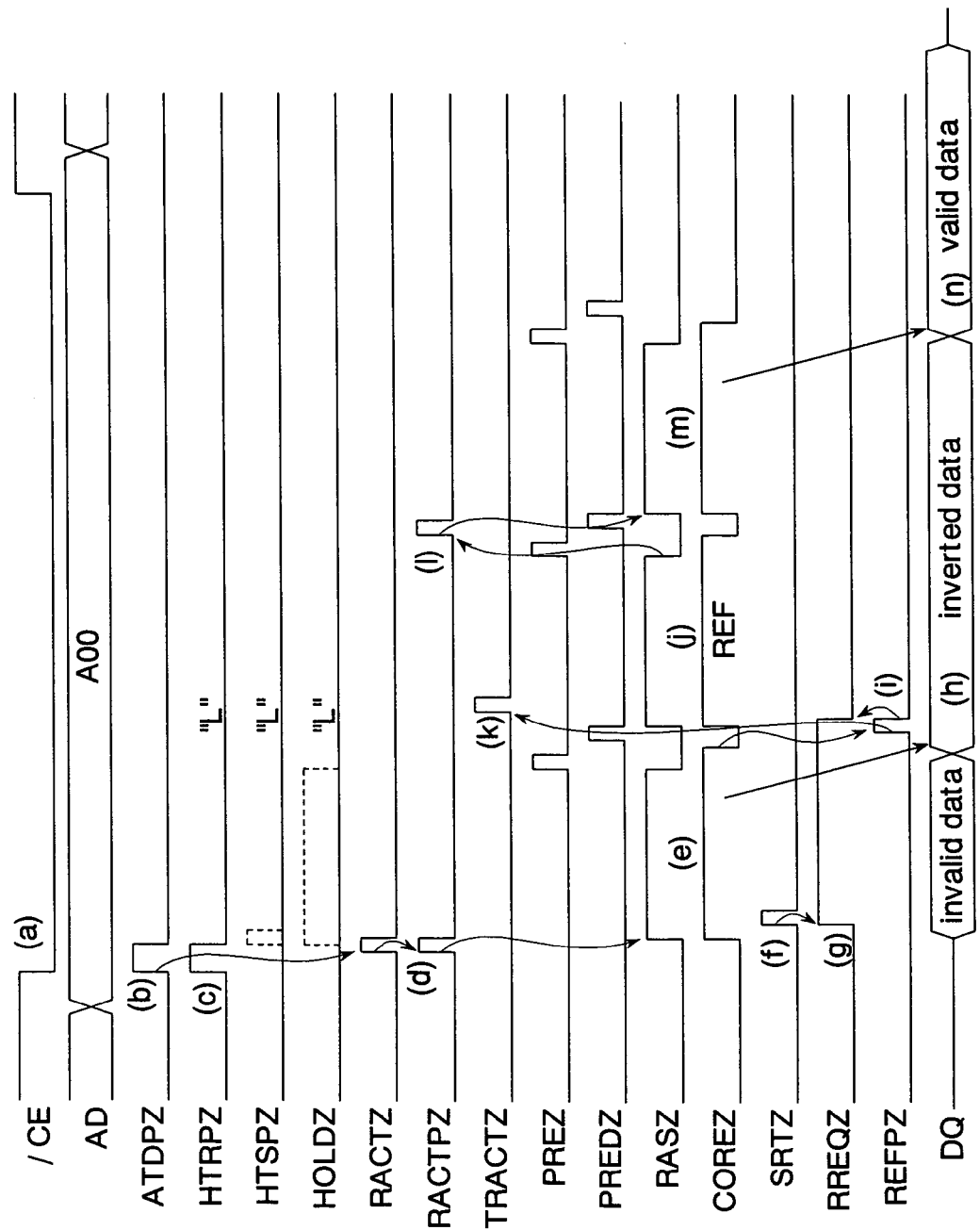
FIG. 28 is a timing chart showing an overview of the test TES03.

FIG. 28 shows an overview of the test TES03. When the test TES03 is performed in the test mode by using an LSI tester, it is possible to measure the worst access time of a read operation. The worst access time is the access time for situations where a core operation corresponding to the previous read request and a core operation corresponding to a refresh request are performed after a read request. In the test TES03, these operations are performed automatically inside the FCRAM.

In the test TES03, before the shift to the test mode, for example, the memory cells corresponding to the address A00 and other memory cells are written with mutually inverse data. Moreover, the test TES64 is entered in advance so that the read operation is started without waiting for the hold time HOLD in an access request.

Initially, after the shift to the test mode (test TES64, TES03), the /CE signal is changed to low level (FIG. 28(a)). Due to the change in the /CE signal, the address transition signal ATDPZ is output (FIG. 28(b)). The timer reset signal HTRPZ is output in response to the address transition signal ATDPZ (FIG. 28(c)), so that the timer 20 shown in FIG. 6 is reset. Because of the entry of the test TES64, however, the timer start signal HTSPZ will not be output. Consequently, the timer 20 makes no operation and the hold signal HOLDZ is not output.

Subsequently, the read request signals RACTZ and RACTPZ are output in succession as in FIG. 26 (FIG. 28(d)). Then, the read operation corresponding to the address A00 is performed (FIG. 28(e)).

The refresh control circuit 34b of the test mode circuit 34 shown in FIG. 10 outputs the self-refresh signal TSRTZ in response to the hold end signal HTPZ (FIG. 28(f)). That is, in the test TES03, the refresh request is generated forcefully in response to the read request. The refresh control circuit 22 shown in FIG. 22 outputs the refresh request signal RREQZ in response to the self-refresh signal TSRTZ (FIG. 28(g)).

Moreover, the input/output control circuit 30 shown in FIG. 1 receives the self-refresh signal TSRTZ, and inverts the read data from the memory core 28. The inverted read data (inverted data) is latched by the input/output circuit 32 and output to the data terminal DQ (FIG. 28(h)).

After the operation of the memory core 28 corresponding to the address A00, the refresh control circuit 22 outputs the refresh start signal REFPZ in response to the falling edge of the core signal COREZ (FIG. 28(i)). Then, the refresh operation is started after the read operation (FIG. 28(j)).

Furthermore, the refresh control circuit 34b outputs the test read request signal TRACTZ in response to the refresh start signal REFPZ (FIG. 28(k)). Consequently, after the refresh operation, the active control circuit 24 shown in FIG. 8 outputs the read start signal RACTPZ in response to the falling edge of the core signal COREZ signal (FIG. 28(l)). Then, the read operation corresponding to the address A00 is performed again (FIG. 28(m)).

In response to the test read request signal TRACTZ, the input/output control circuit 30 stops inverting the read data from the memory core 28. The data read from the memory core 28 is thus output to the data terminal DQ as valid data (FIG. 28(n)). Then, the LSI tester measures the time from the falling edge of the /CE signal to the output of the valid data, thereby evaluating the worst access time of the FCRAM.

Figure 29:
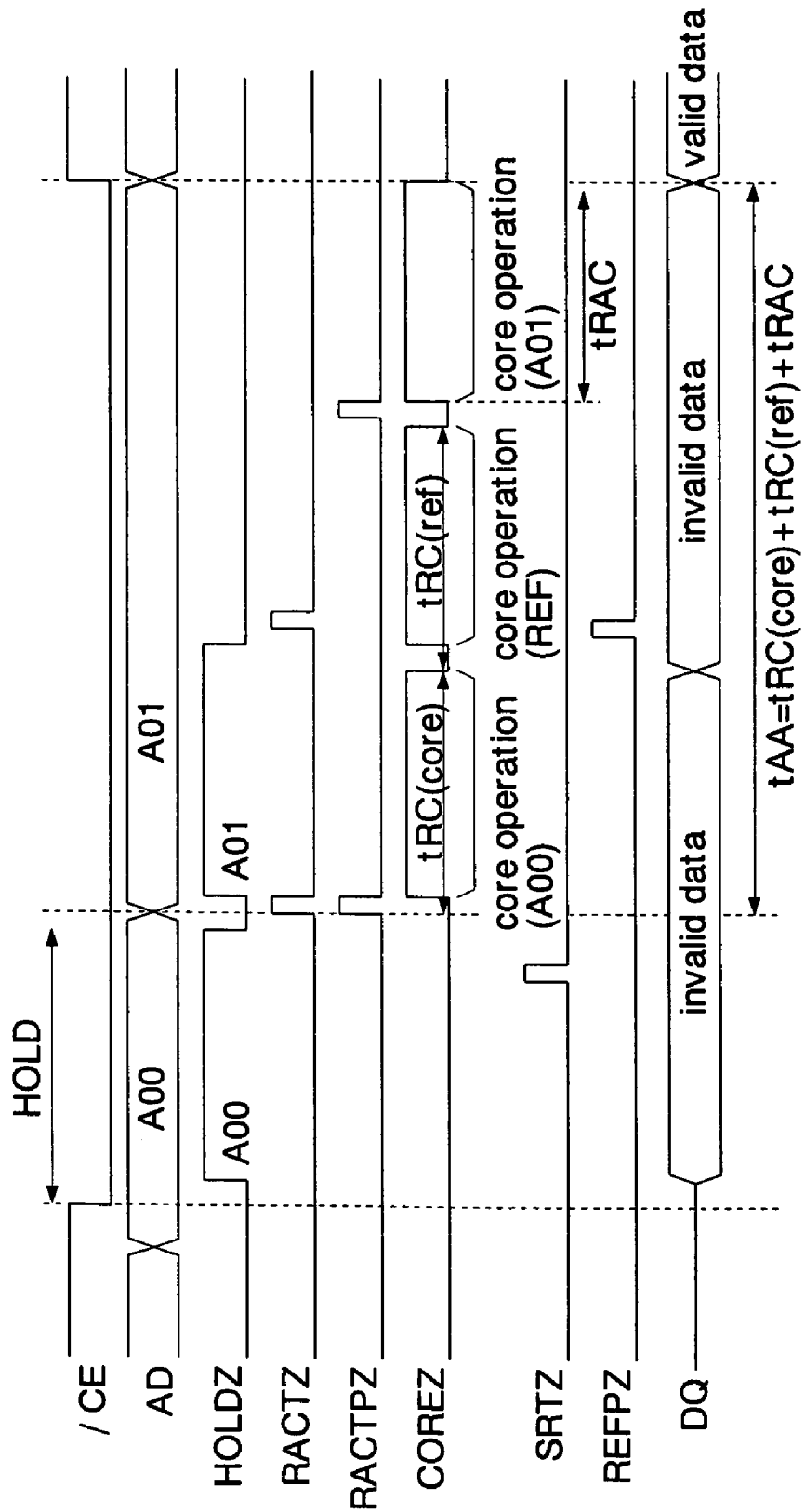
FIG. 29 is a timing chart showing the worst access operation actually occurring in the FCRAM.

FIG. 29 shows a worst access operation which actually occurs in the FCRAM.

In this example, a refresh request occurs before the start of operation of the memory core 28 corresponding to a read request that satisfies the hold time HOLD but not the worst access time (=cycle time). Then, a read operation satisfying the cycle time is performed. Here, the FCRAM operates with the same timing as in the test TES03 shown in FIG. 28. As shown in the chart, the value of the worst access time tAA is the core operation time tRC(core) resulting from the read operation, added with the core operation time tRC(core) resulting from the fresh operation and the address access time tRAC resulting from the final read operation. Incidentally, the read operation corresponding to the address A01 shown in FIG. 20 is also a worst access operation.

Figure 30:
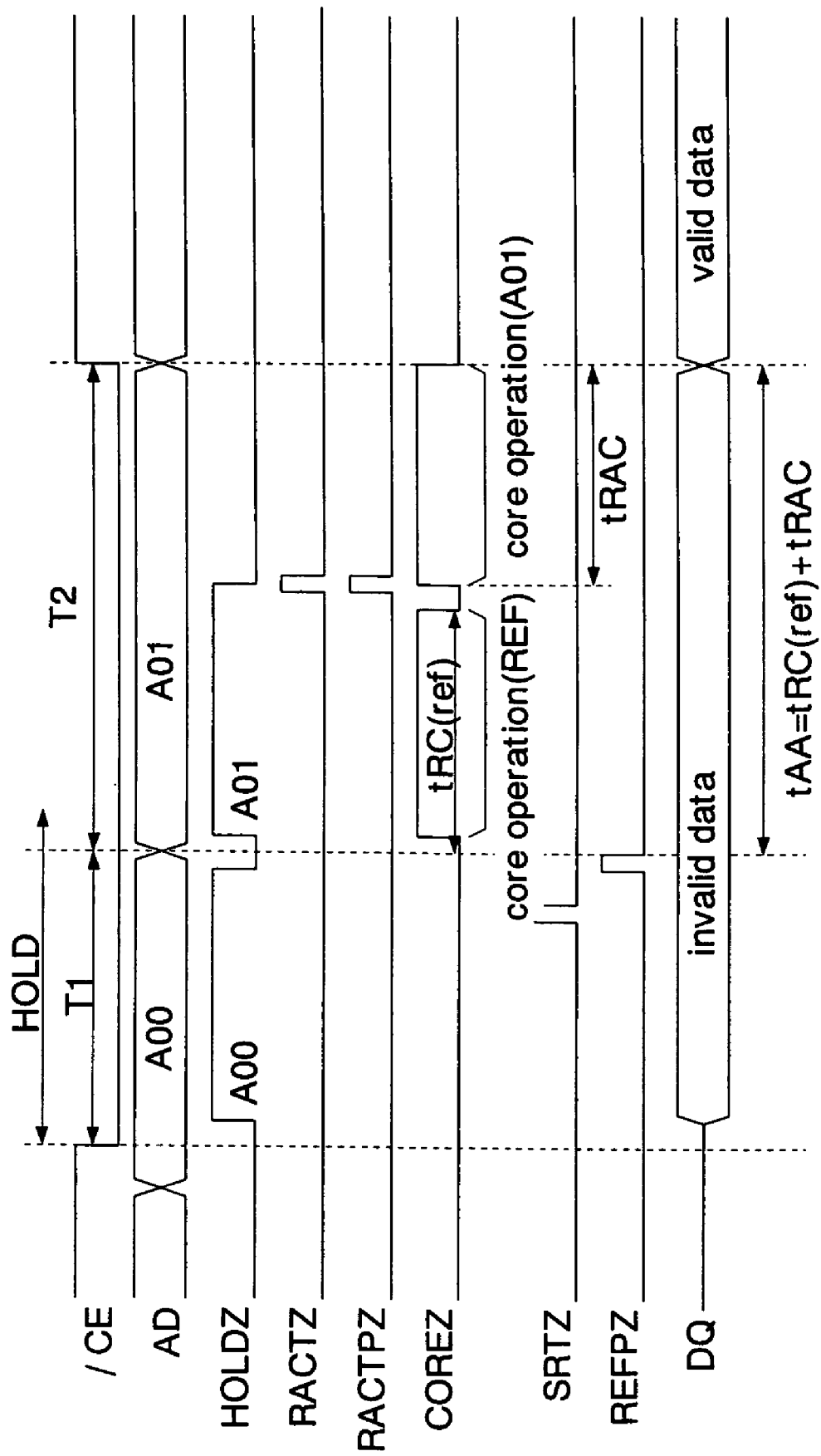
FIG. 30 is a timing chart showing the worst access time when the timing specification of the FCRAM is changed.

FIG. 30 shows the worst access time when the timing specification of the FCRAM is changed.

In this example, before the request for a read access (address A01) of time T2 which is longer than the access time, an address signal AD (address A00) of time T1 shorter than the hold time HOLD is always inserted. Moreover, at the time of read accesses, it is prohibited to hold the address signal AD longer than the time T1 and shorter than the time T2. That is, when the memory core 28 is in operation, the read data is always output to the data terminal DQ. Here, since the memory core 28 makes no operation corresponding to the address A00, it is possible to reduce the worst access time by a single core operation.

As above, according to the present embodiment, a read operation is started after a lapse of the hold time HOLD, which is longer than the core operation time, since the reception of the access request for performing the read operation. Thus, when the address signal AD or the chip enable signal /CE varies in a short time, the memory core 28 can be prevented from making operation in response to this variation. As a result, it is possible to prevent the memory core 28 from malfunctioning and prevent the data retained in the memory cells from crashing.

In addition, since the memory core 28 is operated after the hold time HOLD has elapsed, it is possible to eliminate the limitation as to the hold time of the address signal AD. This makes it possible to tailor the interface of the FCRAM to the SRAM interface. As a result, this can facilitate substitution of the FCRAM (pseudo SRAM) in an SRAM-using system. In other words, it is possible to reduce man-hours needed for system modification that is necessary for the substitution of the FCRAM. Moreover, it is possible to lower the probability of occurrence of problems ascribable to the substitution of the FCRAM.

The measurement of the hold time HOLD is started when the edge detecting circuit 12 detects a transition edge of the address signal AD and the chip enable signal /CE. Consequently, the hold time HOLD can be measured with reliability in response to the change in the AD signal and the /CE signal.

The set circuit 18 outputs the timer set signal HTSPZ after the timer reset signal HTRPZ is output from the reset circuit 16. Consequently, the timer 20 can be surely reset before start, so that the hold time HOLD can always be measured properly.

The reset signal HTRPZ for resetting the timer 20 is output at the time of output of the address transition signal ATDPZ, in the inactive period of the chip enable signal /CE, and in the active period of the write enable signal /WE. Since the timer 20 is reset when the operation of the timer 20 is unnecessary, the malfunction of the timer 20 is avoided with reliability.

Since the timer 20 is made of the oscillator 20g and the counters 20b, 20c, 20d, and 20e in combination, the hold time HOLD can be measured easily with a high degree of precision. In addition, the hold time HOLD can be easily adjusted by switching the photomask or implementing a fuse circuit.

The refresh control circuit 22 is operated as an arbiter circuit for establishing priority between the refresh operation and the read operation, and the output of the refresh start signal REFPZ is disabled when the memory core 28 is in operation or when the hold time HOLD is under measurement. It is therefore possible to avoid a conflict between the refresh operation and access operations (read operation and write operation). Since the refresh start signal REFPZ is not output during the measurement of the hold time HOLD, the start timings of the read operation and the refresh operation can be set to come after the measurement of the hold time HOLD. This allows easy control over the operation of arbitration between the refresh operation, corresponding to the refresh request which occurs at random, and the read operation.

The active control circuit 24 is operated as an arbiter circuit for establishing priority between the refresh operation and the access operations, and the outputs of the read start signal RACTPZ and the write start signal WACTPZ are disabled when the memory core 28 is in operation. It is therefore possible to avoid a conflict between the refresh operation, corresponding to the refresh requests which occurs at random, and the access operations.

The timing specification as to the hold time of the address signal AD is limited to shorter than the hold time HOLD or longer than the cycle time tRC which is necessary for a single read operation. That is, hold times longer than the hold time HOLD and shorter than the cycle time tRC are prohibited. As a result, it is possible to avoid the execution of useless memory core operations not contributing to accesses, allowing a reduction in cycle time tRC.

The shift from the normal operation mode to the test mode occurs when the address terminal AD receives three predetermined keys (logic values) in succession. This reduces the probability of entering the test mode by mistake, and can bring the FCRAM into the test mode easily without the formation of dedicated test terminals. At the time of entering the test mode, a code for indicating the test item can be supplied to follow the predetermined keys so that the test to be performed can be selected from among a plurality of tests.

It is prohibited to perform a write operation in response to the write enable signal /WE that is supplied at the time of entering the test mode. This can prevent the write operation from being performed by mistake at the time of entering the test mode, destroying the data retained in the memory cells MC.

After the entry to the test TES64, the timer 20 disables the measurement of the hold time HOLD, and outputs the read request signal RACTZ forcefully in response to the change in the address signal AD or the chip enable signal /CE. The memory core 28 can thus be evaluated for the actual value of the access time easily.

After the entry to the test TES65, the hold measurement signal HTMZ which shows that the timer 20 is measuring the hold time HOLD is output to the data terminal DQ. The hold time HOLD can thus be measured from exterior easily. Moreover, the hold measurement signal HTMZ is held at high level while the hold time HOLD is measured four times. The hold time HOLD can thus be measured easily with a high degree of precision even if it is short.

After the entry to the test TES03, the self-refresh signal TSRTZ is generated forcefully in response to the change in the address signal AD or the chip enable signal /CE, and the refresh operation is started immediately after the completion of a read operation. Furthermore, in response to the refresh start signal REFPZ, the test read request signal TRACTZ is generated forcefully to perform a read operation. Consequently, the worst access operation can be automatically performed by the test circuit of the FCRAM, allowing easy measurement of the worst access time.

Figure 31:
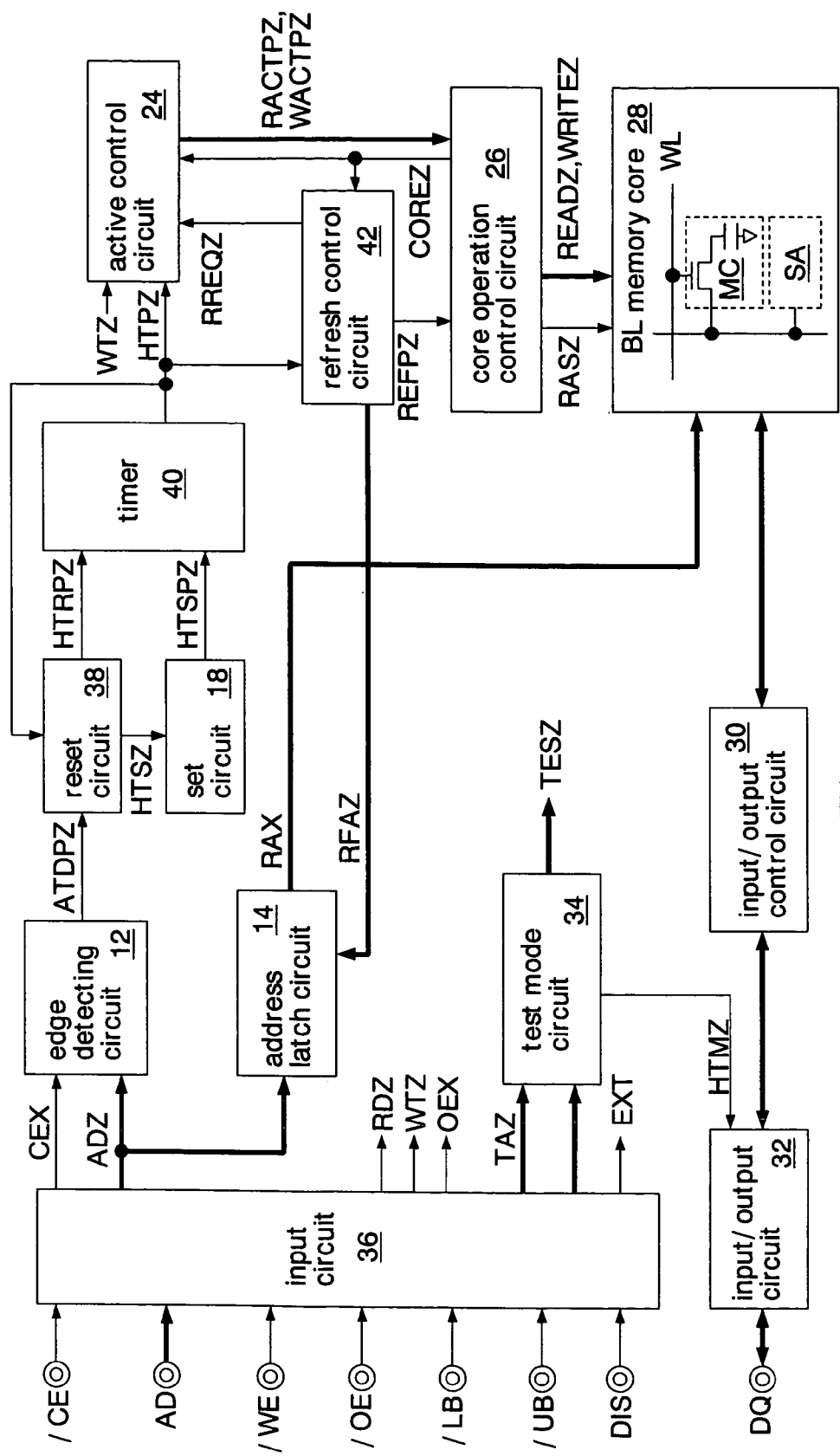
FIG. 31 is a block diagram showing a second embodiment of the semiconductor memory of the present invention.

FIG. 31 shows a second embodiment of the semiconductor memory of the present invention. The same circuits and signals as the circuits and signals described in the first embodiment will be designated by identical reference numbers or symbols. Detailed description thereof will be omitted.

The FCRAM of this embodiment has a disable terminal DIS for disabling the measurement of the hold time HOLD and disabling refresh operations. A disable signal DIS supplied from the disable terminal DIS to an input circuit 36 is supplied to a reset circuit 38, a timer 40, and a refresh control circuit 42. For the sake of performing refresh operations with reliability, the maximum time (specification) of the high-level period of the disable signal DIS is set shorter than the cycle of occurrence of the self-refresh signal SRTZ. The rest of the configuration is the same as in the first embodiment (FIG. 1).

Figure 32:
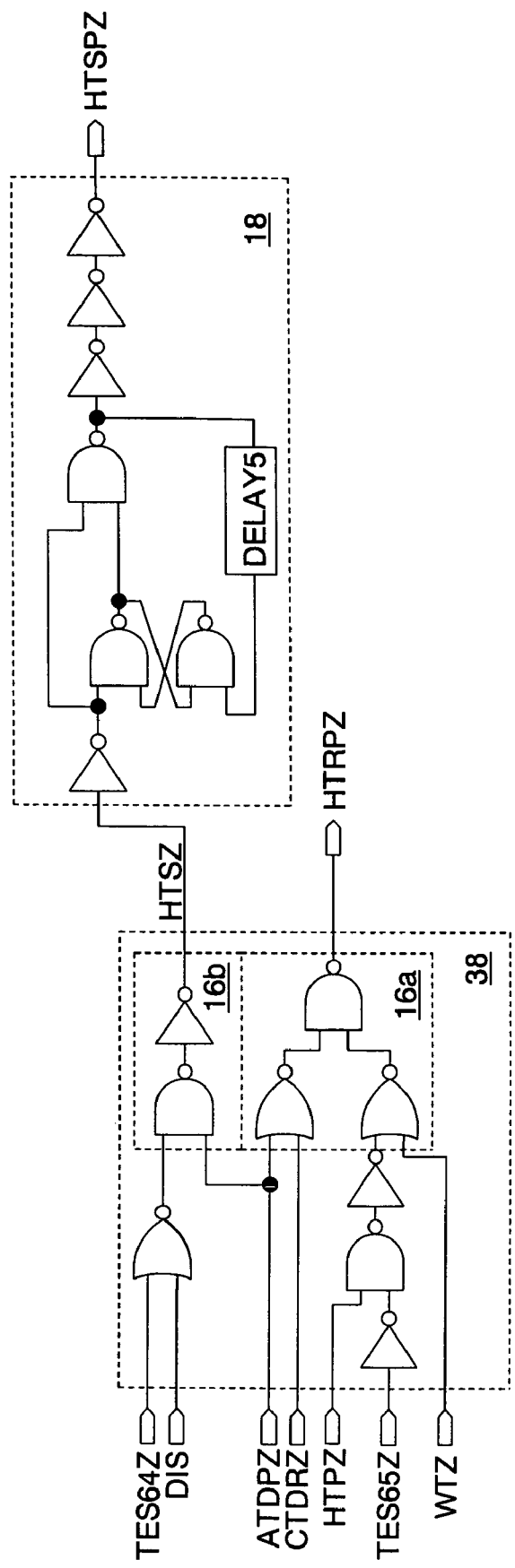
FIG. 32 is a circuit diagram showing the details of the reset circuit of FIG. 31.

FIG. 32 shows the details of the reset circuit 38 shown in FIG. 31.

The reset circuit 38 has a NOR gate 38a for receiving the test control signal TES64Z and the disable signal DIS. The rest of the configuration is the same as that of the reset circuit 16 shown in FIG. 5. When the reset circuit 38 receives the disable signal DIS of high level, it fixes the timer set signal HTSZ to low level. The operation of the timer 40 is thus disabled.

Figure 33:
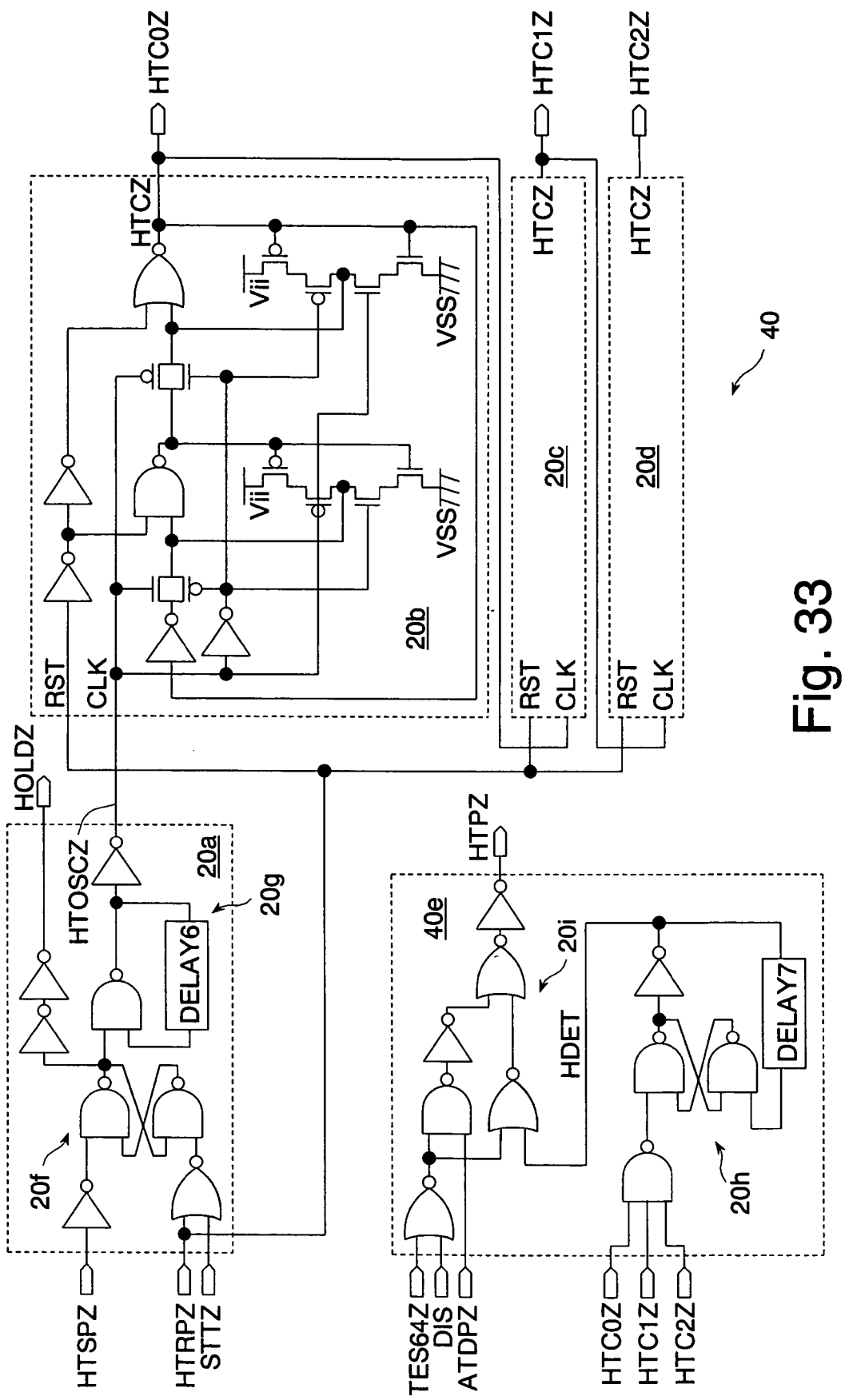
FIG. 33 is a circuit diagram showing the details of the timer of FIG. 31.

FIG. 33 shows the details of the timer 40 shown in FIG. 31.

The timer 40 has a hold output circuit 40e instead of the hold output circuit 20e of the first embodiment. The hold output circuit 40e has a NOR gate connected to the input of the NAND gate of the hold output circuit 20e that receives the test control signal TES64Z. The NOR gate receives the test control signal TES64Z and the disable signal DIS. The hold output circuit 40e functions as a start signal output circuit for outputting the hold end signal HTPZ (access request signal) forcefully during the period in which the disable signal DIS is at high level. The rest of the configuration is the same as that of the timer 20 (FIG. 6) of the first embodiment.

Figure 34:
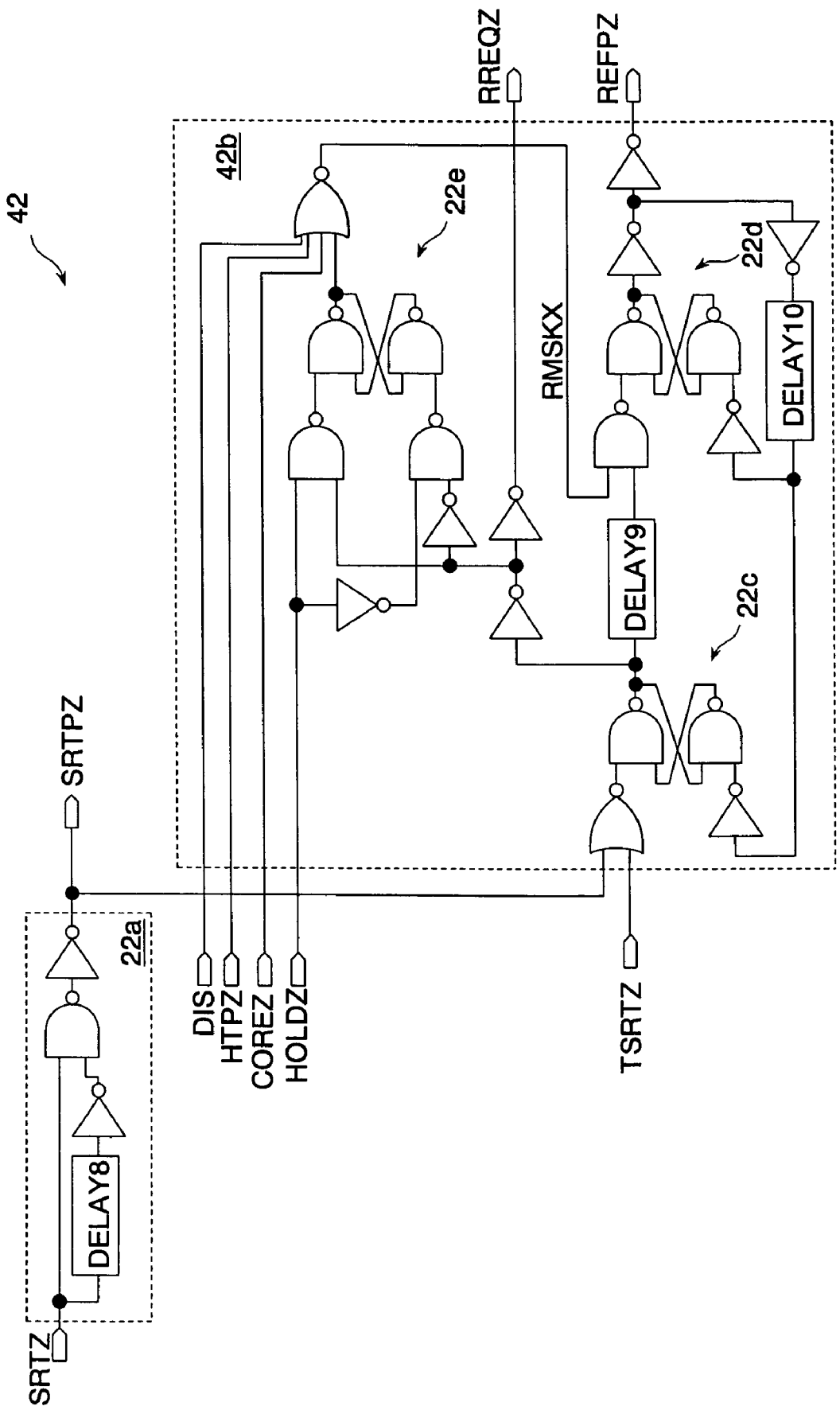
FIG. 34 is a circuit diagram showing the details of the refresh control circuit of FIG. 31.

FIG. 34 shows the details of the refresh control circuit 42 shown in FIG. 31.

The refresh control circuit 42 has a pulse generation circuit 42b instead of the pulse generation circuit 22a of the first embodiment. The pulse generation circuit 42b is a circuit obtained by replacing the three-input NOR gate of the pulse generation circuit 22a with a four-input NOR gate. The rest of the configuration is the same as that of the refresh control circuit 22 (FIG. 7) of the first embodiment.

The pulse generation circuit 42b functions as a refresh mask circuit for changing the mask signal RMSKX to low level in response to the disable signal DIS of high level, thereby disabling the output of the refresh start signal REFPZ.

Figure 35:
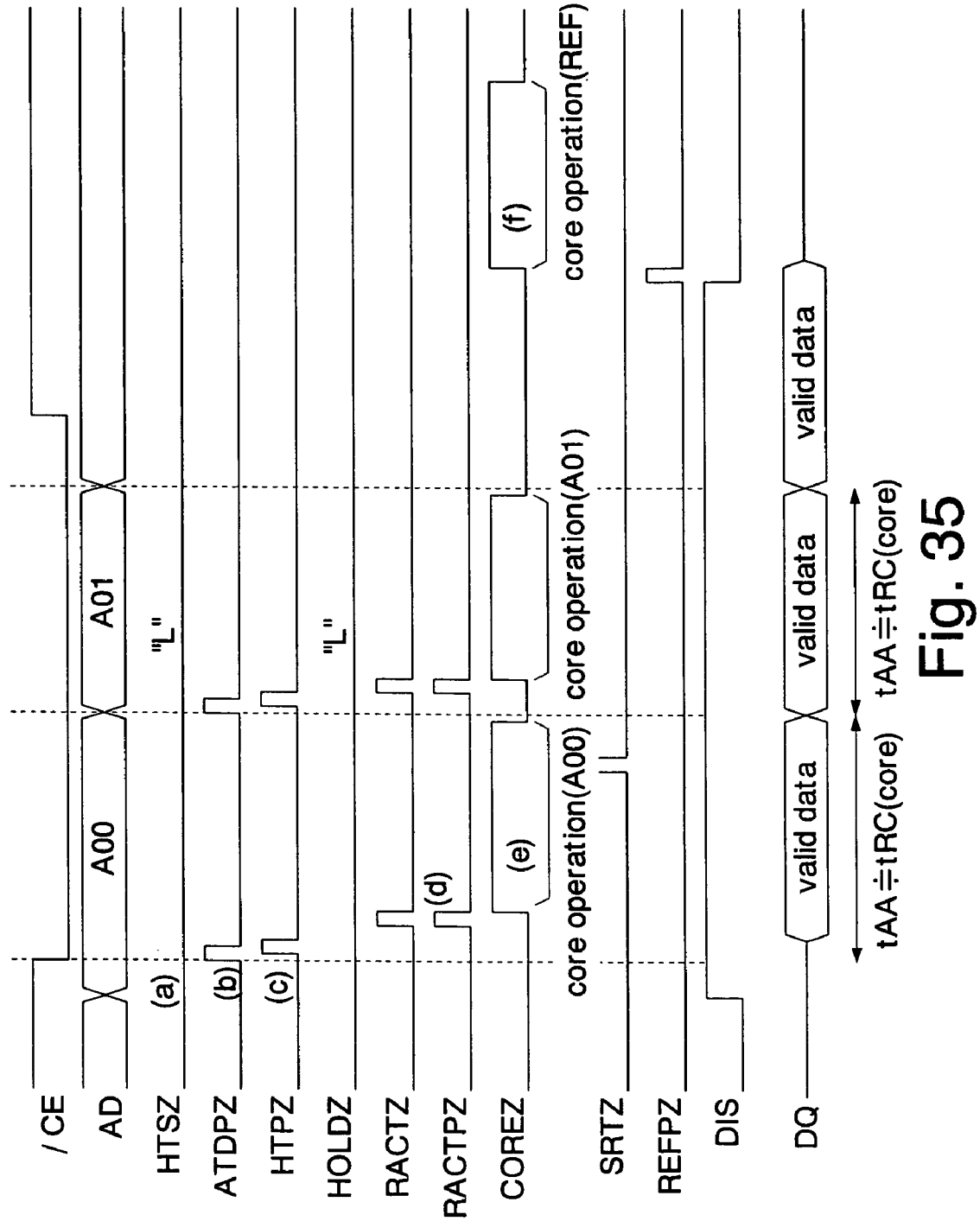
FIG. 35 is a timing chart showing an overview of the read operation in the second embodiment.

FIG. 35 shows an overview of the read operation in the second embodiment.

When the reset circuit 38 shown in FIG. 32 receives the disable signal DIS of high level through the disable terminal DIS, it starts the timer 40 and disables the output of the timer set signal HTSZ to operate (FIG. 35(a)). The timer 40 shown in FIG. 33 outputs the hold end signal HTPZ in response to the address transition signal ATDPZ (FIG. 35(b)). In response to the HTPZ signal, the read request signals RACTZ and RACTPZ are output in succession (FIG. 35(c)), and a read operation is performed (FIG. 35(e)).

Moreover, the refresh control circuit 42 shown in FIG. 34 disables the output of the refresh start signal REFPZ in response to the disable signal DIS of high level. Consequently, the self-refresh signal SRTZ that occurs during the high-level period of the disable signal DIS is held in the refresh control circuit 42 until the disable signal DIS changes to low level. As a result, the read operations will not be interrupted by any refresh operation, and the access time of the read operations (read operation time) becomes approximately equal to the operation time of the memory core 28. That is, the read operation time becomes about one third of the worst access time of the first embodiment.

After the output of the read data corresponding to the addresses A00 and A01, the disable signal DIS changes to low level and the refresh operation is performed (FIG. 35(f)).

This embodiment can provide the same effects as those of the first embodiment described above. Moreover, in this embodiment, the disable terminal DIS is supplied with the disable signal DIS so that the measurement of the hold time HOLD is disabled to perform a read operation immediately in response to the read access. It is therefore possible to reduce the read operation time, and reduce the cycle time, i.e., the worst access time.

Since the refresh operation corresponding to the refresh request which occurs at random is disabled when the disable signal DIS is supplied, the refresh operation time need not be included in the cycle time in this operation mode. This allows a further reduction of the read operation time and the cycle time.

Figure 36:
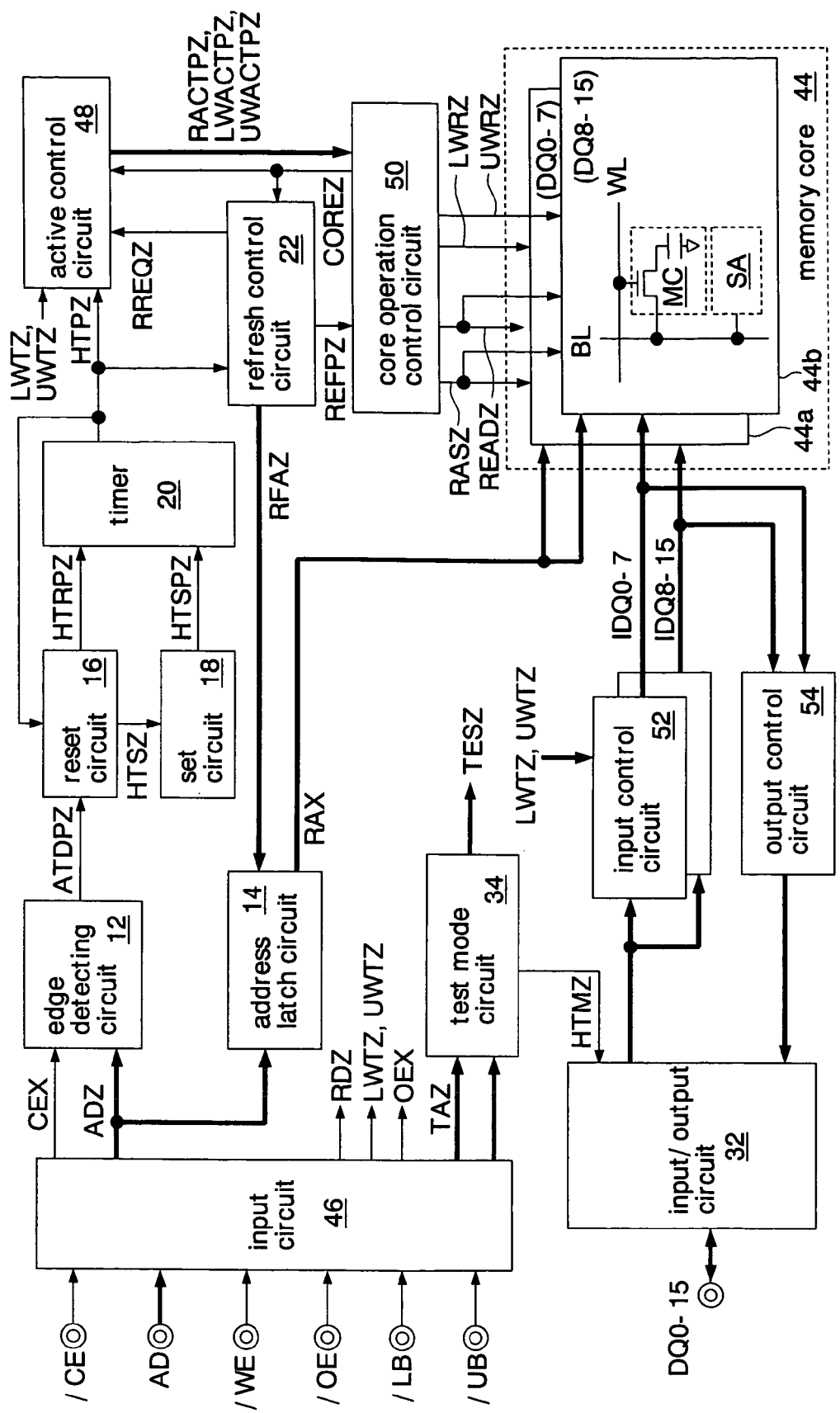
FIG. 36 is a block diagram showing a third embodiment of the semiconductor memory of the present invention.

FIG. 36 shows a third embodiment of the semiconductor memory of the present invention. The same circuits and signals as the circuits and signals described in the first embodiment will be designated by identical reference numbers or symbols. Detailed description thereof will be omitted.

The FCRAM of this embodiment has sixteen bits of data terminals DQ0–15, and a memory core 44 which is composed of a pair of first and second memory units 44a and 44b corresponding to the lower data terminals (first data terminals) DQ0–7 and the upper data terminals (second data terminals) DQ8–15, respectively. In a write operation, lower write data (first write data) DQ0–7 and upper write data (second write data) DQ8–15 are written to the first and second memory units 44a and 44b at independent timings, respectively. A read operation is almost the same as in the foregoing first embodiment. During the read operation, the first and second memory units 44a and 44b operate simultaneously and output sixteen bits of read data DQ0–7 and DQ8–15. The read data DQ0–7 is output to the external terminals in response to the activation of the /LB signal. The read data DQ8–15 is output to the external terminals in response to the activation of the /UB signal.

For the sake of operating the first and second memory units 44a and 44b independent of each other in a write operation, an input circuit 46, an active control circuit 48, a core operation control circuit 50, input control circuits 52 corresponding to the data terminals DQ0–7 and DQ8–15, respectively, and an output control circuit 54 are formed instead of the input circuit 10, the active control circuit 24, the core operation control circuit 26, and the input/output control circuit 30 of the first embodiment. The active control circuit 48 and the core operation control circuit 50 function as a write control circuit for controlling the write operation.

The input circuit 46 outputs write signals LWTZ and UWTZ in accordance with the /CE signal, the /WE signal, the /OE signal, the /LB signal (first write enable signal), and the /UB signal (second write enable signal). The /LB signal and the /UB signal are supplied through the /LB terminal (first write enable terminal) and the /UB terminal (second write enable terminal). Specifically, in a write operation, the LWTZ signal which indicates a request for the start of the write operation of the lower data signal DQ0–7 is output when the /LB signal is enabled. The UWTZ signal which indicates a request for the start of the write operation of the upper data signal DQ8–15 is output when the /UB signal is enabled.

The active control circuit 48 outputs a write start signal LWACTPZ upon receiving the write signal LWTZ, and outputs a write start signal UWACTPZ upon receiving the write signal UWTZ.

The core operation control circuit 50 outputs the core signal COREZ and the core operation signal RASZ when it receives the RACTPZ signal or the REFPZ signal, and when it receives at least either one of the LWACTPZ signal and the UWACTPZ signal. When the core operation control circuit 50 receives the RACTPZ signal, the LWACTPZ signal, and the UWACTPZ signal, it outputs the read signal READZ, a write signal (first write signal) LWRZ, and a write signal (second write signal) UWRZ to the memory core 44, respectively.

The memory units 44a and 44b each have almost the same structure as the internal structure of the memory core 28 of the first embodiment, and operate independent of each other. The memory unit 44a corresponding to the data terminals DQ0–7 starts a write operation in response to the LWRZ signal. The memory unit 44b corresponding to the data terminals DQ8–15 starts a write operation in response to the UWRZ signal. The rest of the operations of the memory core 44 are the same as in the first embodiment.

The input control circuits 52, in a write operation, transfer write data supplied from exterior through the input/output circuit 32 to the corresponding memory units 44a and 44b in synchronization with the LWTZ signal (first write signal) and the UWTZ signal (second write signal), respectively. The output control circuit 54, in a read operation, transfers read data from the memory core 44 to the input/output circuit 32.

Figure 37:
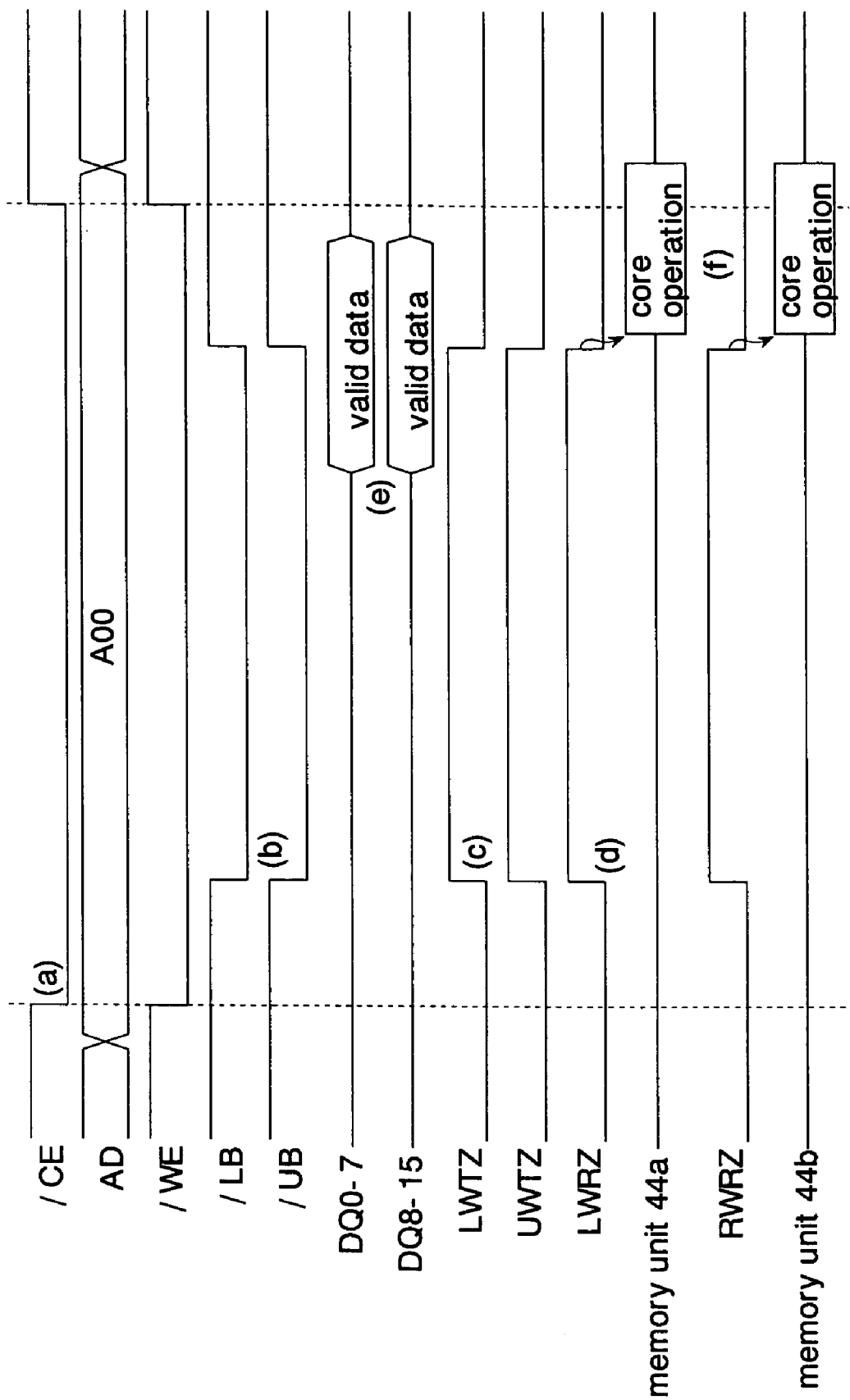
FIG. 37 is a timing chart showing an example of the write operation in the third embodiment.

FIG. 37 shows an example of the write operation in the third embodiment.

In this example, the /CE signal and the /WE signal change to the active level (low level) during the settlement of the address signal AD (A00) (FIG. 37(a)). The /LB signal and the /UB signal change to low level at the same timing during the active period of the /CE signal and the /WE signal (FIG. 37(b)). Here, the period in which the /CE signal, the /WE signal, and the /LB signal are active is the period for inputting the write command to the memory unit 44a. The period in which the /CE signal, the /WE signal, and the /UB signal are active is the period for inputting the write command to the memory unit 44b.

The input circuit 46 shown in FIG. 36 outputs the LWTZ signal and the UWTZ signal in synchronization with the /LB signal and the /UB signal (FIG. 37(c)). Subsequently, the LWACTPZ signal and the UWACTPZ signal are generated in synchronization with the LWTZ signal and the UWTZ signal (not shown). The core operation control circuit 50 outputs the LWRZ signal and the UWRZ signal to the memory units 44a and 44b in synchronization with the LWACTPZ signal and the UWACTPZ signal, respectively (FIG. 37(d)).

The data signals DQ0–7 and DQ8–15 (valid data) are supplied, with a predetermined setup time with respect to the rising edges of the /LB signal and the /UB signal (FIG. 37(e)). The memory units 44a and 44b start their write operations (core operations) in synchronization with the falling edges of the LWRZ signal and the UWRZ signal (FIG. 37(f)). That is, in this embodiment, the write operations are started in response to the ends of the write commands.

Figure 38:
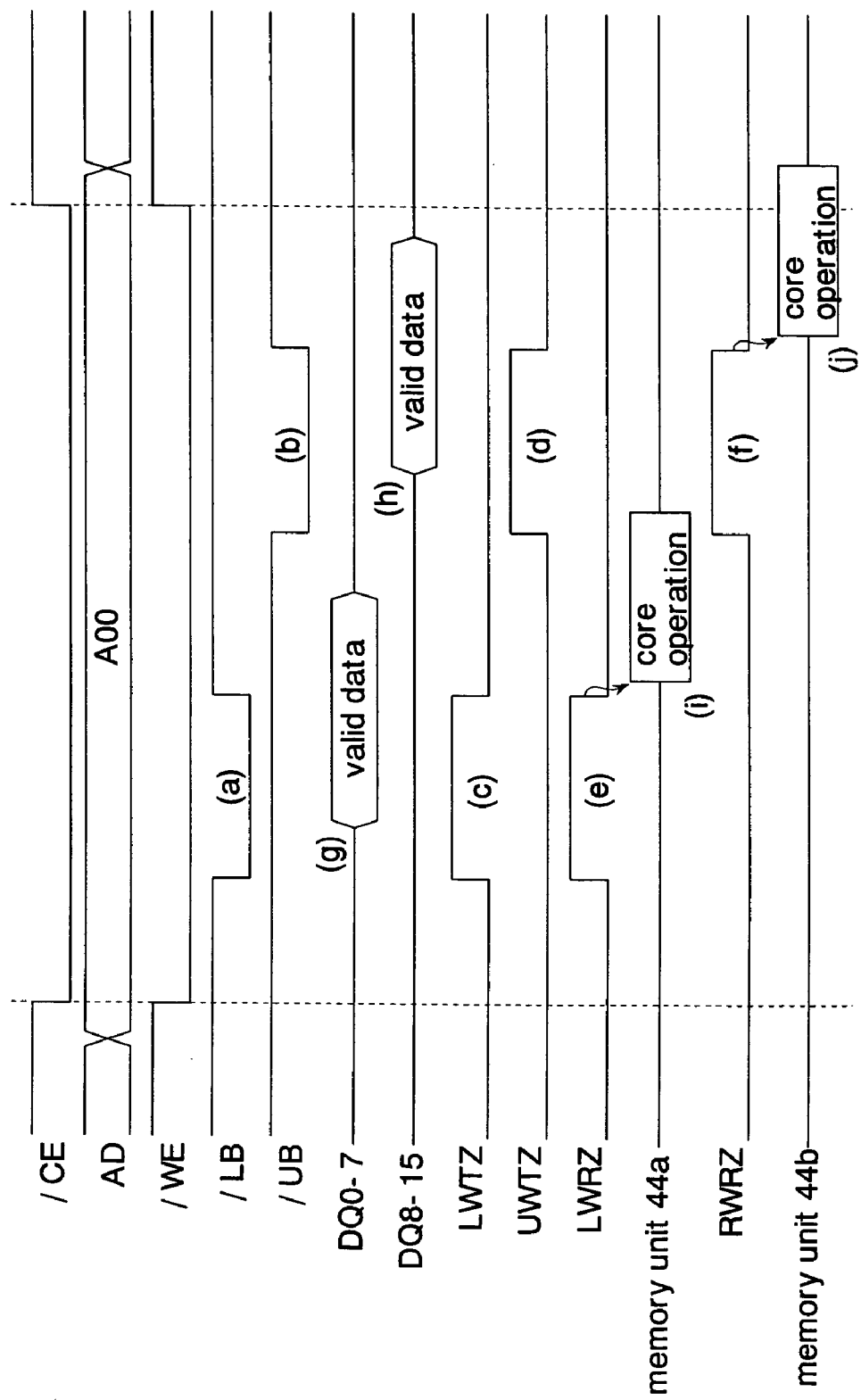
FIG. 38 is a timing chart showing another example of the write operation in the third embodiment.

FIG. 38 shows another example of the write operation in the third embodiment.

In this example, the active periods of the /LB signal and the /UB signal do not overlap with each other (FIG. 38(a, b)). The LWTZ signal and UWTZ signal, and the LWRZ signal and UWRZ signal, are activated in synchronization with the /LB signal and /UB signal, respectively (FIG. 38(c, d, e, f)). The data signals DQ0–7 and DQ8–15 are supplied in synchronization with the rising edges of the /LB signal and the /UB signal, respectively (FIG. 38(g, h)).

The memory units 44a and 44b operate independent of each other in response to the write commands (the falling edges of the LWRZ signal and the UWRZ signal), respectively (FIG. 38(i, j)). This eliminates the need for the mask control for preventing the data signal DQ8–15 from being written by mistake during the write operation of the data signal DQ0–7. It also eliminates the need for the mask control for preventing the data signal DQ0–7 from being written by mistake during the write operation of the data signal DQ8–15. Specifically, the column decoders for turning on the column switches for connecting predetermined bit lines to the data bus lines need not include the logic of the write data mask. Otherwise, the write amplifiers for amplifying the signal quantities of the write data on the data bus lines need not include the logic of the write data mask. Since the circuit for the mask control becomes unnecessary, it is possible to reduce the circuit scale of the FCRAM. Moreover, since the time for the mask control becomes unnecessary, it is possible to improve the timing margin. As a result, it is possible to reduce the write operation time (write cycle time).

Figure 39:
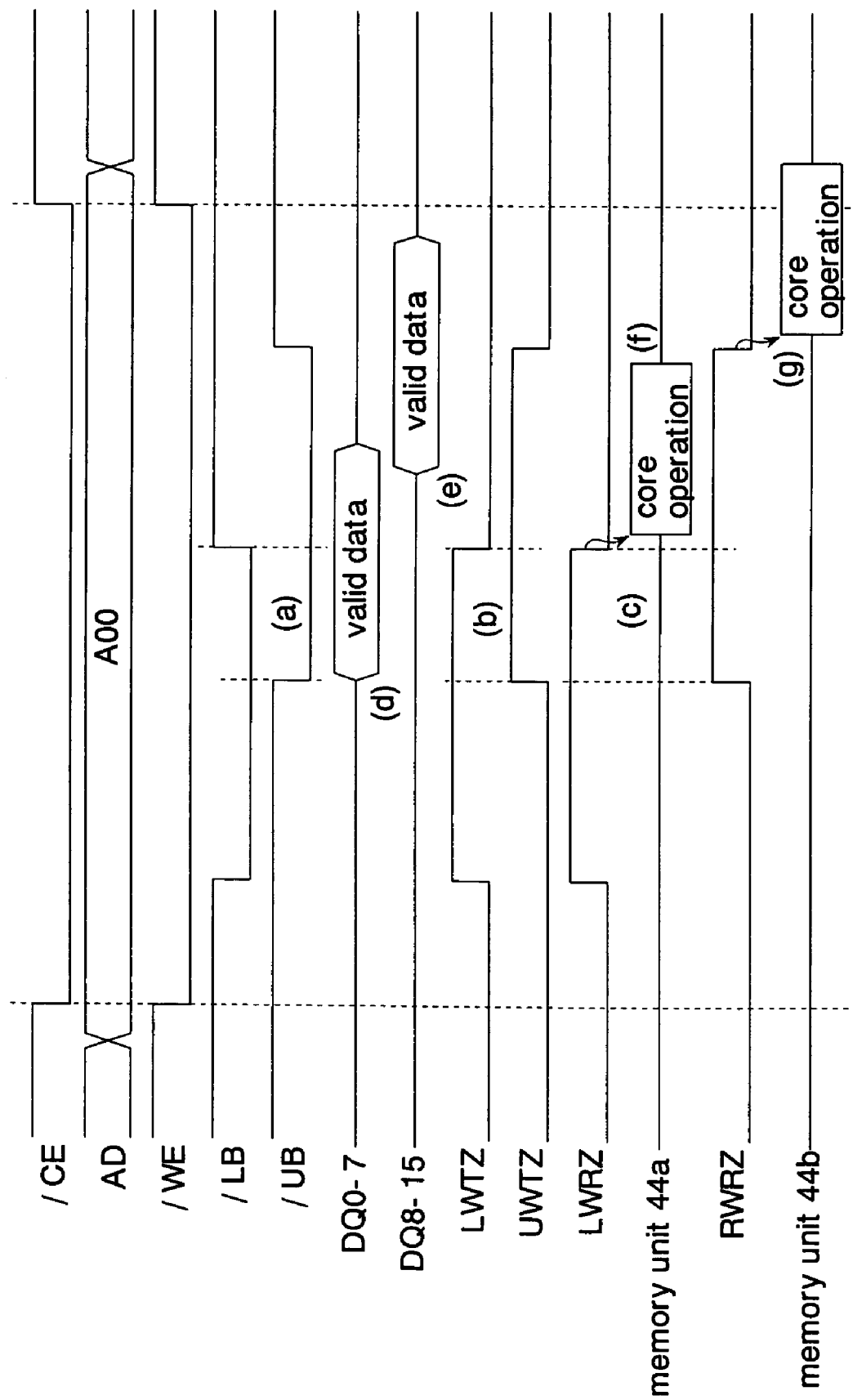
FIG. 39 is a timing chart showing another example of the write operation in the third embodiment.

FIG. 39 shows another example of the write operation in the third embodiment.

In this example, the active periods of the /LB signal and the /UB signal partly overlap with each other (FIG. 39(a)). Thus, the LWTZ signal and UWTZ signal, and the LWRZ signal and UWRZ signal, also overlap with each other (FIG. 39(b, c)). The data signals DQ0–7 and DQ8–15 are supplied in synchronization with the rising edges of the /LB signal and the /UB signal, respectively (FIG. 39(d, e)).

As in FIGS. 37 and 38 seen above, the memory units 44a and 44b operate independent of each other in response to the write commands (the falling edges of the LWRZ signal and the UWRZ signal), respectively (FIG. 39(f, g)). Consequently, even if the active periods of the /LB signal and the /UB signal partly overlap with each other, the data can be written to the memory core 44 through the same operations as in FIGS. 37 and 38. On the contrary, in a conventional memory core, the write operation is performed according to the OR logic of the active periods (write commands) of the /LB signal and the /UB signal. The write operation of the memory core is started in synchronization with a signal of slower inactive timing between the /LB signal and the /UB signal. This has required a control circuit for determining the start of the write operation.

As above, this embodiment can provide the same effects as those of the first embodiment described above. Besides, in this embodiment, the write control circuits such as the write amplifiers need not include the logic for masking the write of one byte data during the write of the other byte data. Since the circuit for masking the write data becomes unnecessary, it is possible to reduce the circuit scale of the FCRAM and improve the timing margin of the circuits that operate during write operations. As a result, it is possible to reduce the write operation time (write cycle time).

Even when the active periods of the /LB signal and the /UB signal overlap in part, the memory units 44a and 44b can be operated independently in response to the /LB signal and the /UB signal. This eliminates the need for the control circuit for determining the start of the write operation of the memory core 44. As a result, the circuit scale of the FCRAM can be reduced further, and the write operation time can be reduced further.

Figure 40:
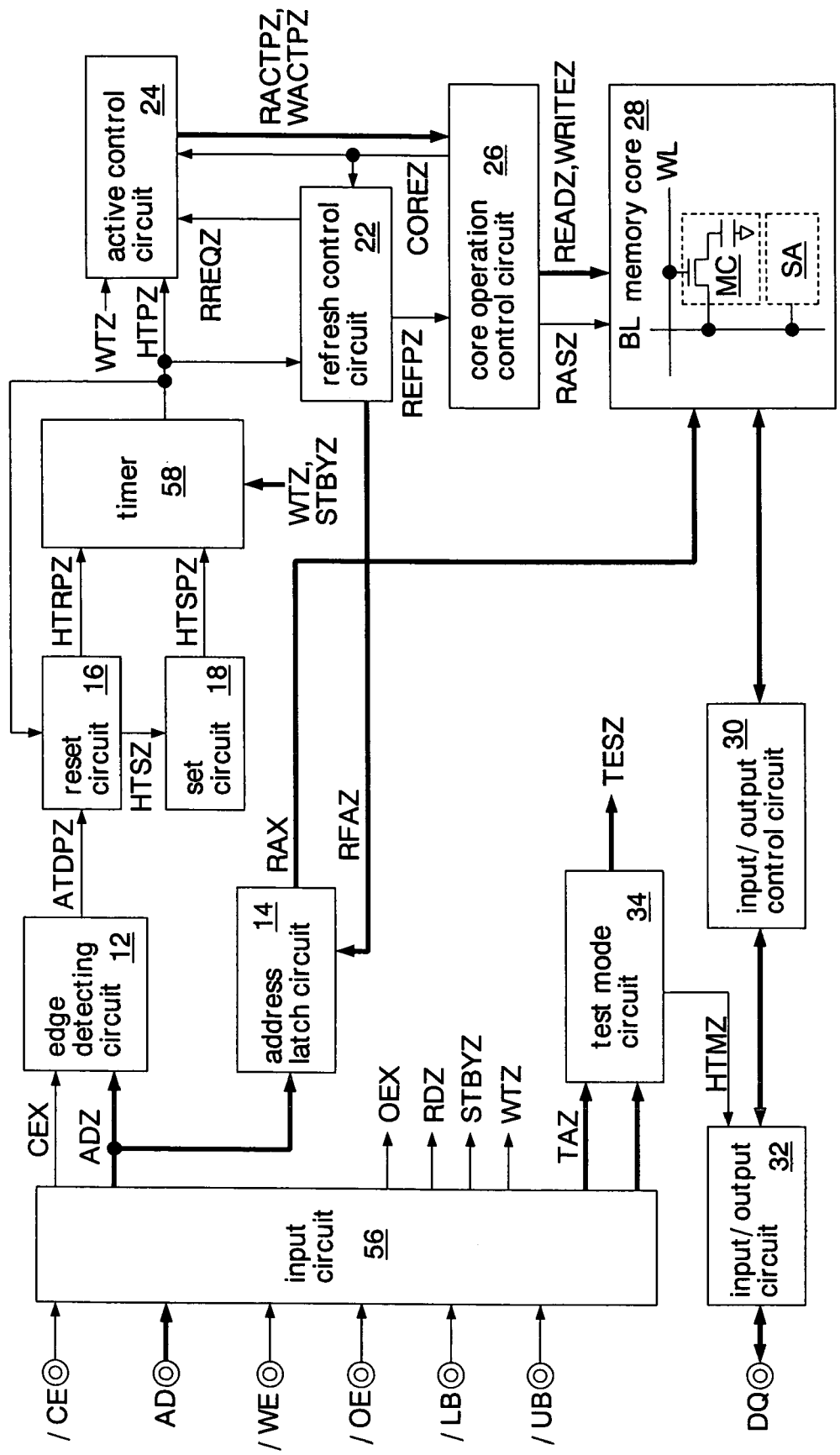
FIG. 40 is a block diagram showing a fourth embodiment of the semiconductor memory of the present invention.

FIG. 40 shows a fourth embodiment of the semiconductor memory of the present invention. The same circuits and signals as the circuits and signals described in the first embodiment will be designated by identical reference numbers or symbols. Detailed description thereof will be omitted.

The FCRAM of this embodiment has an input circuit 56 and a timer 58 instead of the input circuit 10 and the timer 20 of the first embodiment. The rest of the configuration is almost the same as in the first embodiment. The FCRAM starts a read operation the hold time HOLD after the read command is supplied. The FCRAM starts a write operation after the supply of the write command is completed.

The input circuit 56 outputs a standby signal STBYZ of high level while the /CE signal is inactive (high level). The standby signal STBYZ is a signal having the same phase as that of the /CE signal. The internal circuits of the FCRAM recognize the standby signal STBYZ as a standby command. The standby command is a command for bringing the FCRAM into a standby state (non-operation state). In the standby state, only the refresh requests occurring inside the FCRAM are accepted to perform refresh operations.

The rest of the configuration of the input circuit 56 is the same as that of the input circuit 10. Specifically, when the input circuit 56 receives the /CE signal of low level and the /WE signal of high level, it recognizes that a read command is supplied, and changes the read signal RDZ to an active level (high level). When the input circuit 56 receives the /CE signal of low level and the /WE signal of low level, it recognizes that a write command is supplied, and changes the write signal WRZ to an active level (high level). Incidentally, the chip enable signal may have two bits (a /CE1 signal of negative logic and a CE2 signal of positive logic), not a single bit (/CE).

When the timer 58 receives the standby signal STBYZ of high level or the write signal WTZ of high level during operation, it stops operating and is initialized. The rest of the operations of the timer 58 are the same as those of the timer 20 of the first embodiment.

Figure 41:
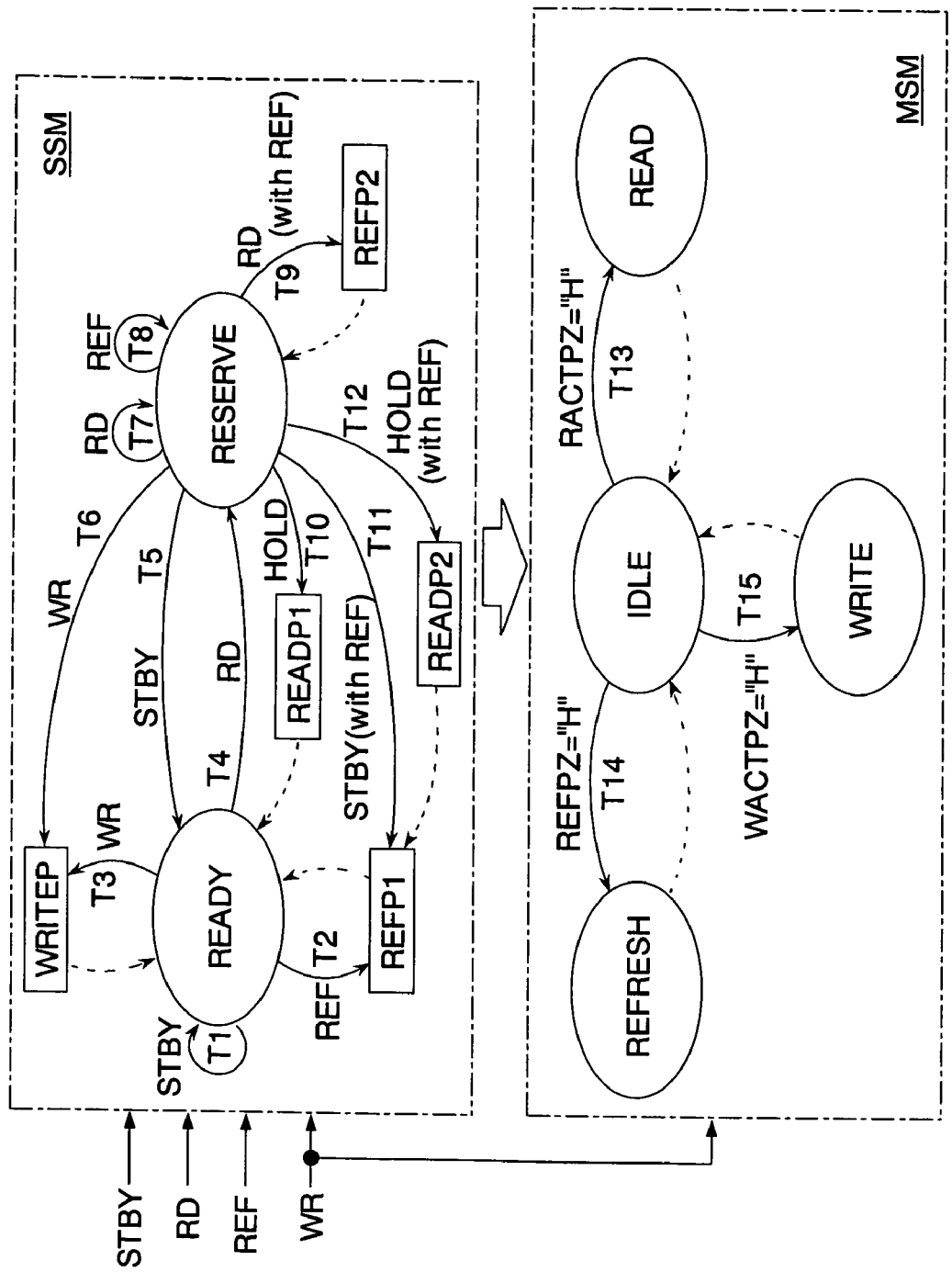
FIG. 41 is a state transition diagram of the FCRAM in the fourth embodiment.

FIG. 41 shows a state transition diagram of the FCRAM in the fourth embodiment. In the diagram, the full-lined arrows show state transitions according to external triggers such as a command. The broken-lined arrows show that the states change automatically irrespective of the external triggers.

For the sake of controlling the operation of the memory core 28, the FCRAM has a main state machine MSM and a sub state machine SSM.

The main state machine MSM has an idle state IDLE, a read state READ, a refresh state REFRESH, and a write state WRITE. These four states show the states of the memory core 28, and are exclusive of each other. Thus, two or more of the states will not be taken at the same time. The idle state IDLE is a state in which no command is supplied to the FCRAM, i.e., the basic state. The state transitions of the main state machine MSM correspond to the operations of part of the refresh control circuit 22 (the circuit for generating the REFPZ signal), the active control circuit 24, the core operation control circuit 26, and the memory core 28 shown in FIG. 40.

The main state machine MSM has the function of making the memory core 28 perform a read operation, a refresh operation, or a write operation in accordance with the state of the sub state machine SSM. Thus, the function of the main state machine MSM also exists in conventional FCRAMs.

The sub state machine SSM has the function of enabling the state transitions of the main state machine MSM according to operation commands. The sub state machine SSM makes state transitions independent of the main state machine MSM, in response to a standby command STBY, a read command RD, a write command WR, and a refresh command REF that is generated internally.

The sub state machine SSM has a ready state READY and a reserve state RESERVE. The ready state READY is a state in which no command is supplied to the FCRAM (standby state), i.e., the basic state. Refresh permissions REFP1 and REFP2, read permissions READP1 and READP2, and a write permission WRITEP shown boxed represent the permissions of refresh operations, read operations, and a write operation for the main state machine MSM, respectively. The state transitions of the sub state machine SSM correspond to the operations of the edge detecting circuit 12, the reset circuit 16, the set circuit 18, the timer 58, and the other part of the refresh control circuit 22 (the circuits excluding the circuit for generating the REFPZ signal) shown in FIG. 40. The function of the sub state machine SSM is a new function, not existing in conventional FCRAMs.

Hereinafter, description will be given of the operation of the sub state machine SSM. Incidentally, the read command RD, the write command WR, and the standby command STBY show the activation periods of the read signal RDZ, the write signal WTZ, and the standby signal STBYZ which are output from the input circuit 56 shown in FIG. 40. The refresh command REF corresponds to the self-refresh signal SRTZ which is periodically generated by the self-refresh timer in the refresh control circuit 22.

When the standby command STBY is supplied in the ready state READY, the state changes to the ready state READY again (transition T1). When the refresh command REF is supplied in the ready state READY, the sub state machine SSM issues the refresh permission REFP1 and changes to the ready state READY again (transition T2). When the write command WR is supplied in the ready state READY, the sub state machine SSM issues the write permission WRITEP and changes to the ready state READY again (transition T3). When the read command RD is supplied in the ready state READY, the state changes to the reserve state RESERVE (transition T4). The transition to the reserve RESERVE state starts the timer 20, and the hold time HOLD is measured.

When the standby command STBY is supplied in the reserve state RESERVE, the operation of the timer 28 is stopped, and the state changes to the ready state READY (transition T5). When the write command WR is supplied in the reserve state RESERVE, the operation of the timer 28 is stopped. The sub state machine SSM issues the write permission WRITEP and changes to the ready state READY (transition T6). When the read command RD is supplied in the reserve state RESERVE where the refresh command REF is not held, the timer 58 is restarted and the state changes to the reserve state RESERVE again (transition T7).

When the refresh command REF is supplied in the reserve state RESERVE, the state changes to the reserve state RESERVE again (transition T8). Here, the refresh hold circuit 22c of the refresh control circuit 22 (FIG. 7 in the first embodiment) holds the refresh command REF. When the read command RD is supplied in the reserve state RESERVE where the refresh command REF is held, the timer 58 is restarted, and the sub state machine SSM issues the refresh permission REFP2 and changes to the reserve state RESERVE again (transition T9).

When the measurement of the hold time HOLD by the timer 58 is completed in the reserve state RESERVE where the refresh command REF is not held, the sub state machine SSM issues the read permission READP1 and changes to the ready state READY (transition T10). When the standby command STBY is supplied in the reserve state RESERVE where the refresh command REF is held, the operation of the timer 28 is stopped. The sub state machine SSM issues the refresh permission REFP1, and the state changes to the ready state READY (transition T11). When the measurement of the hold time HOLD by the timer 58 is completed in the reserve state RESERVE where the refresh command REF is held, the sub state machine SSM issues the read permission READP2 and the refresh permission REFP1 in succession, and changes to the reserve state RESERVE again (transition T12).

As above, the sub state machine SSM makes state transitions and issues the read permissions READP1 and READP2, the refresh permissions REFP1 and REFP2, and the write permission WRITEP to the main state machine MSM in accordance with the standby command STBY, the read command RD, the refresh command REF, and the write command WR. The sub state machine SSM chiefly manages the control on the start of the read operation (the measurement of the hold time HOLD) and the control on the conflict between the read operation and the refresh operation, which are the characteristics of the present invention. Since the functions to be added newly are integrated into a single state machine, it is possible to make circuit design while concentrating consideration on the circuits to be added newly. This facilitates the circuit design as compared to the cases of designing with consideration given to all the circuits including the circuits designed previously.

Next, description will be given of the operation of the main state machine MSM.

When the main state machine MSM detects the read permission READP1 or READP2 in the idle state IDLE, it changes to the read state READ (transition T13). Due to the transition to the read state READ, the active control circuit 24 shown in FIG. 40 outputs the RACTPZ signal and the memory core 28 performs a read operation. After the execution of the read operation, the state shifts to the idle state IDLE again.

When the main state machine MSM detects the refresh permission REFP1 or REFP2 in the idle state IDLE, it changes to the refresh state REFRESH (transition T14). Due to the transition to the refresh state REFRESH, the refresh control circuit 22 outputs the REFPZ signal and the memory core 28 performs a refresh operation. After the execution of the refresh operation, the state shifts to the idle state IDLE again.

When the main state machine MSM detects the write permission WRITEP in the idle state IDLE, it changes to the write state WRITE (transition T15). Due to the transition to the write state WRITE, the active control circuit 24 outputs the WACTPZ signal and the memory core 28 performs a write operation. After the execution of the write operation, the state shifts to the idle state IDLE again.

Thus, when the main state machine MSM detects the read permissions READP1, READP2, the refresh permissions REFP1, REFP2, and the write permission WRITEP which are issued by the sub state machine SSM, it has only to make the memory core 28 operate in the same way as heretofore, performing the read operation, the refresh operation, and the write operation. Consequently, most of the circuits corresponding to the main state machine MSM may use conventional circuits. As a result, the design efficiency of the FCRAM improves.

Figure 42:
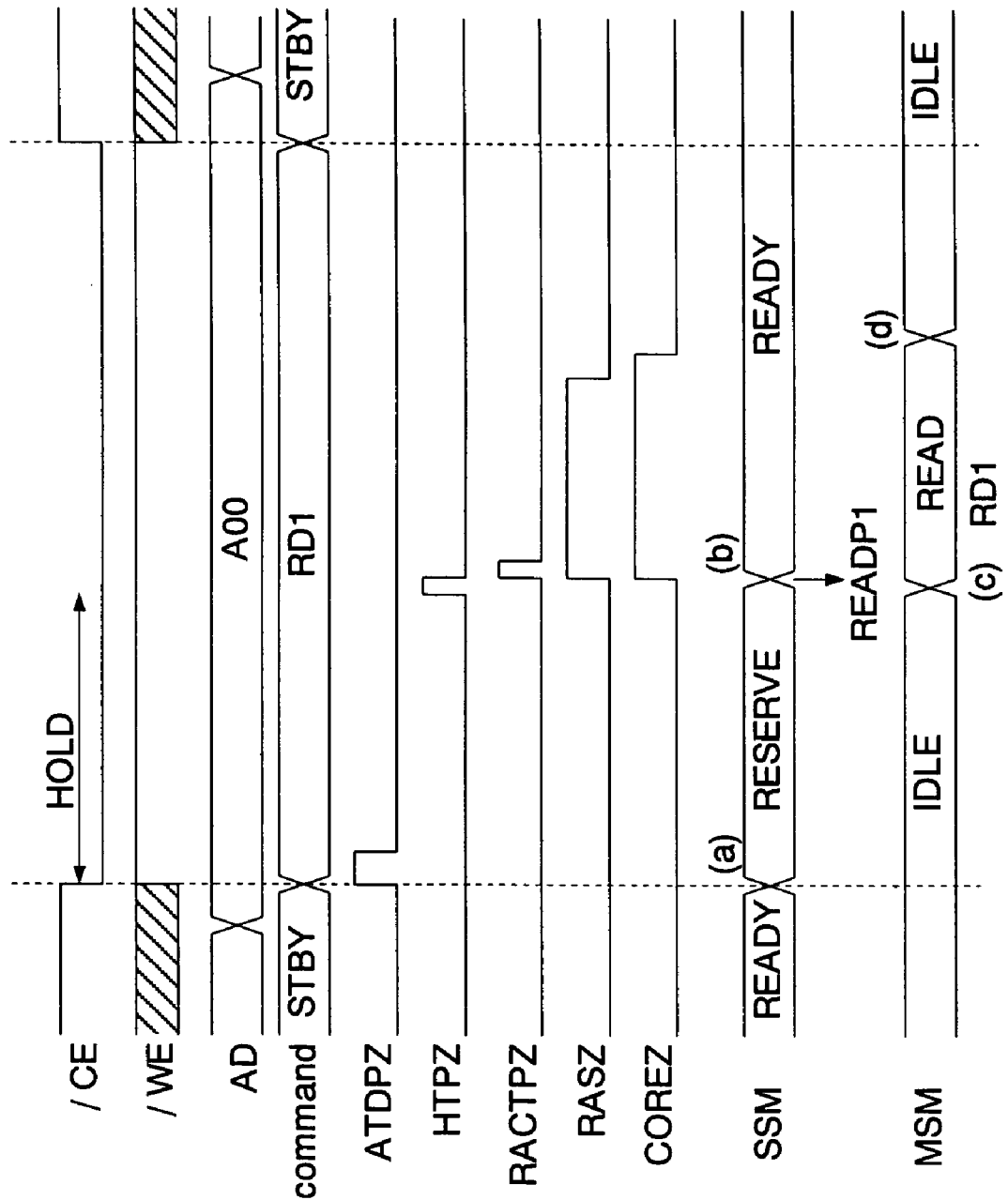
FIG. 42 is a timing chart showing an operation of the memory core in the read operation.

FIG. 42 shows an operation of the FCRAM when the read command RD is supplied. In this example, the operation is almost the same as in FIG. 16 of the foregoing first embodiment. Detailed description will thus be omitted of the same operation as in FIG. 16.

The sub state machine SSM changes from the ready state READY to the reserve state RESERVE in response to a read command RD1 (FIG. 42(a)). The sub state machine SSM generates the read permission READP1 after the hold time HOLD has elapsed, and returns to the ready state READY (FIG. 42(b)). The main state machine MSM receives the read permission READP1 in the idle state IDLE, changes to the read state READ, and performs a read operation (FIG. 42(c)). After the read operation, the main state machine MSM returns to the idle state IDLE (FIG. 42(d)). In this way, the FCRAM waits for a lapse of the hold time HOLD since the transition to the reserve state RESERVE, and then starts the read operation. As in the first embodiment, it is therefore possible to set the timing specification of the FCRAM having DRAM memory cells MC the same as that of the SRAM.

Figure 43:
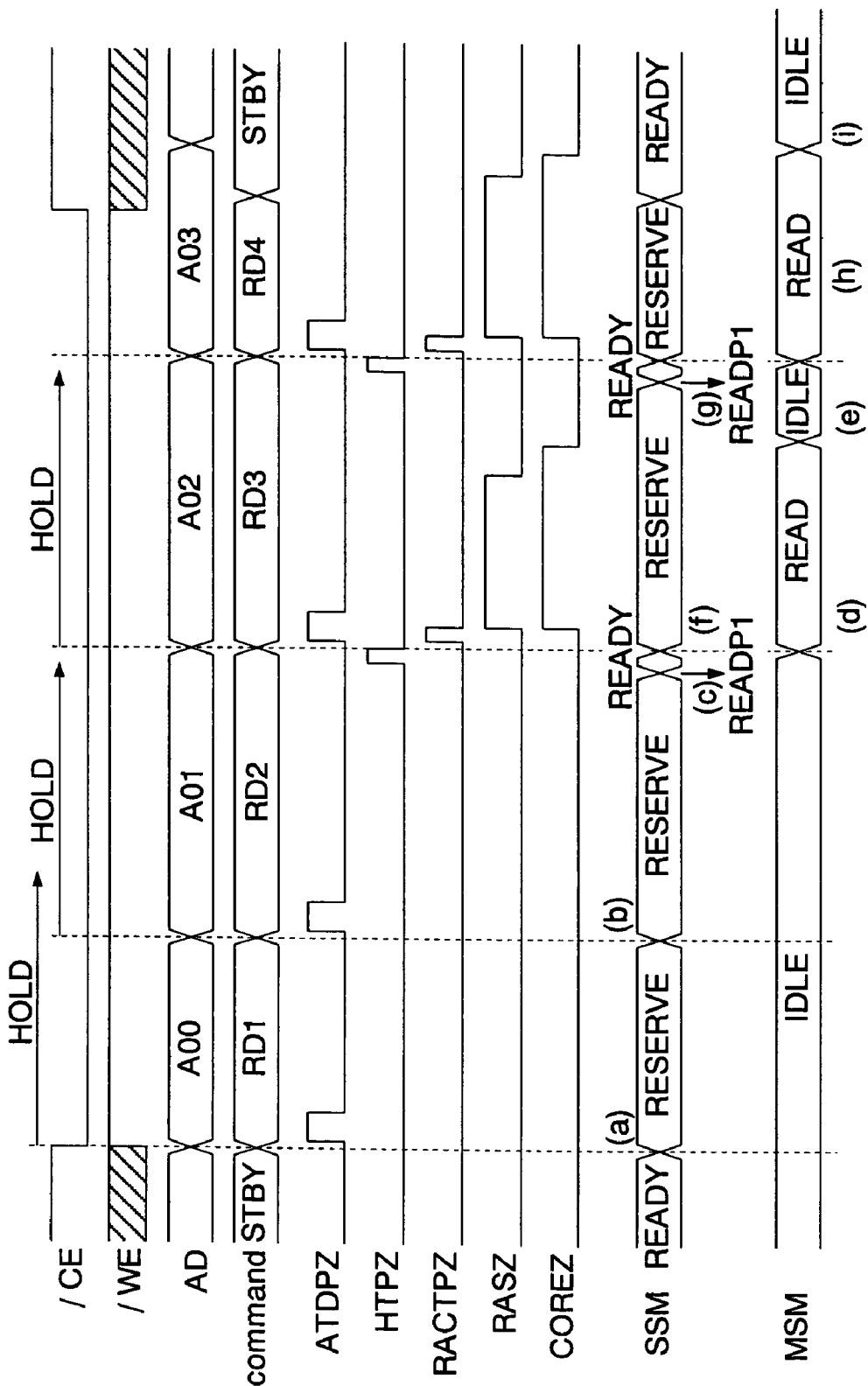
FIG. 43 is a timing chart showing an operation of the FCRAM in the case where the read commands are sequentially supplied.

FIG. 43 shows an operation of the FCRAM when read commands RD are supplied in succession. In this example, the operation is almost the same as in FIG. 15 of the foregoing first embodiment. Detailed description will thus be omitted of the same operation as in FIG. 15.

The sub state machine SSM changes from the ready state READY to the reserve state RESERVE in response to the first read command RD1 (FIG. 43(a)). The new read command RD2 is supplied in the reserve state RESERVE, and the sub state machine SSM resets the reserve state RESERVE in transition and changes to the new reserve state RESERVE (FIG. 43(b)). This can prevent the memory core from malfunctioning when the read commands RD are supplied at intervals shorter than the hold time HOLD.

The sub state machine SSM generates the read permission READP1 after the hold time HOLD corresponding to the read command RD2 has elapsed, and returns to the ready state READY (FIG. 43(c)). The main state machine MSM receives the read permission READP1 in the idle state IDLE, changes to the read state READ, and performs a read operation (FIG. 43(d)). After the execution of the read operation, the main state machine MSM returns to the idle state IDLE (FIG. 43(e)).

The read command RD3 is supplied in succession to the read command RD2, and the sub state machine SSM changes to the reserve state RESERVE again (FIG. 43(f)). The sub state machine SSM generates the read permission READP1 after the hold time HOLD corresponding to the read command RD3 has elapsed, and returns to the ready state READY (FIG. 43(g)). Subsequently, the main state machine MSM changes to the read state READ and performs a read operation (FIG. 43(h)). After the execution of the read operation, the main state machine MSM returns to the idle state IDLE (FIG. 43(i)).

Figure 44:
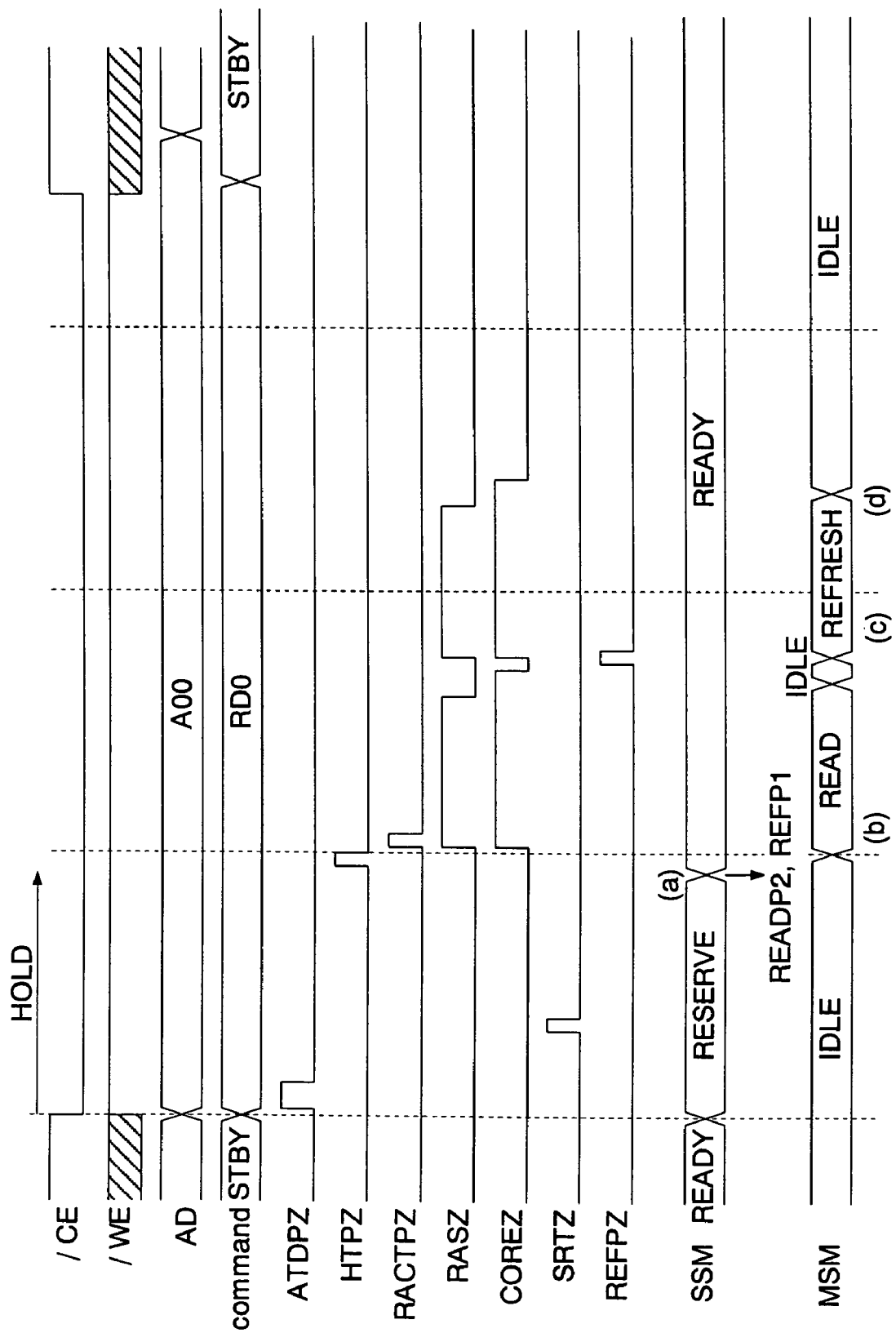
FIG. 44 is a timing chart showing an operation of the FCRAM in the case where the refresh command occurs in the reserve state.

FIG. 44 shows an operation of the FCRAM when the refresh command REF occurs in the reserve state RESERVE. In this example, the operation is almost the same as in FIG. 21 of the foregoing first embodiment. Detailed description will thus be omitted of the same operation as in FIG. 21.

The sub state machine SSM receives the refresh command (SRTZ) in the reserve state RESERVE, and generates the read permission READP2 and the refresh permission REFP1 after the hold time HOLD corresponding to the read command RD2 has elapsed (FIG. 44(a)). The main state machine MSM receives the read permission READP2 in the idle state IDLE, changes to the read state READ, and performs a read operation (FIG. 44(b)). As above, when the refresh command REF is supplied in the reserve state RESERVE and the hold time HOLD elapses, the read operation can be performed with priority over the refresh operation. As a result, it is possible to reduce the time from the supply of the read command RD to the output of the read data (read access time).

After the execution of the read operation, the main state machine MSM returns to the idle state IDLE, and changes to the refresh state REFRESH so as to perform a refresh operation immediately (FIG. 44(c)). After the execution of the refresh operation, the main state machine MSM returns to the idle state IDLE (FIG. 44(d)).

Figure 45:
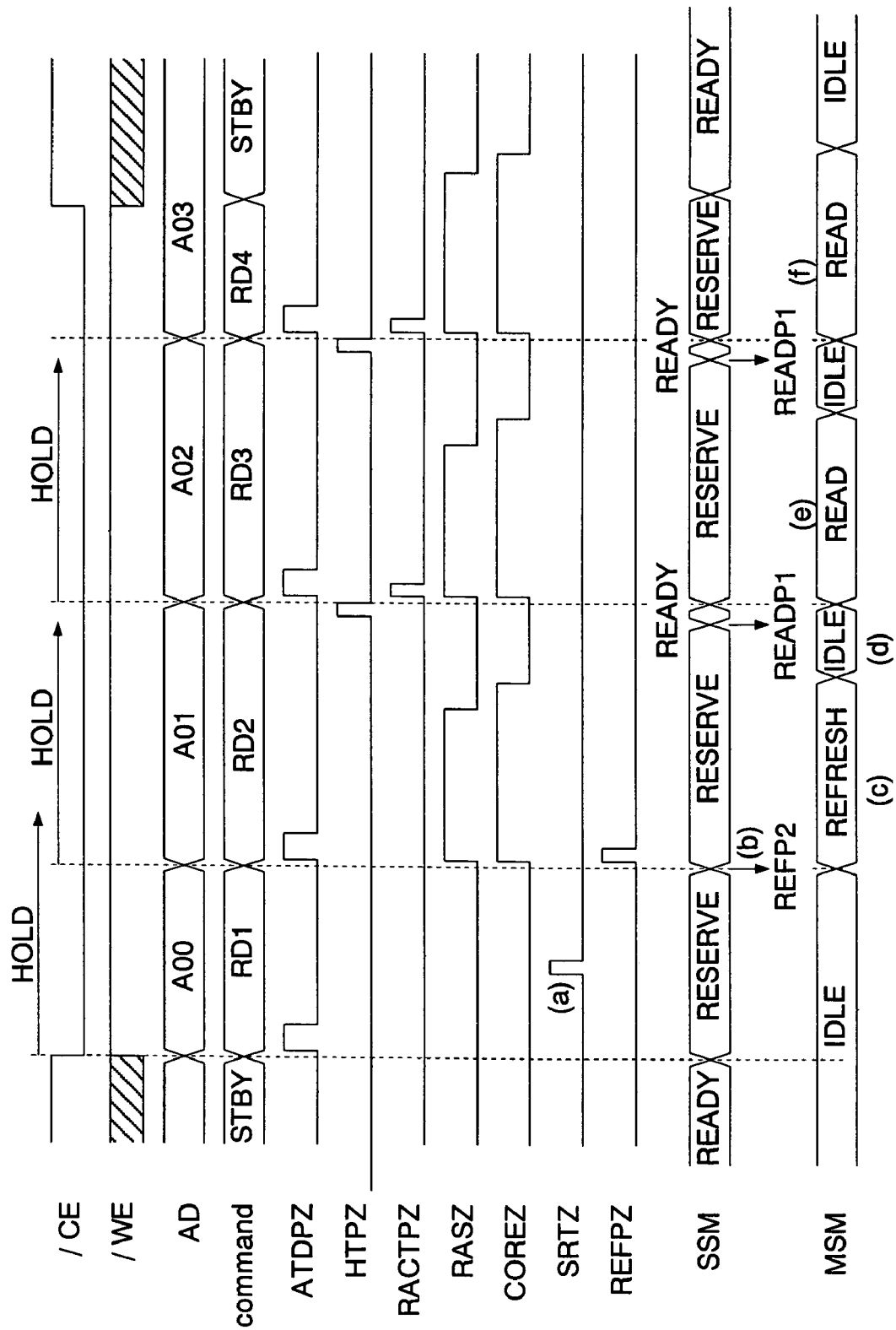
FIG. 45 is a timing chart showing an operation of the FCRAM in the case where the refresh command occurs in the reserve state.

FIG. 45 shows an operation of the FCRAM when the refresh command REF occurs in the reserve state RESERVE. In this example, the operation is almost the same as in FIG. 19 of the foregoing first embodiment. Detailed description will thus be omitted of the same operation as in FIG. 19.

The sub state machine SSM receives the refresh command (SRTZ) in the reserve state RESERVE (FIG. 45(a)). In this example, the new read command RD0 is supplied in the reserve state RESERVE. The sub state machine SSM generates the refresh permission REFP2, resets the reserve state RESERVE in transition, and changes to the new reserve state RESERVE (FIG. 45(b)). The main state machine MSM receives the refresh permission REFP2 in the idle state IDLE, and changes to the refresh state REFRESH in order to perform a refresh operation (FIG. 45(c)).

When the refresh command REF and the new read command RD are supplied successively in the reserve state RESERVE, priority can be given to the refresh operation in the new reserve state RESERVE. It is therefore possible to hide the refresh cycle from the system on which the FCRAM is mounted.

After the execution of the refresh operation, the main state machine MSM returns to the idle state IDLE (FIG. 45(d)). Subsequently, as in FIG. 43 seen above, the read commands RD2 and RD3 that satisfy the hold time HOLD are supplied in succession, and the read operations are performed in succession (FIG. 45(e, f)).

Figure 46:
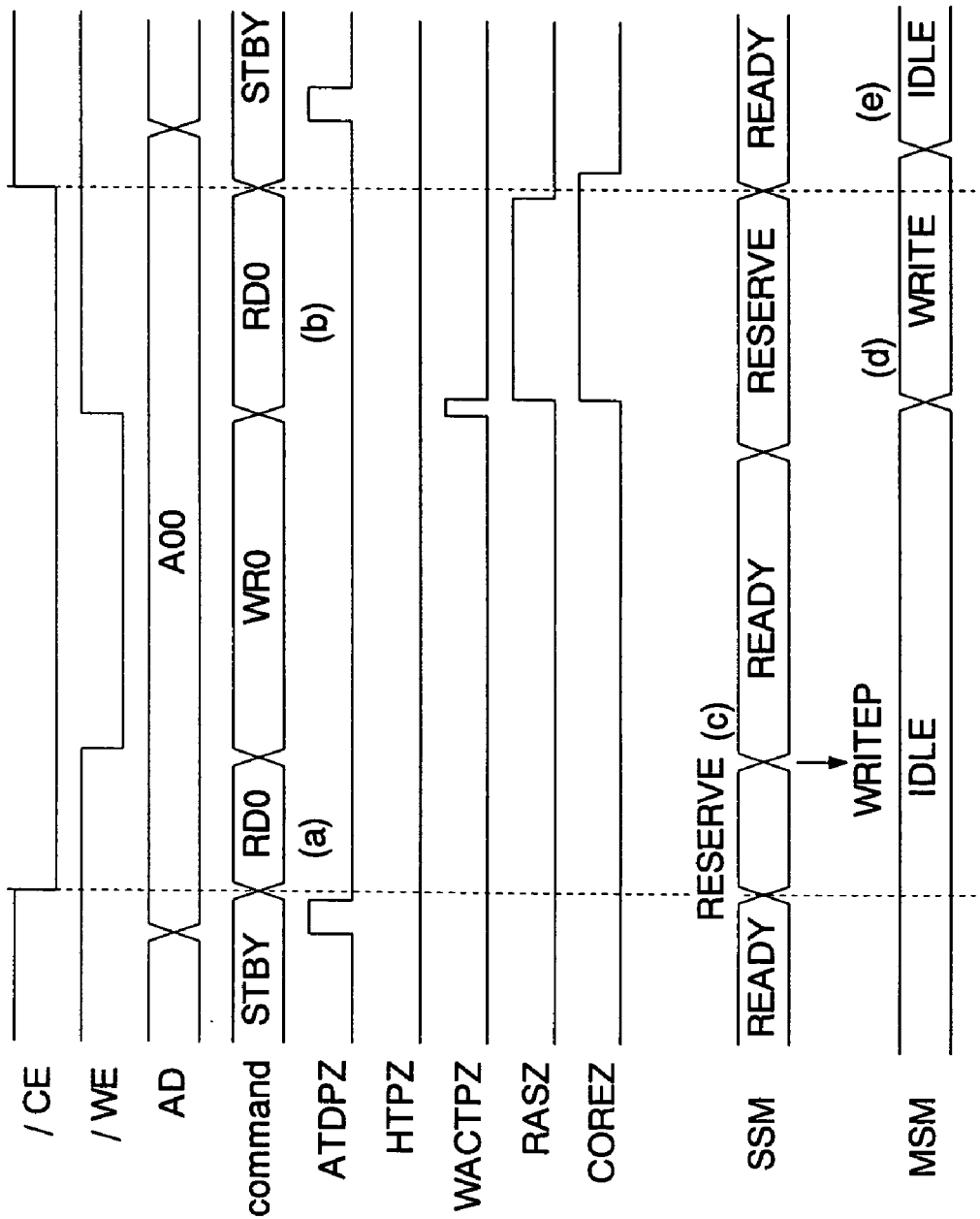
FIG. 46 is a timing chart showing an operation of the FCRAM in the case where the write command is supplied in the reserve state.

FIG. 46 shows an operation of the FCRAM when the write command WR is supplied in the reserve state RESERVE. In this example, the operation is almost the same as in FIG. 17 of the foregoing first embodiment. Detailed description will thus be omitted of the same operation as in FIG. 17.

This example shows the basics of the write operation. Note that the activation period of the /CE signal is longer than the activation period of the /WE signal. Then, the FCRAM receives the high level of the /CE signal and the high level of the /WE signal, and recognizes that read commands RD0 are supplied (FIG. 46(a, b)). Since neither of the supply periods of these read commands RD0 satisfies the hold period HOLD, no read operation will be started.

The sub state machine SSM receives the write command WR0 in the reserve state RESERVE corresponding to the first read command RD0, generates the write permission WRITEP, and then changes to the ready state READY (FIG. 46(c)). In response to the end of the write command WR0 which is received in the idle state IDLE, the main state machine MSM changes to the write state WRITE in order to start a write operation (FIG. 46(d)). After the completion of the write operation, the main state machine MSM returns to the idle state IDLE (FIG. 46(e)).

Figure 47:
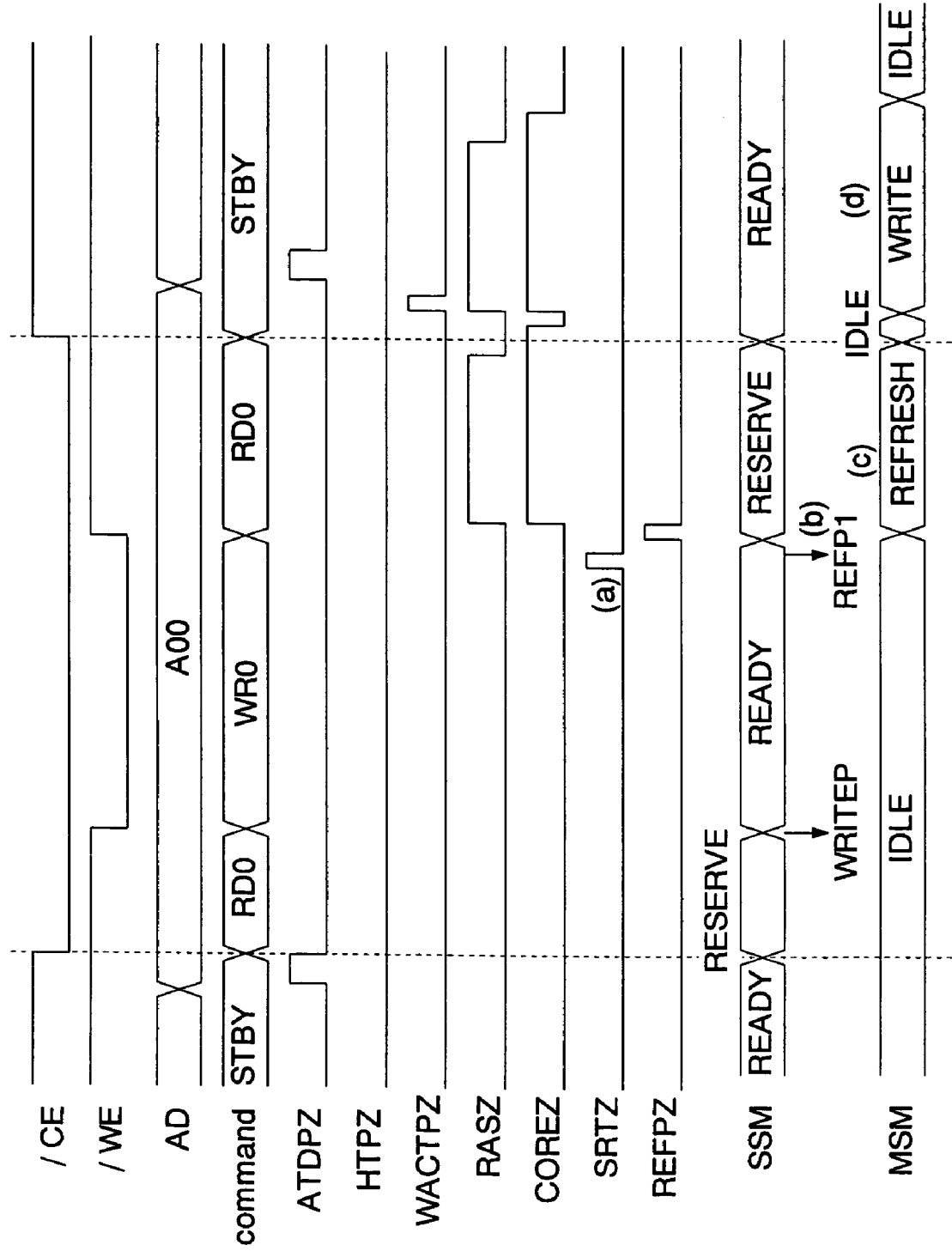
FIG. 47 is a timing chart showing an operation of the FCRAM in the case where the write command is supplied in the reserve state and then the refresh command occurs.

FIG. 47 shows an operation of the FCRAM when the write command WR is supplied in the reserve state RESERVE and the refresh command REF occurs subsequently. In this example, the operation is almost the same as in FIG. 22 of the foregoing first embodiment. Detailed description will thus be omitted of the same operation as in FIG. 22.

In this example, the FCRAM also recognizes the read commands RD0 that do not satisfy the hold period in front of and behind the write command WR0 as in FIG. 46 seen above. The sub state machine SSM receives the refresh command REF in the ready state READY to which it has changed due to the write command WR0 (FIG. 47(a)). The sub state machine SSM generates the refresh permission REFP1 in response to the refresh command REF (FIG. 47(b)). The main state machine MSM receives the refresh permission REFP1 in the idle state IDLE, and changes to the refresh state REFRESH in order to perform a refresh operation (FIG. 47(c)). As above, when the refresh command REF is received in the ready state READY, the ready state READY is maintained while the refresh permission REFP1 is issued to perform the refresh operation. Thus, the refresh operation responding to the refresh command REF can be started promptly. As a result, the main state machine MSM can reduce a length of the period of the idle state IDLE to a minimum. In other words, it is possible to improve the frequency of supply of external commands such as the read command RD and the write command WR (command input rate).

In addition, since the write operation is started in response to the end of the write command WR, the refresh operation can be performed with priority over the write operation when the refresh command REF occurs during the supply of the write command WR. The main state machine MSM changes to the idle state IDLE in response to the completion of the refresh operation, and then changes to the write state WRITE in order to start the write operation (FIG. 47(d)).

Figure 48:
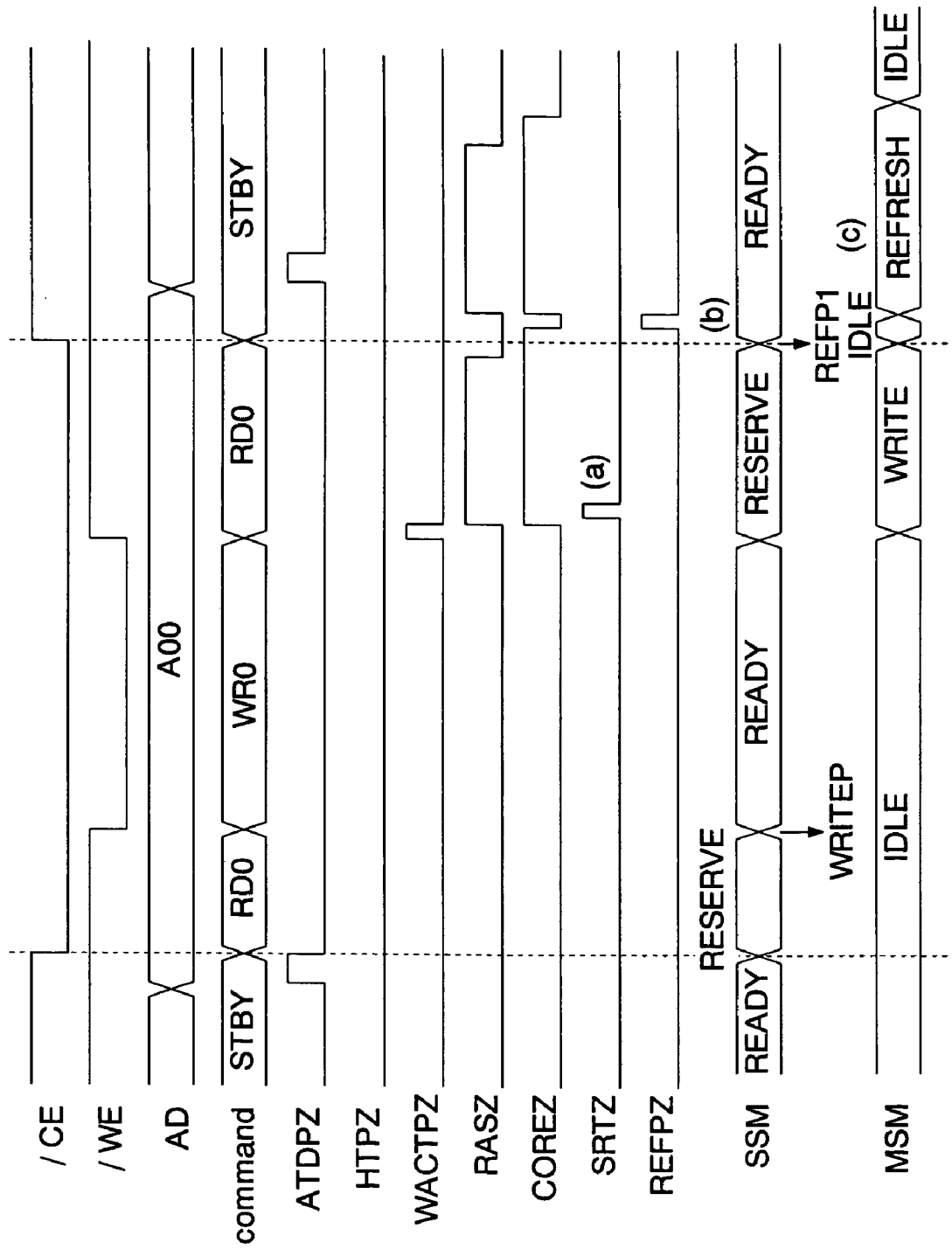
FIG. 48 is a timing chart showing an operation of the FCRAM in the case where the write command is supplied in the reserve state and the refresh command occurs during the write operation.

FIG. 48 shows an operation of the FCRAM when the write command WR is supplied in the reserve state RESERVE and the refresh command REF occurs during the execution of the write operation. In this example, the operation is almost the same as in FIG. 23 of the foregoing first embodiment. Moreover, the timing leading up to the start of the write operation is almost the same as in FIG. 46. Detailed description will thus be omitted of the same operation as in FIGS. 23 and 46.

The sub state machine SSM receives the refresh command REF in the reserve state RESERVE corresponding to the second read command RD0 (FIG. 48(a)). In response to the completion of the read command RD0 (=the supply of the standby command STBY), the sub state machine SSM generates the refresh permission REFP1, and changes from the reserve state RESERVE to the ready state READY (FIG. 48(b)).

The main state machine MSM receives the refresh permission REFP1 in the idle state IDLE after the write operation, and changes to the refresh state REFRESH in order to perform a refresh operation (FIG. 48(c)). When the refresh command REF and the standby command STBY are supplied in the reserve state RESERVE, the refresh operation is started in the ready state READY to which the state changes in response to the standby command STBY. The memory cells MC can thus be refreshed by utilizing the free time of the memory core 28. As a result, it is possible to hide the refresh cycle from the system on which the FCRAM is mounted.

Figure 49:
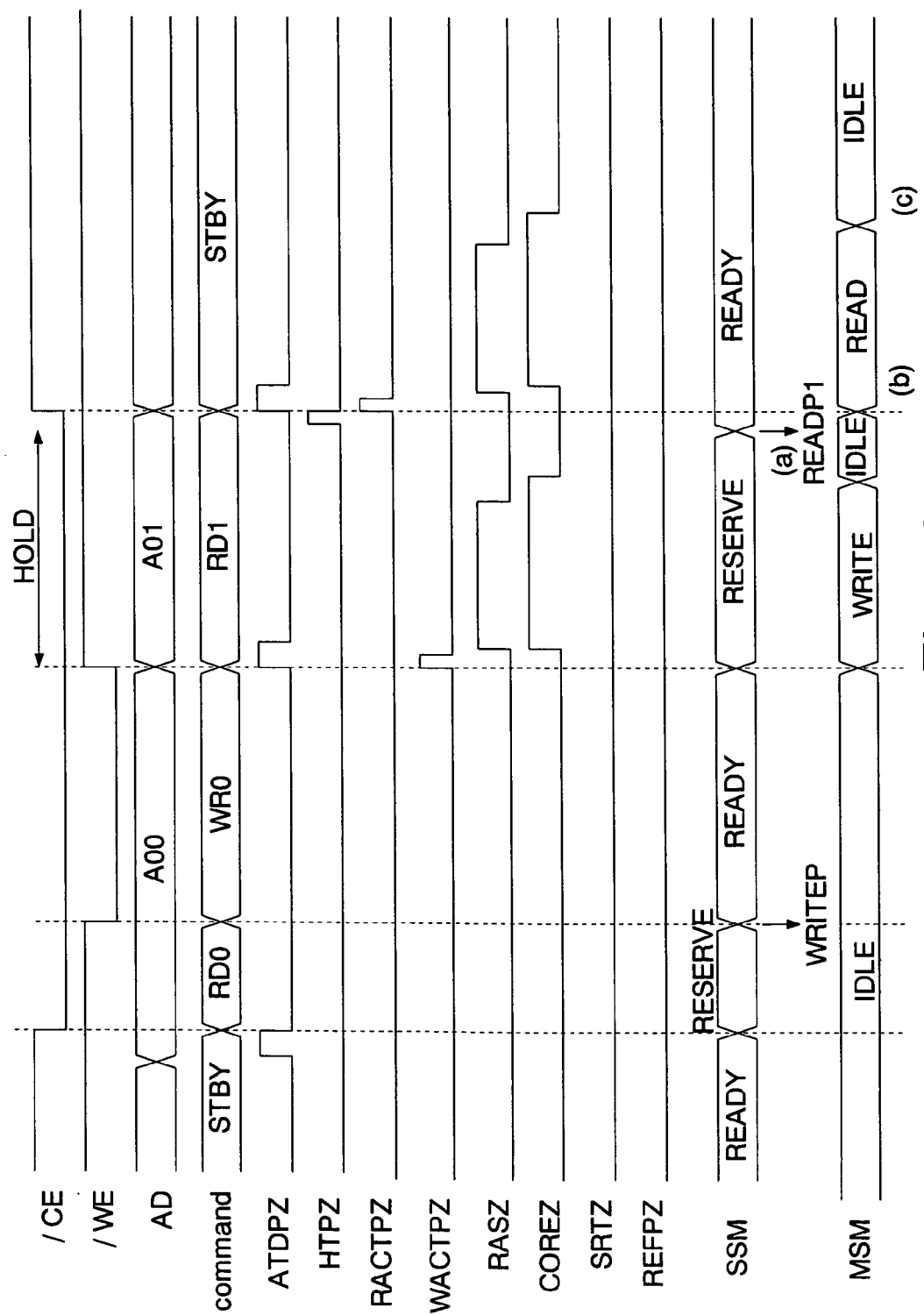
FIG. 49 is a timing chart showing an operation of the FCRAM in the case where in the reserve state the write command and the read command which satisfies the hold time are supplied in sequences.

FIG. 49 shows an operation of the FCRAM when the write command WR and the read command RD that satisfies the hold time HOLD are supplied successively in the reserve state RESERVE. The timing leading up to the start of the write operation is almost the same as in FIG. 46.

In this example, the read command RD1, which is supplied after the write command WR0, satisfies the hold time HOLD. The sub state machine SSM thus generates the read permission READP1 after the hold time HOLD corresponding to the read command RD1 has elapsed (FIG. 49(a)). The main state machine MSM receives the read permission READP1 in the idle state IDLE after the write operation, and changes to the read state READ in order to perform a read operation (FIG. 49(b)). After the execution of the read operation, the main state machine MSM returns to the idle state IDLE (FIG. 49(c)).

Figure 50:
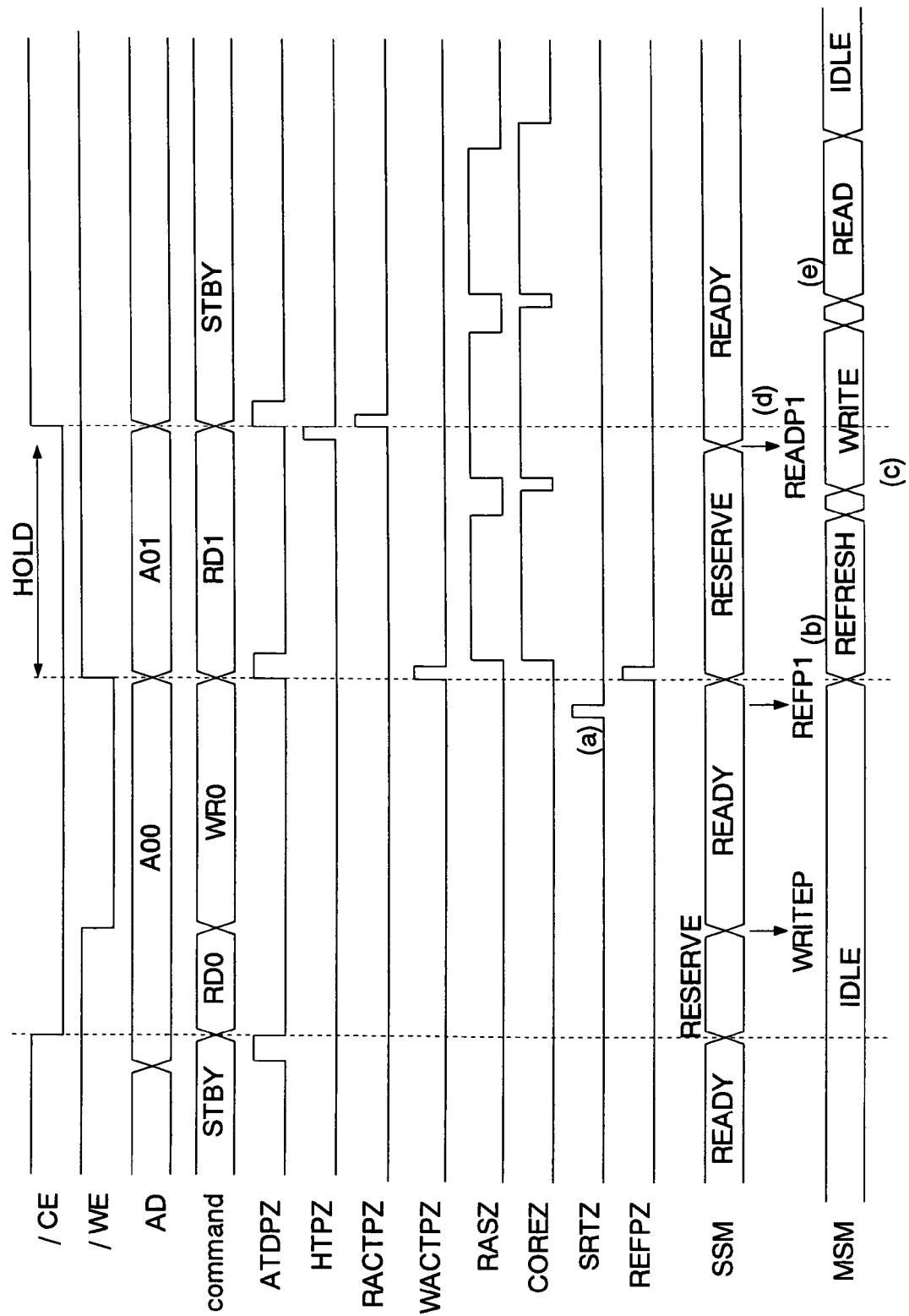
FIG. 50 is a timing chart showing an operation of the FCRAM in the case where the write command is supplied in the reserve state then the refresh command occurs and the read command which satisfies the hold time is supplied.

FIG. 50 shows an operation of the FCRAM when the write command WR is supplied in the reserve state RESERVE, and then the refresh command REF occurs and the read command RD that satisfies the hold time HOLD is supplied. The timing leading up to the supply of the read command RD1 is the same as in FIG. 47.

In this example, the read command RD1, which is supplied after the write command WR0, satisfies the hold time HOLD. Besides, the sub state machine SSM receives the refresh command REF in the ready state READY to which it has changed due to the write command WR0, and generates the refresh permission REFP1 (FIG. 50(a)). The main state machine MSM receives the refresh permission REFP1 in the idle state IDLE, and changes to the refresh state REFRESH in order to perform a refresh operation (FIG. 50(b)). The main state machine MSM changes to the idle state IDLE in response to the completion of the refresh operation, and then changes to the write state WRITE in order to start the write operation (FIG. 50(c)). The main state machine MSM receives the read permission READP1 during the write operation (FIG. 50(d)). The main state machine MSM changes to the read state READ in order to perform a read operation after the write operation (FIG. 50(e)).

Figure 51:
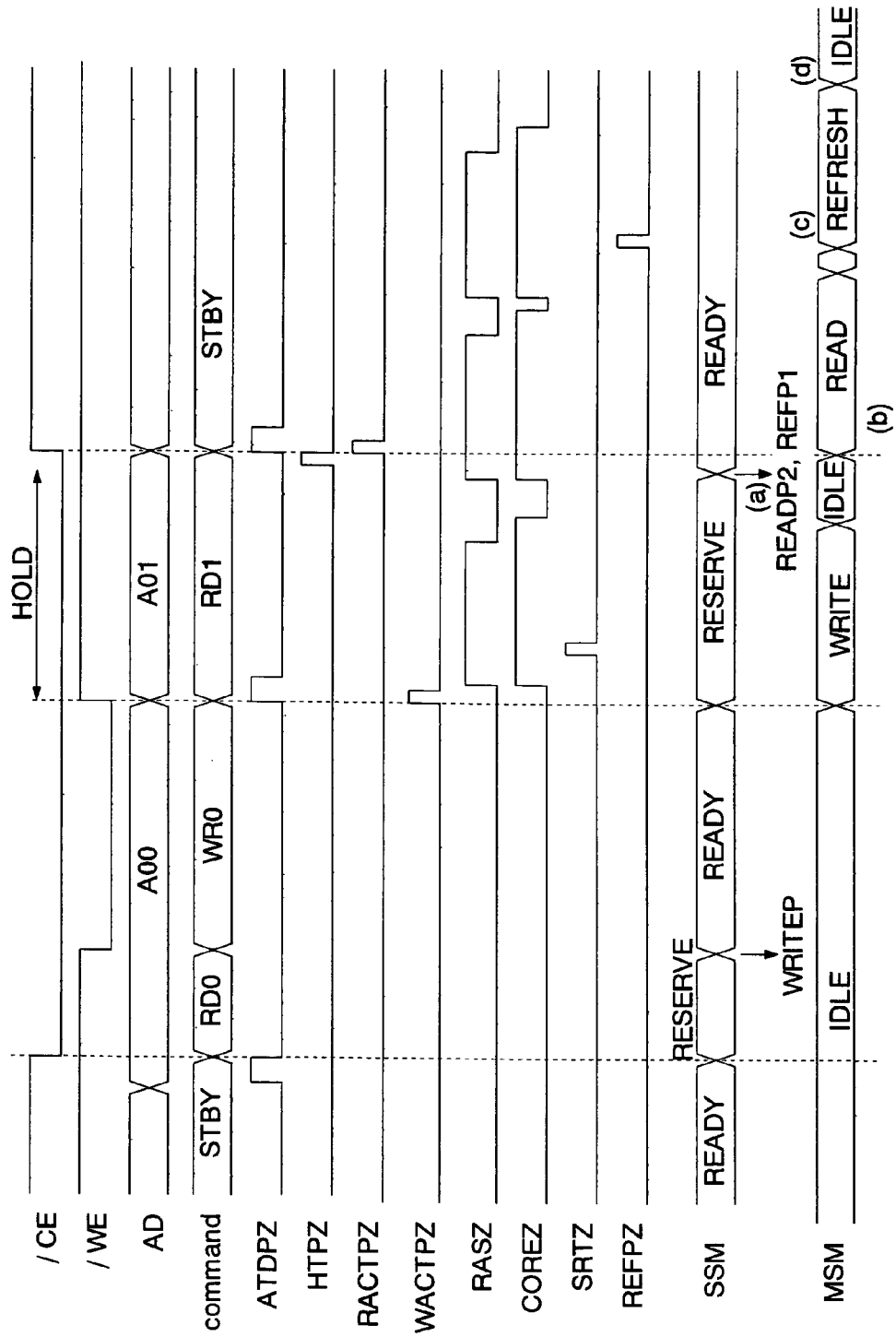
FIG. 51 is a timing chart showing an operation of the FCRAM in the case where in the reserve state the write command and the read command which satisfies the hold time are supplied and the refresh command occurs during write operation.

FIG. 51 shows an operation of the FCRAM when the write command WR and the read command RD that satisfies the hold time HOLD are supplied in the reserve state RESERVE, and the refresh command REF occurs during the execution of the write operation. The timing leading up to the supply of the refresh command REF during the write operation is almost the same as in FIG. 48.

The sub state machine SSM generates the read permission READP2 and the refresh permission REFP1 after the hold time HOLD corresponding to the read command RD1 has elapsed (FIG. 51(a)). The main state machine MSM receives the read permission READP2 in the idle state IDLE after the write operation, changes to the read state READ, and performs a read operation (FIG. 51(b)). After the execution of the read operation, the main state machine MSM returns to the idle state IDLE, and changes to the refresh state REFRESH so as to perform a refresh operation immediately (FIG. 51(c)). After the execution of the refresh operation, the main state machine MSM returns to the idle state IDLE (FIG. 51(d)).

Figure 52:
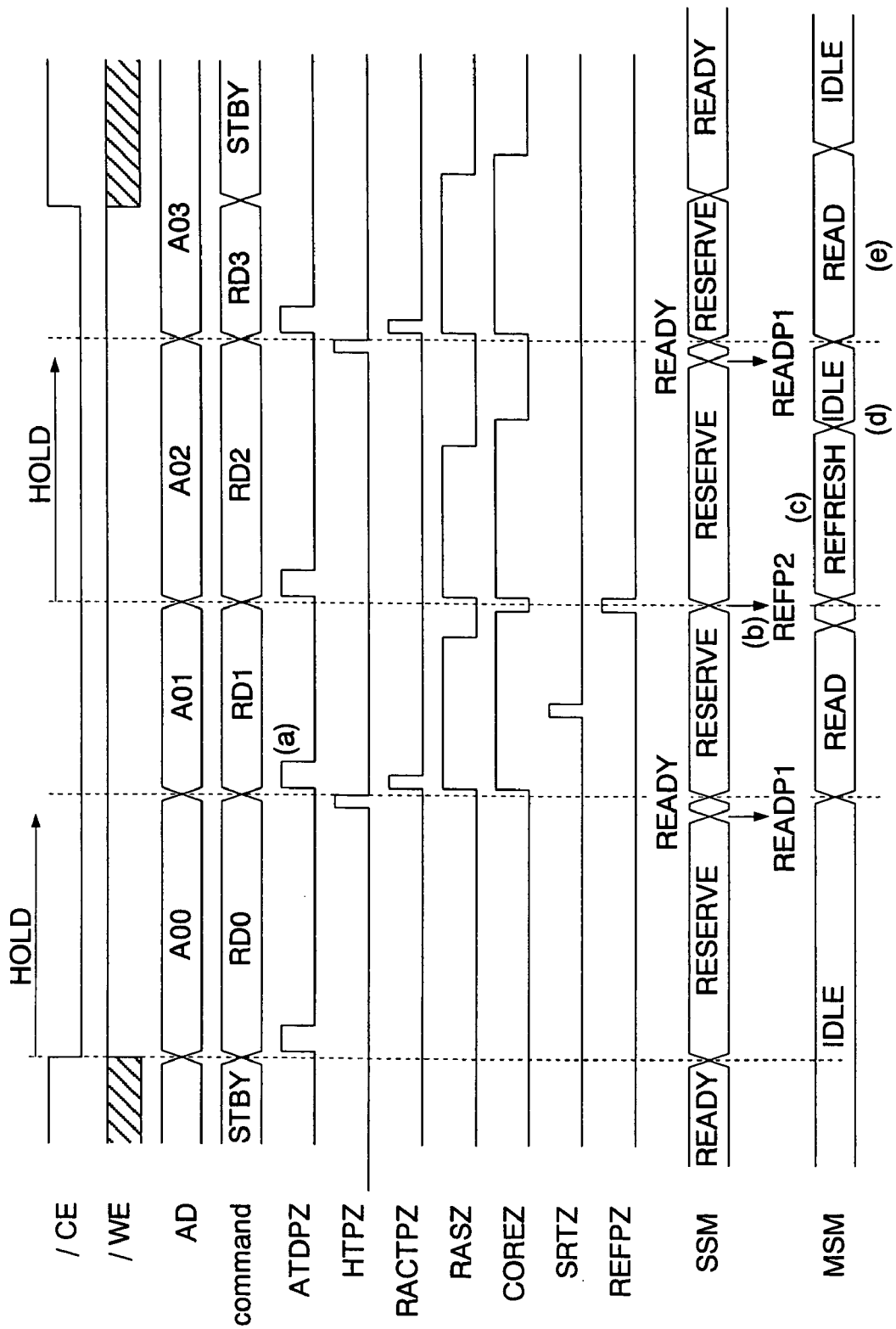
FIG. 52 is a timing chart showing an operation of the FCRAM in the case where the refresh command occurs in the read operation and in the reserve state.

FIG. 52 shows an operation of the FCRAM when the refresh command REF occurs in the reserve state RESERVE during a read operation.

In this example, a read command RD1 not satisfying the hold time HOLD is supplied between read commands RD0 and RD2 that satisfy the hold time HOLD (FIG. 52(a)). In response to the new read command RD2 in the reserve state RESERVE, the sub state machine SSM generates the refresh permission REFP2, resets the reserve state RESERVE in transition, and changes to the new reserve state RESERVE (FIG. 52(b)). The main state machine MSM receives the refresh permission REFP2 in the idle state IDLE, and changes to the refresh state REFRESH in order to perform a refresh operation (FIG. 52(c)). After the execution of the refresh operation, the main state machine MSM returns to the idle state IDLE (FIG. 52(d)). Subsequently, the main state machine MSM changes to the read state READ corresponding to and in response to the read command RD2 which satisfies the hold time HOLD, and performs a read operation (FIG. 52(e)).

Figure 53:
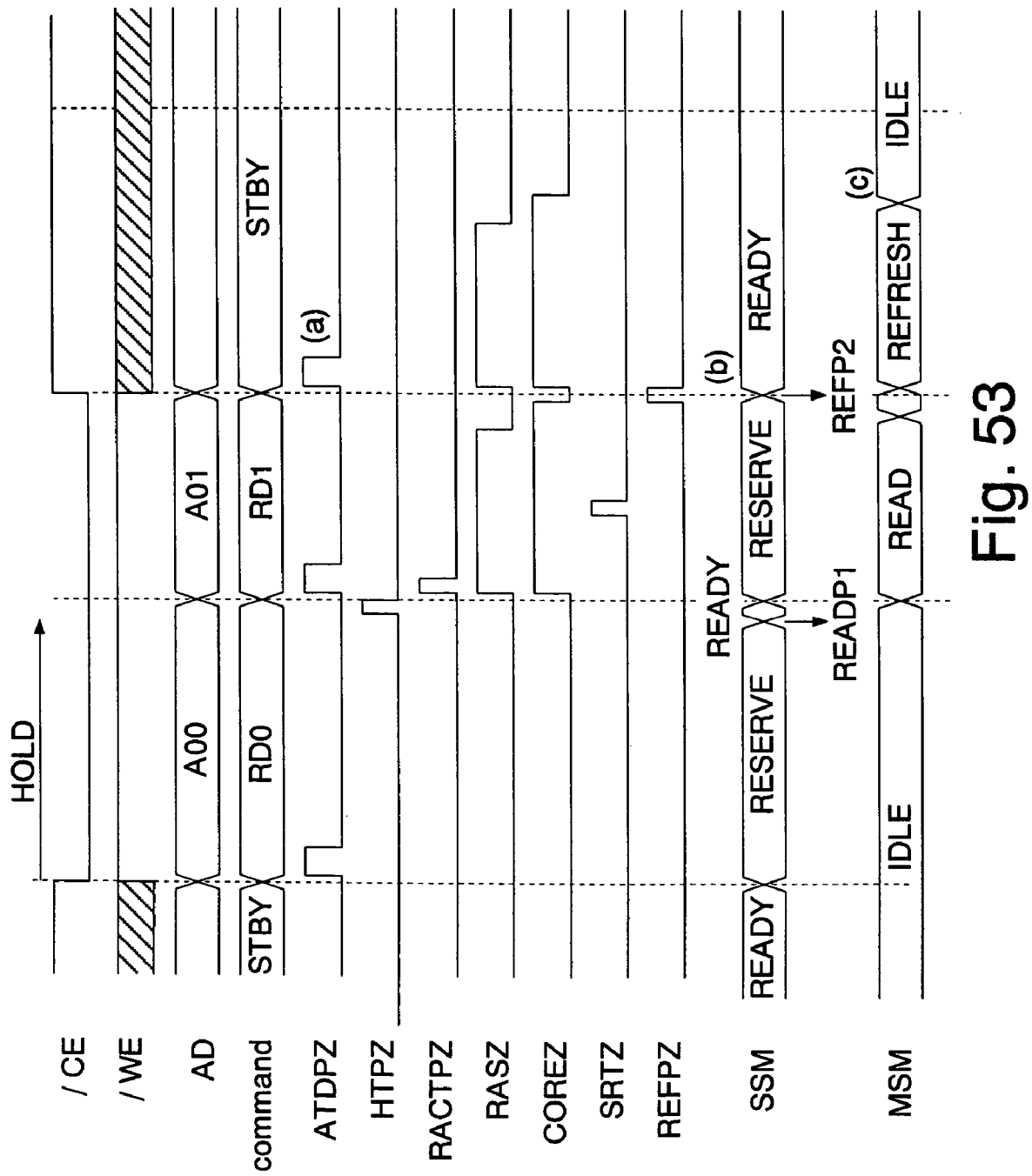
FIG. 53 is a timing chart showing another operation of the FCRAM in the case where the refresh command occurs in the read operation and in the reserve state.

FIG. 53 shows another operation of the FCRAM when the refresh command REF occurs in the reserve state RESERVE during a read operation. The timing leading up to the start of the refresh operation is almost the same as in FIG. 52 seen above.

In this example, the read command RD1 not satisfying the hold time HOLD is supplied before the supply of the standby command STBY (FIG. 53(a)). Thus, after the reserve state RESERVE corresponding to the read command RD1, the sub state machine SSM changes to the ready state READY (FIG. 53(b)). After the refresh operation, the main state machine MSM changes to the idle state IDLE (FIG. 53(c)).

Figure 54:
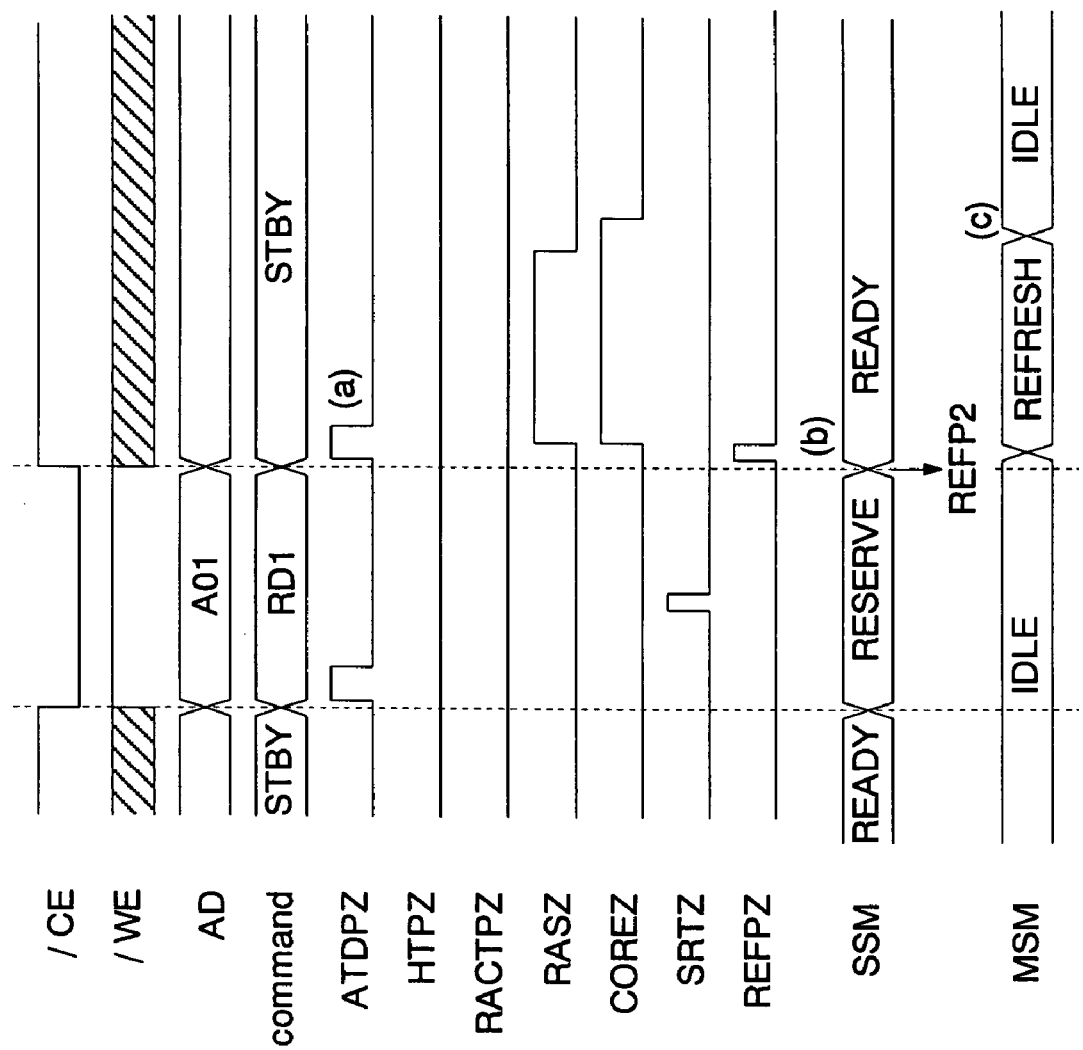
FIG. 54 is a timing chart showing another operation of the FCRAM in the case where the refresh command occurs in the reserve state.

FIG. 54 shows another operation of the FCRAM when the refresh command REF occurs in the reserve state RESERVE. The timing leading up to the start of the refresh operation is almost the same as in FIG. 45 seen above.

In this example, the read command RD1 not satisfying the hold time HOLD is supplied before the supply of the standby command STBY (FIG. 54(a)). Thus, after the reserve state RESERVE, the sub state machine SSM changes to the ready state READY (FIG. 54(b)). After the refresh operation, the main state machine MSM changes to the idle state IDLE (FIG. 54(c)).

Figure 55:
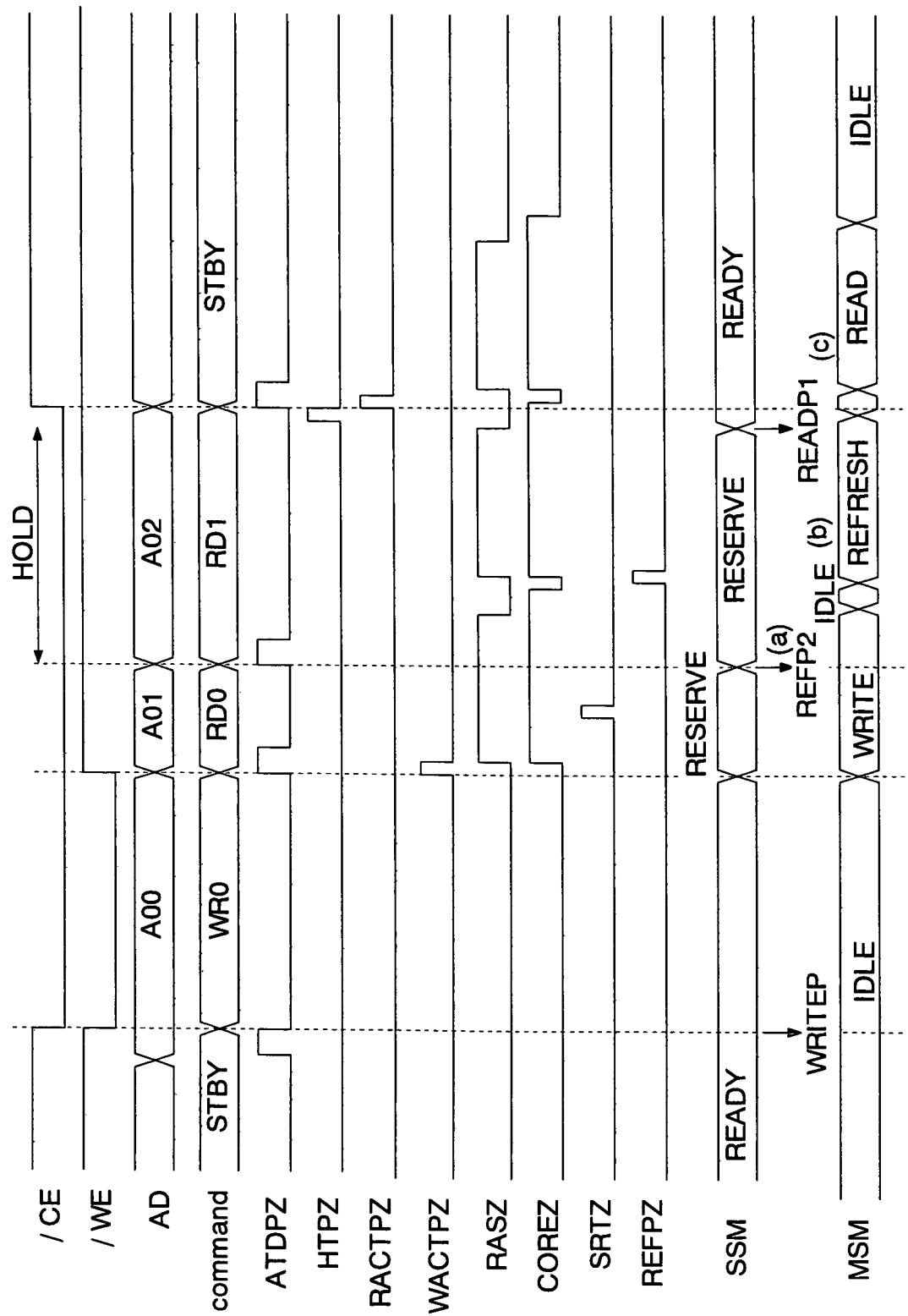
FIG. 55 is a timing chart showing an operation of the FCRAM in the case where the refresh command occurs in the write operation and in the reserve state and then the read command which satisfies the hold time is supplied.

FIG. 55 shows an operation of the FCRAM when the refresh command REF occurs in the reserve state RESERVE during a write operation, and a read command RD satisfying the hold time HOLD is supplied subsequently.

A new read command RD1 is supplied in the reserve state RESERVE corresponding to a read command RD0. The sub state machine SSM generates the refresh permission REFP2, resets the reserve state RESERVE in transition, and changes to the new reserve state RESERVE (FIG. 55(a)). The main state machine MSM changes to the refresh state REFRESH in order to perform a refresh operation corresponding to the refresh permission REFP2 in the idle state IDLE after the write operation (FIG. 55(b)).

The sub state machine SSM generates the read permission READP1 after the end of the reserve period corresponding to the read command RD1. After the completion of the refresh operation, the main state machine MSM changes from the idle state IDLE to the read state READ in order to perform a read operation corresponding to the read permission READP1 (FIG. 55(c)).

As above, this embodiment can provide the same effects as those of the first embodiment described above. Moreover, in this embodiment, the state machine for controlling the operation of the FCRAM is composed of the main state machine MSM which controls the operation of the memory core 28 directly and the sub state machine SSM which controls the operation of the internal circuits according to the operation commands of the memory core 28. This can prevent the state machines from increasing in complexity. Consequently, the control circuits formed in the FCRAM corresponding to the respective state machines can be configured simply. As a result, it is possible to reduce the circuit design time of the FCRAM.

When the FCRAM is newly developed by utilizing a memory core 28 developed previously, the control circuit corresponding to the main state machine MSM for controlling the operation of the memory core 28 can also use the control circuit designed previously. This makes it possible to develop a new semiconductor memory by newly designing the sub state machine SSM alone. As a result, it is possible to reduce the development period and development cost of the FCRAM.

When the sub state machine SSM in the reserve state RESERVE responding to a read command RD receives a new read command RD, it resets the reserve state RESERVE in transition and newly changes to the reserve state RESERVE in order to measure the hold time HOLD again. Besides, after a lapse of the hold time HOLD, the sub state machine SSM issues the read permissions READP1 and READP2 to perform the read operations. Consequently, when read commands RD are supplied at intervals shorter than the hold time HOLD, the memory core can be prevented from malfunctioning. The timing specification of the FCRAM having DRAM memory cells MC can be set the same as that of the SRAM.

When the refresh command REF is supplied in the reserve state RESERVE and the hold time HOLD elapses, the read operation can be performed with priority over the refresh operation. As a result, it is possible to reduce the time from the supply of the read command RD to the output of the read data.

When the refresh command REF and a new read command RD are supplied successively in the reserve state RESERVE, the refresh operation is performed with priority in the new reserve state RESERVE. This makes it possible to hide the refresh cycle from external systems.

The main state machine MSM can change to the refresh state REFRESH, the read state READ, and the write state WRITE only from the idle state IDLE. Since the operations of the memory core 28 are started from the same state (IDLE state) all the time, the control circuit corresponding to the main state machine MSM can be configured simply.

Since the write operation is started in response to the end of the write command WR, the refresh operation can be performed with priority over the write operation when the refresh command REF occurs during the supply of the write command WR.

When the refresh command REF is received in the ready state READY, the refresh permission REFP1 is issued while the ready state READY is maintained. The refresh operation responding to the refresh command REF can thus be started promptly. As a result, it is possible to minimize the time for the FCRAM to be occupied by the refresh operation, and improve the frequency of supply of external commands such as the read command RD.

In the FCRAM in which the read operation is started in response to a read command RD occurring in the ready state READY after the hold time HOLD has elapsed, if the refresh command REF and the standby command STBY are supplied in the reserve state RESERVE, the refresh operation can be started in the ready state READY to hide the refresh cycle from external systems.

Figure 56:
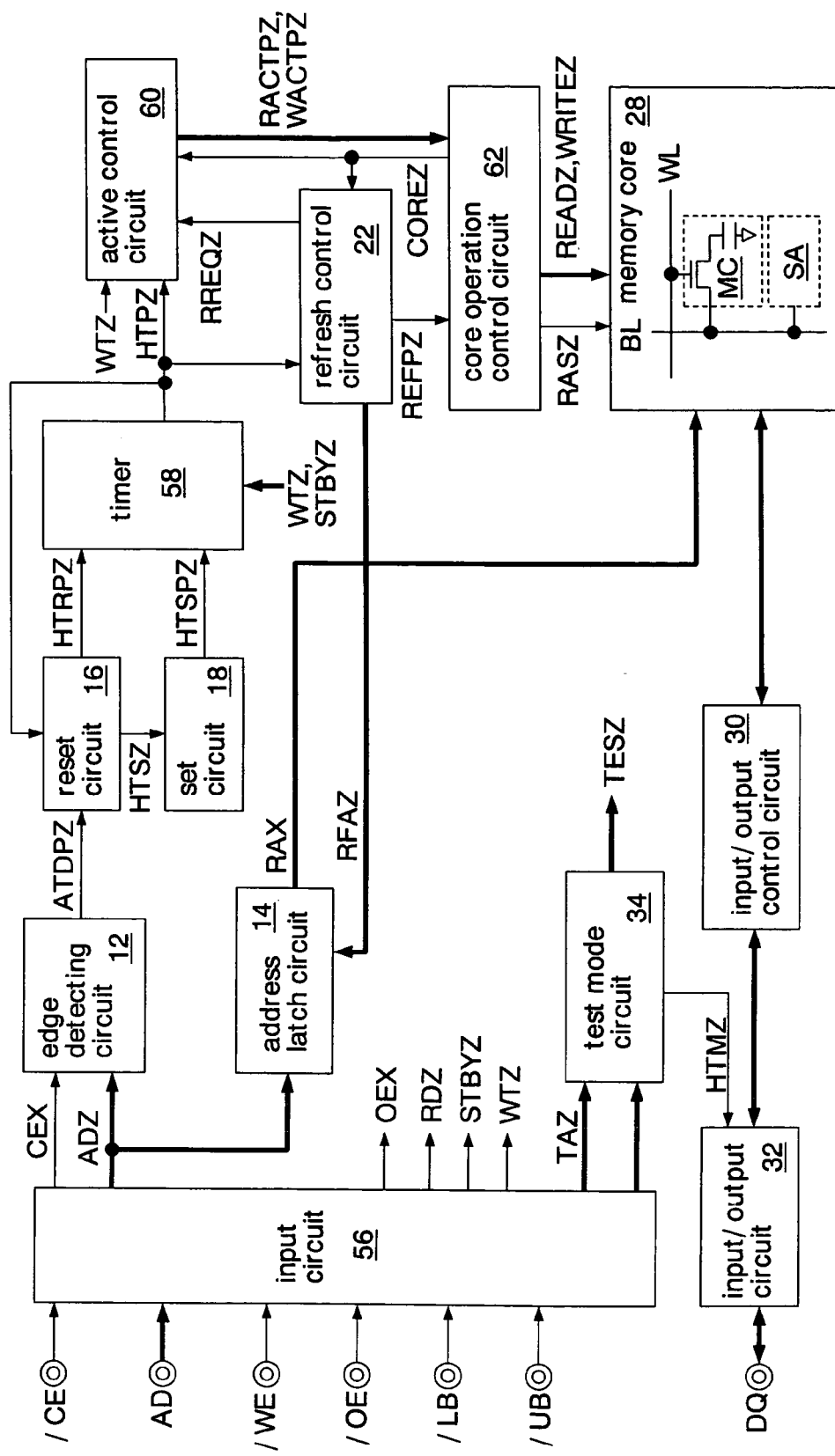
FIG. 56 is a block diagram showing a fifth embodiment of the semiconductor memory of the present invention.

FIG. 56 shows a fifth embodiment of the semiconductor memory of the present invention. The same circuits and signals as the circuits and signals described in the first embodiment will be designated by identical reference numbers or symbols. Detailed description thereof will be omitted.

The FCRAM of this embodiment has an active control circuit 60 and a core operation control circuit 62 instead of the active control circuit 24 and the core operation control circuit 26 of the fourth embodiment. The rest of the configuration is almost the same as in the first and fourth embodiments. This embodiment differs from the fourth embodiment in that the FCRAM starts a write operation in response to the supply of the write command WR. The rest of the operations are the same as in the fourth embodiment.

Figure 57:
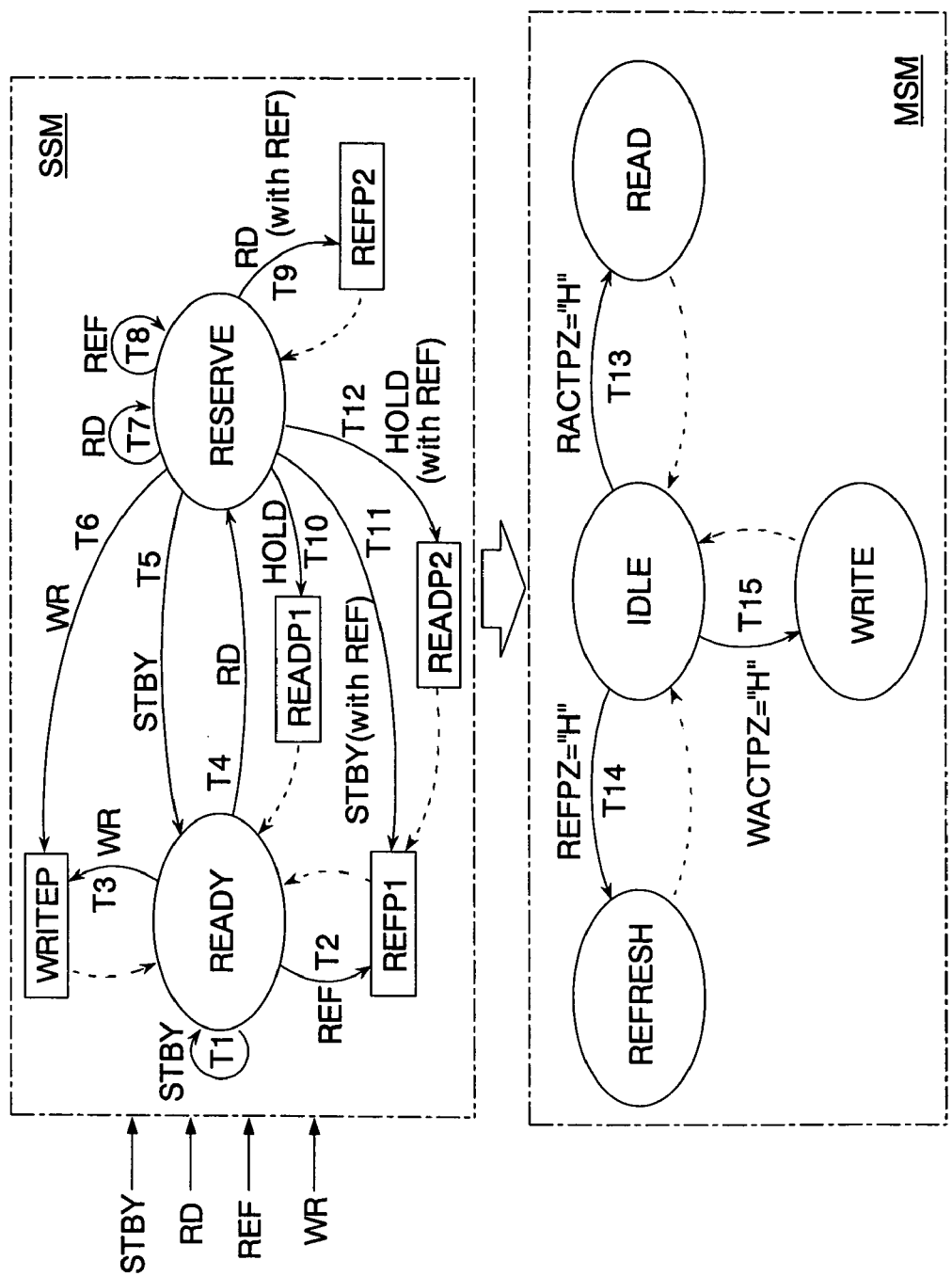
FIG. 57 is a state transition diagram of the FCRAM in the fifth embodiment.

FIG. 57 shows a state transition diagram of the FCRAM in the fifth embodiment.

A difference from the state transition diagram of the fourth embodiment lies in that the write command WR is input to the sub state machine SSM alone. In this embodiment, when the main state machine MSM receives the write permission WRITEP in the ready state READY, it immediately starts the write operation.

Figure 58:
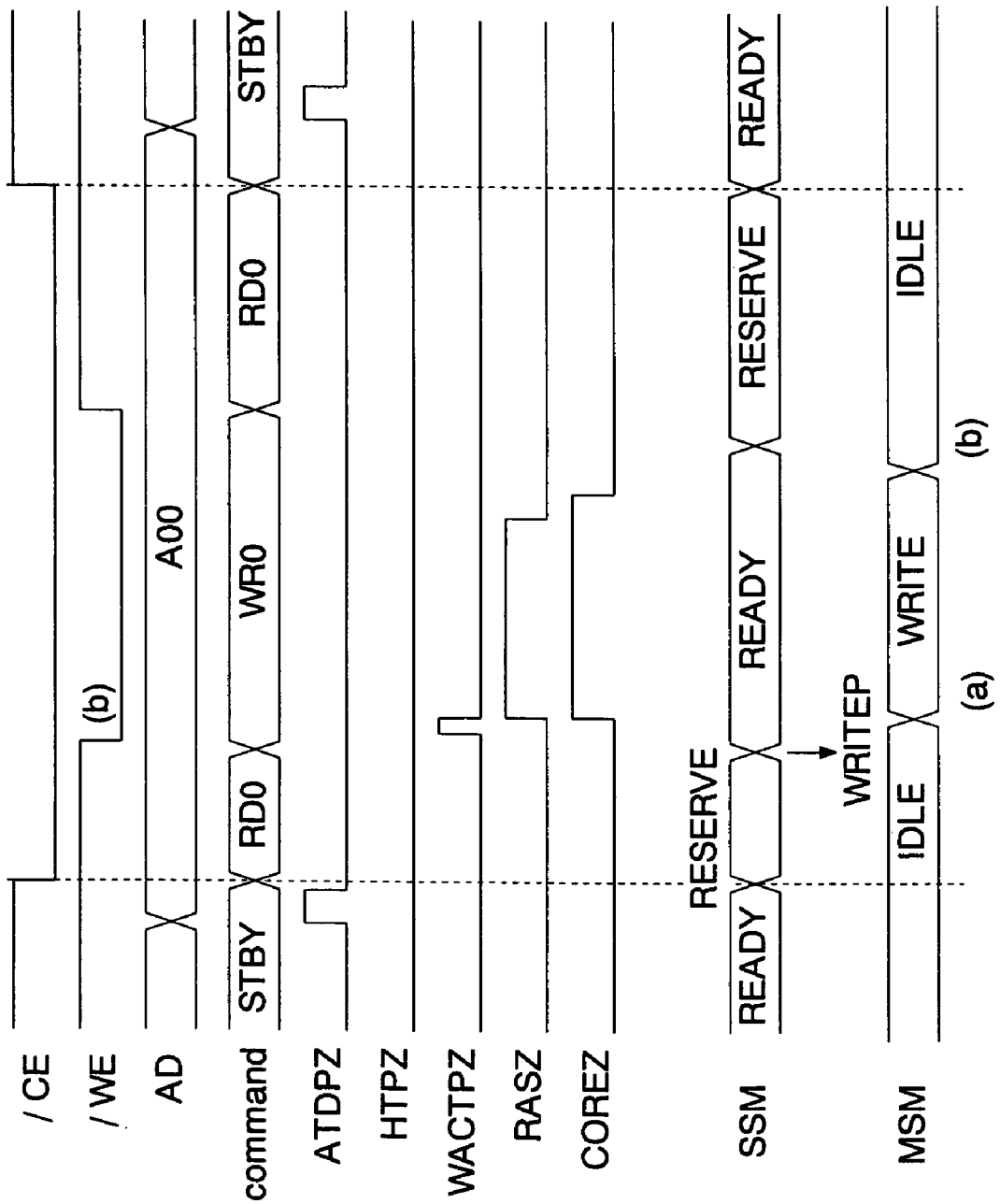
FIG. 58 is a timing chart showing an operation of the FCRAM in the case where the write command is supplied in the reserve state.

FIG. 58 shows the operation of the FCRAM when the write command WR is supplied in the reserve state RESERVE. This example deals with the operation corresponding to FIG. 46 of the foregoing fourth embodiment. The commands to be supplied from exterior, the supply timing thereof, and the operation of the sub state machine SSM are the same as in FIG. 46 of the fourth embodiment.

When the main state machine MSM receives the write permission WRITEP in the idle state IDLE, it immediately changes to the write state WRITE and starts the write operation (FIG. 58(a)). Consequently, as compared to the fourth embodiment, it is possible to reduce the period of the idle state IDLE in the write cycle. As a result, the frequency of operation of the memory core 28 increases with an improvement in operation efficiency. After the completion of the write operation, the main state machine MSM returns to the idle state IDLE (FIG. 58(b)).

Figure 59:
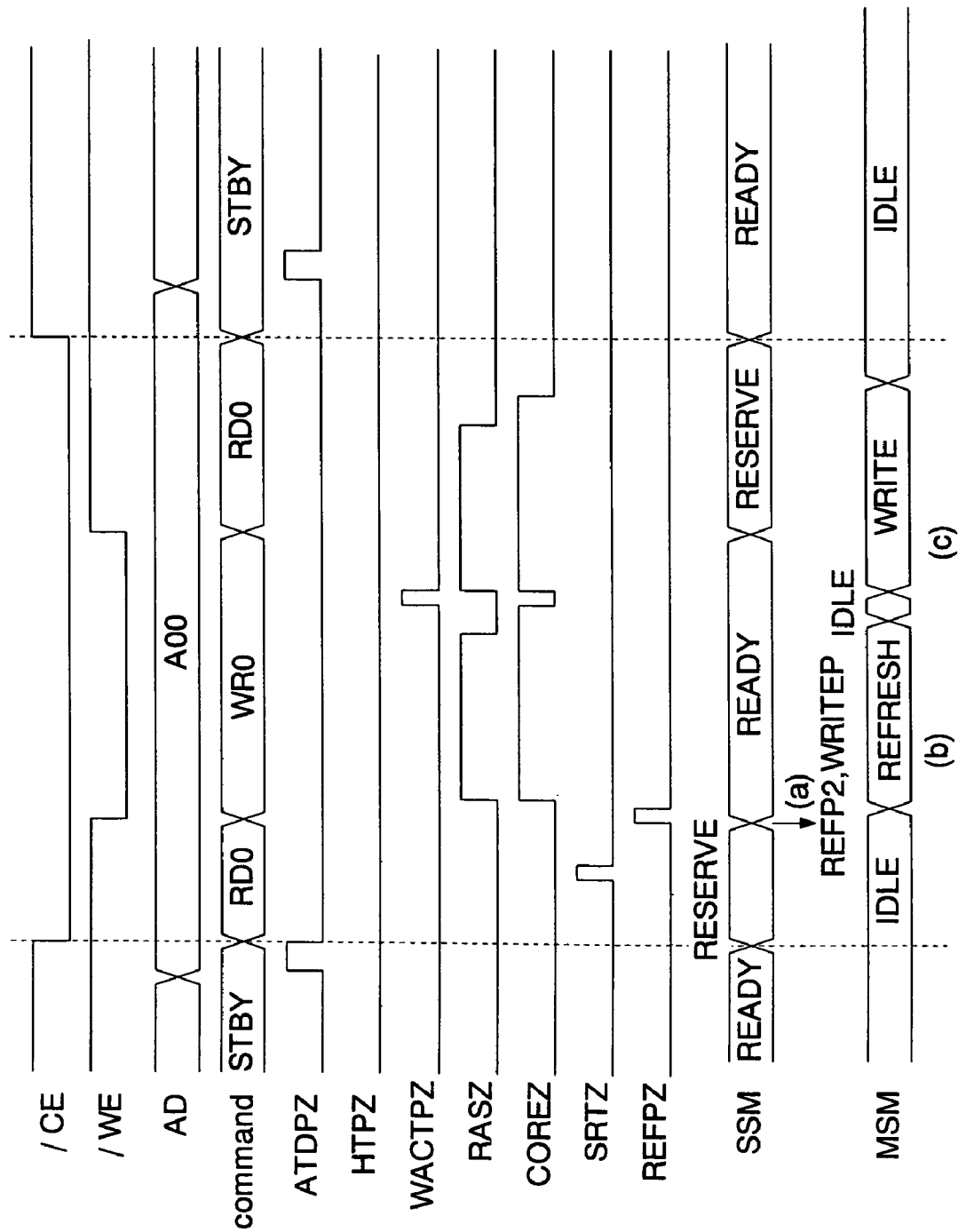
FIG. 59 is a timing chart showing an operation of the FCRAM in the case where the refresh command (SRTZ) and the write command (WR0) are sequentially supplied in the reserve state.

FIG. 59 shows an operation of the FCRAM when the refresh command (SRTZ) and a write command WR0 are supplied successively in the reserve state RESERVE. This example deals with the operation corresponding to FIG. 47 of the foregoing fourth embodiment. The commands to be supplied from exterior and the supply timing thereof are the same as in FIG. 47 of the fourth embodiment.

The sub state machine SSM receives the write command WR0, generates the refresh permission REFP2 and the write permission WRITEP, and changes from the reserve state RESERVE to the ready state READY (FIG. 59(a)). The main state machine MSM receives the refresh permission REFP2 in the idle state IDLE, and changes to the refresh state REFRESH in order to perform a refresh operation (FIG. 59(b)). When the main state machine MSM returns to the idle state IDLE after the refresh operation, it immediately changes to the write state WRITE and performs a write operation (FIG. 59(c)).

Figure 60:
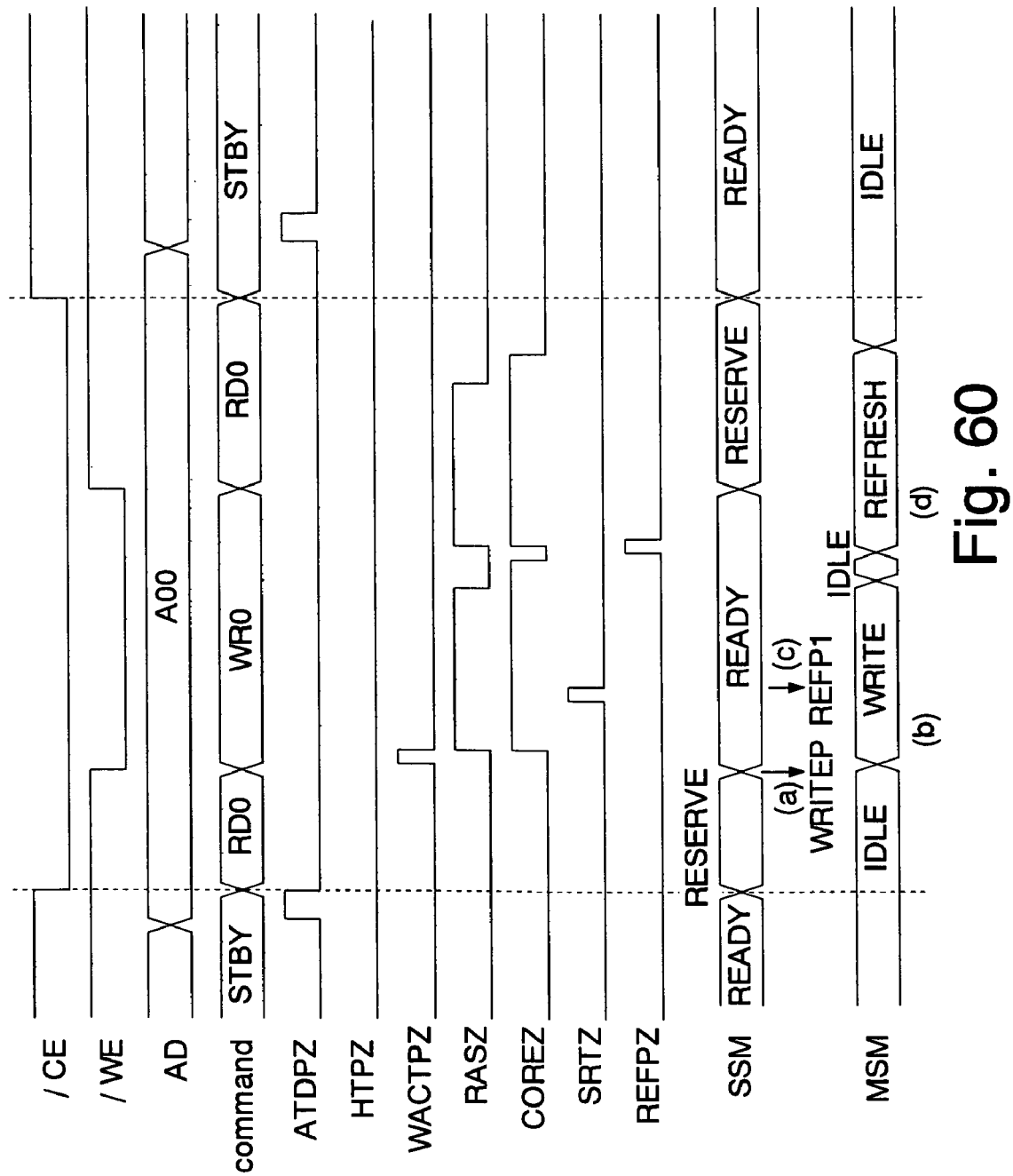
FIG. 60 is a timing chart showing an operation of the FCRAM in the case where the write command is supplied in the reserve state and the refresh command occurs during write operation.

FIG. 60 shows an operation of the FCRAM when the write command WR is supplied in the reserve state RESERVE and the refresh command REF occurs during the execution of the write operation. This example deals with the operation corresponding to FIG. 48 of the foregoing fourth embodiment. The commands to be supplied from exterior and the supply timing thereof are the same as in FIG. 48 of the fourth embodiment.

The sub state machine SSM generates the write permission WRITEP upon receiving the write command WR0 in the reserve state RESERVE, and changes from the reserve state RESERVE to the ready state READY (FIG. 60(a)). The main state machine MSM receives the write permission WRITEP in the idle state IDLE, and changes to the write state WRITE to perform the write operation (FIG. 60(b)). The sub state machine SSM receives the refresh command REF during the write operation, and generates the refresh permission REFP1 (FIG. 60(c)). When the main state machine MSM returns to the idle state IDLE after the write operation, it immediately changes to the refresh state REFRESH and performs a refresh operation (FIG. 60(d)).

Figure 61:
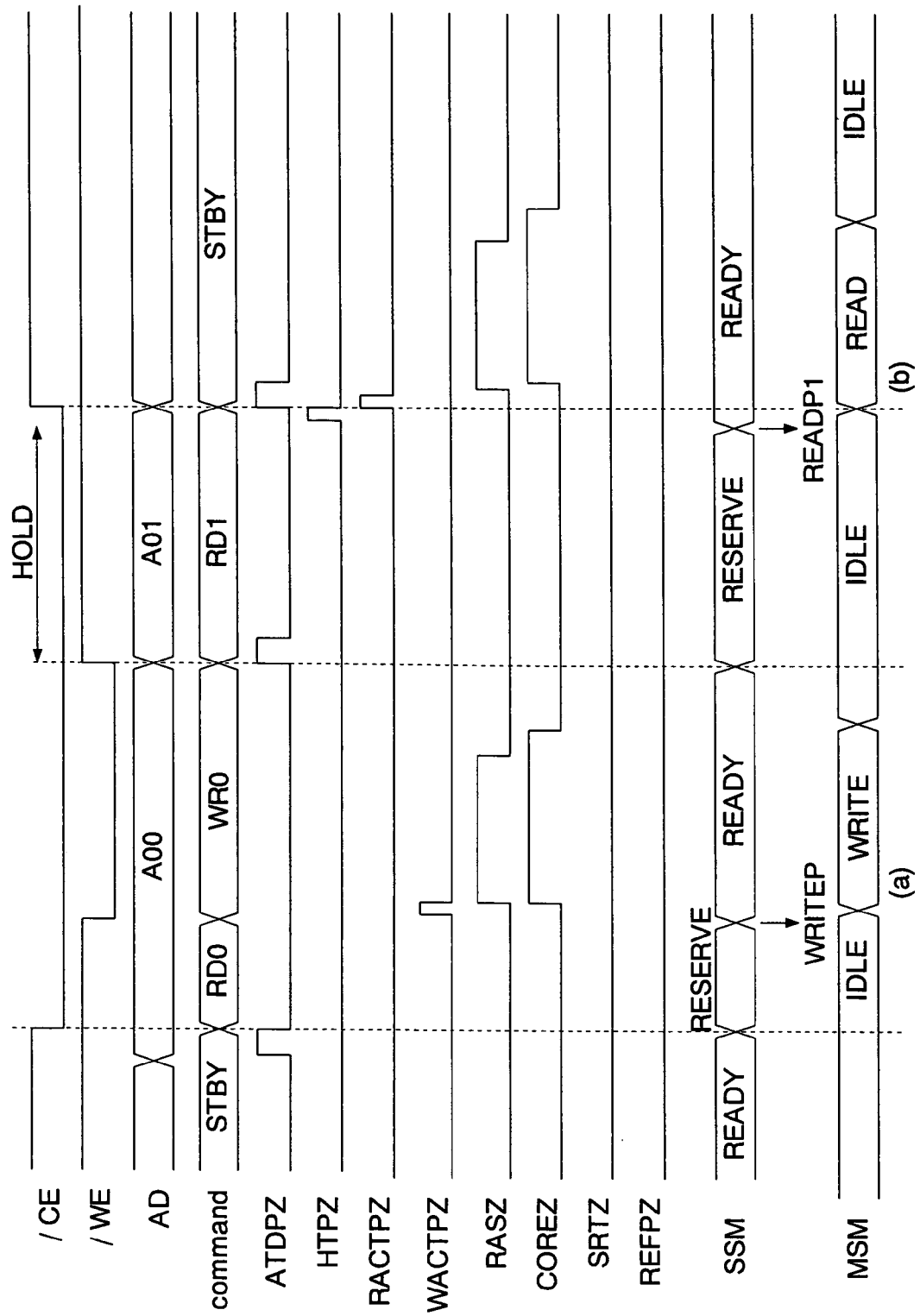
FIG. 61 is a timing chart showing an operation of the FCRAM in the case where, in the reserve state, the write command and the read command which satisfies the hold time are supplied in sequence.

FIG. 61 shows an operation of the FCRAM when the write command WR and the read command RD that satisfies the hold time HOLD are supplied successively in the reserve state RESERVE. This example deals with the operation corresponding to FIG. 49 of the foregoing fourth embodiment. The commands to be supplied from exterior, the supply timing thereof, and the operation of the sub state machine SSM are the same as in FIG. 49 of the fourth embodiment.

In order to start a write operation in response to the write permission WRITEP in the idle state IDLE, the main state machine MSM changes to the write state WRITE (FIG. 61(a)). Besides, as in FIG. 49, the main state machine MSM receives the read permission READP1 in the idle state IDLE after the write operation, and changes to the read state READ to perform a read operation (FIG. 61(b)).

Figure 62:
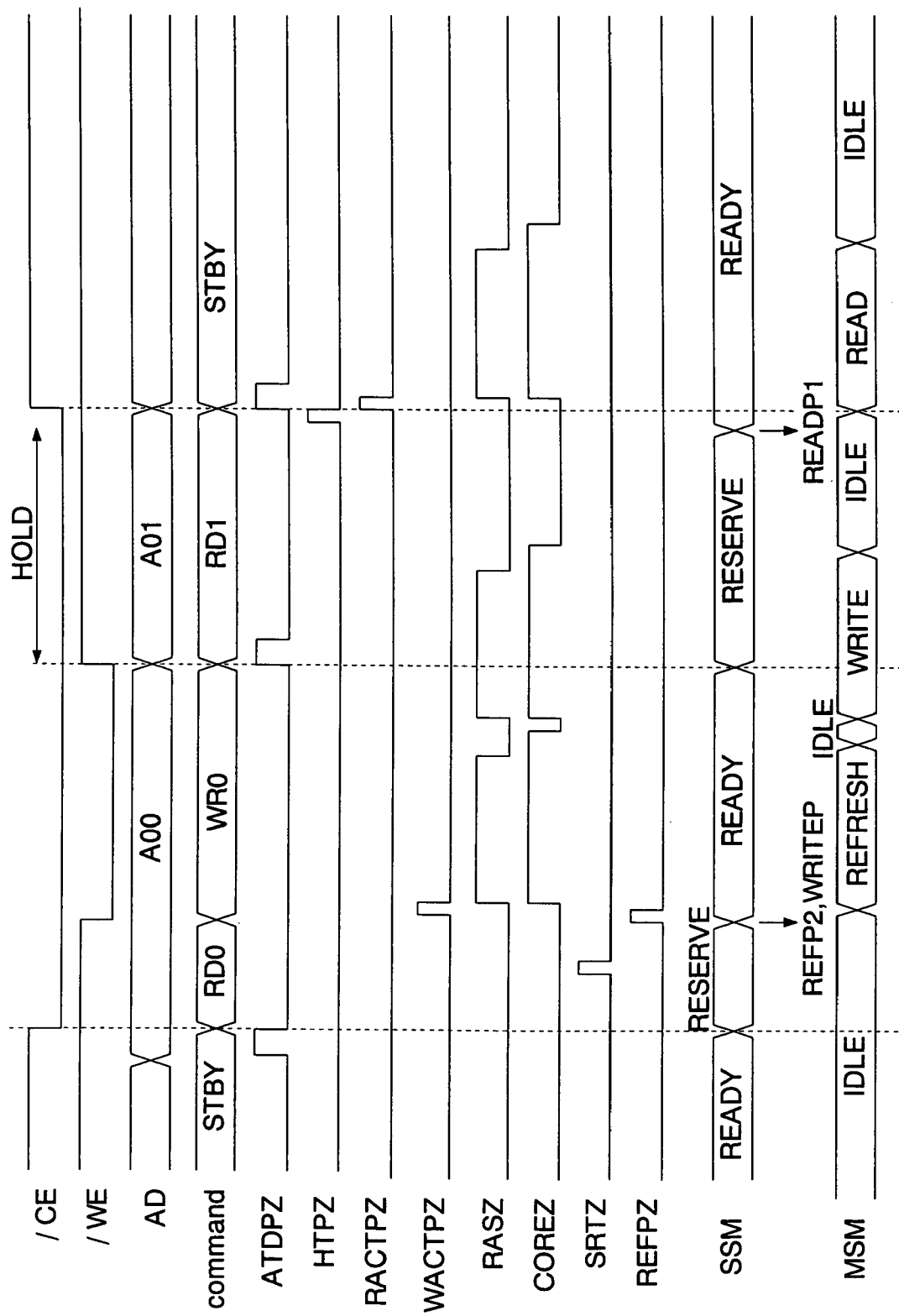
FIG. 62 is a timing chart showing an operation of the FCRAM in the case where the refresh command occurs in the reserve state, then the write command is supplied and the read command which satisfies the hold time is supplied.

FIG. 62 shows an operation of the FCRAM when the refresh command occurs in the reserve state RESERVE, and then the write command WR is supplied and the read command RD that satisfies the re-hold time HOLD is supplied. This example deals with the operation corresponding to FIG. 50 of the foregoing fourth embodiment. The commands to be supplied from exterior and the supply timing thereof are the same as in FIG. 50 of the fourth embodiment. Moreover, the operations corresponding to the refresh command REF and the write command WR0 are the same as in FIG. 59 seen above. The operation corresponding to the read command RD1 is the same as in FIG. 61 seen above.

Figure 63:
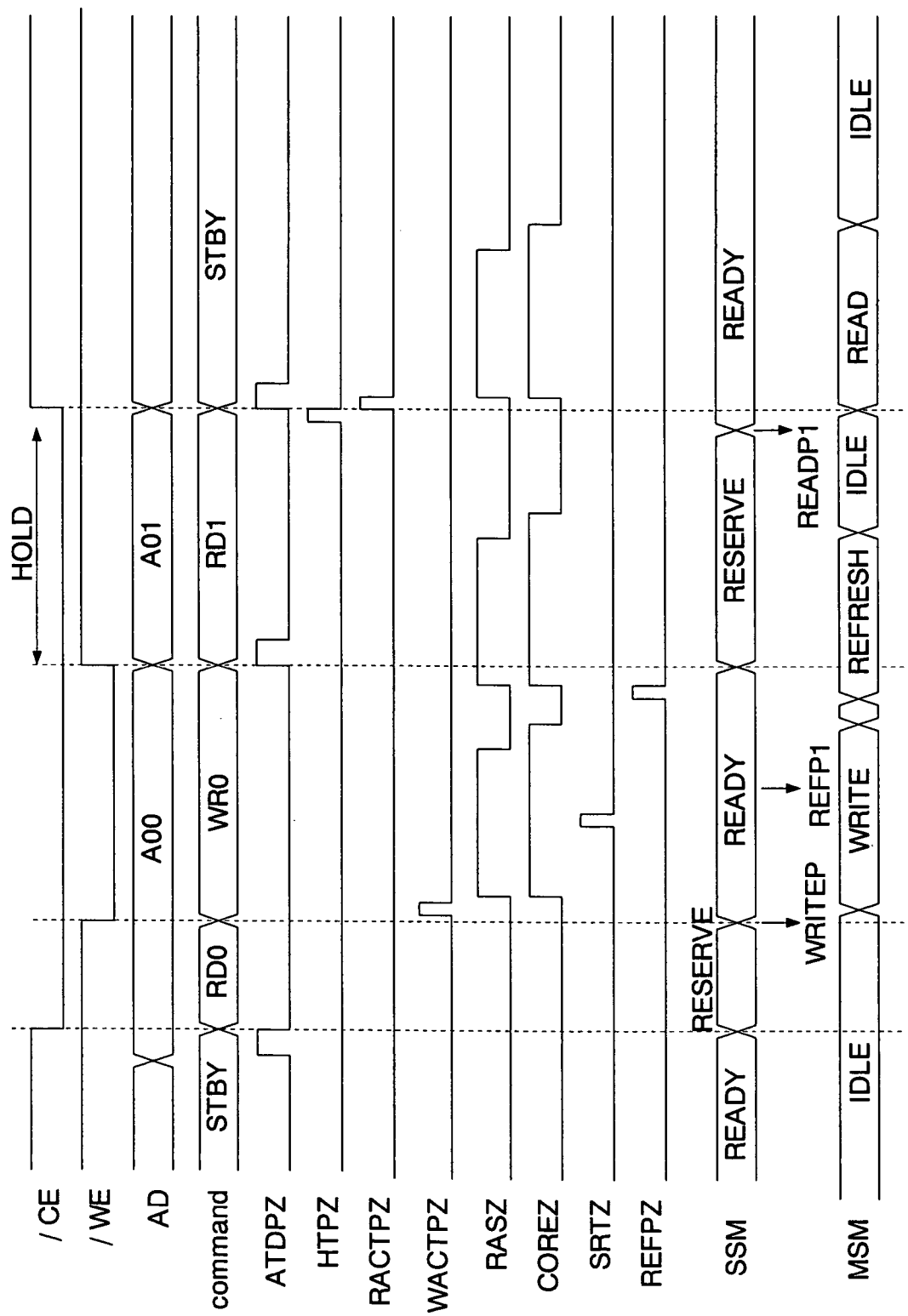
FIG. 63 is a timing chart showing an operation of the FCRAM in the case where in the reserve state the write command and the read command which satisfies the hold time are supplied and the refresh command occurs during write operation.

FIG. 63 shows an operation of the FCRAM when the write command WR and the read command RD that satisfies the hold time HOLD are supplied in the reserve state RESERVE, and the refresh command REF occurs during the execution of the write operation. This example deals with the operation corresponding to FIG. 51 of the foregoing fourth embodiment. The commands to be supplied from exterior and the supply timing thereof are the same as in FIG. 51 of the fourth embodiment. Moreover, the operations corresponding to the write command WR0 and the refresh command REF are the same as in FIG. 60 seen above. The operation corresponding to the read command RD1 is the same as in FIG. 61 seen above.

Figure 64:
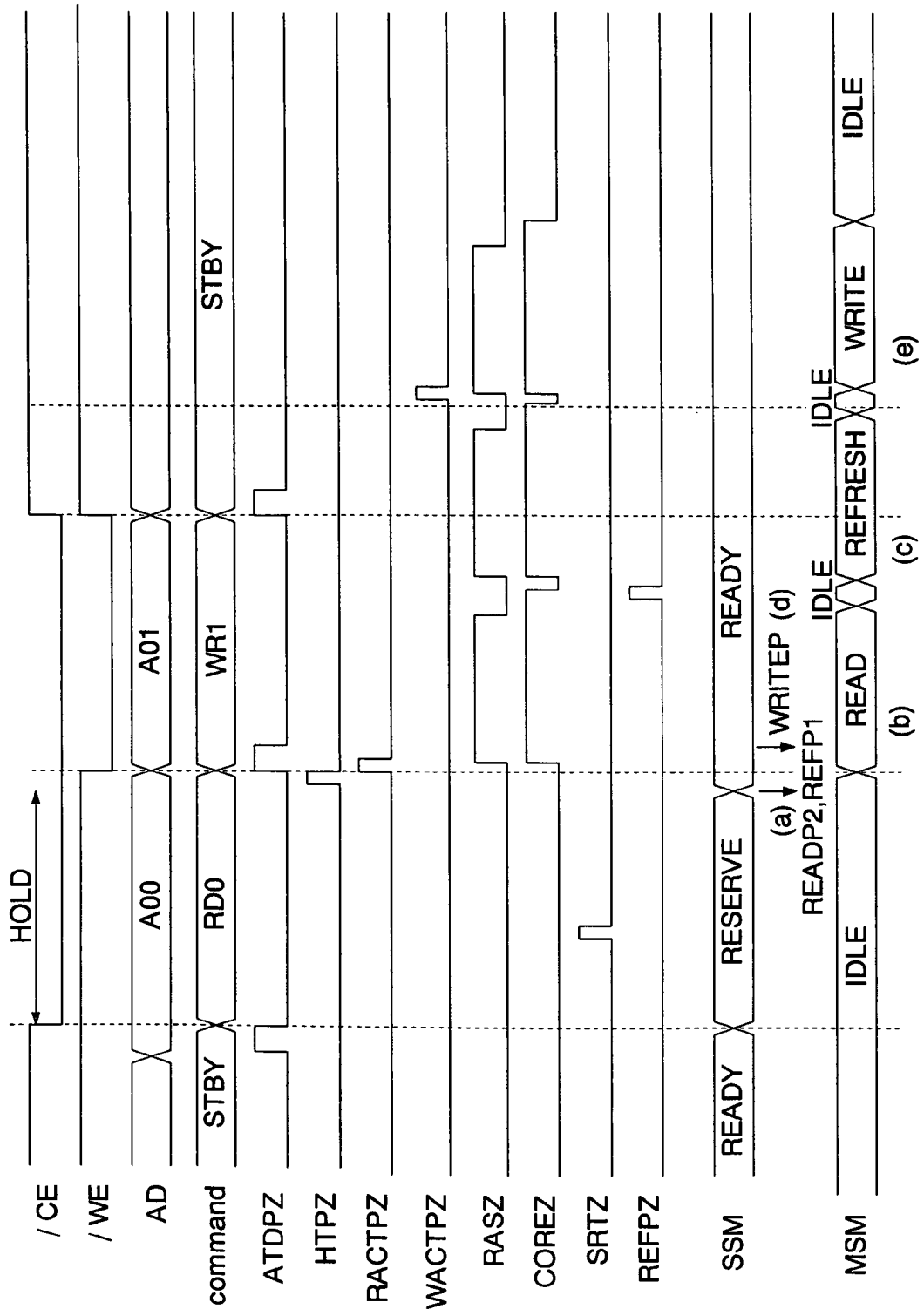
FIG. 64 is a timing chart showing an operation of the FCRAM in the case where the refresh command which satisfies the hold time occurs in the reserve state then the write command is supplied.

FIG. 64 shows an operation of the FCRAM when the refresh command REF occurs in the reserve state RESERVE that satisfies the hold period, and then the write command WR is supplied.

The sub state machine SSM generates the read permission READP2 and the refresh permission REFP1 after the hold time HOLD corresponding to the read command RD0 has elapsed (FIG. 64(a)). The main state machine MSM receives the read permission READP2 in the idle state IDLE, changes to the read state READ, and performs a read operation (FIG.

64(*b*)). After the execution of the read operation, the main state machine MSM returns to the idle state IDLE, and changes to the refresh state REFRESH in order to perform a refresh operation immediately (FIG. 64(*c*)).

The sub state machine SSM receives the write command WR1 during the read operation, and generates the write permission WRITEP (FIG. 64(*d*)). After the execution of the read operation, the main state machine MSM returns to the idle state IDLE, and changes to the write state WRITE in order to perform a write operation immediately (FIG. 64(*e*)).

This embodiment can provide the same effects as those of the first and fourth embodiments described above. Moreover, in this embodiment, the write operation is started in response to the beginning of the write command WR. This can reduce the period of the idle state IDLE of the main state machine MSM during the write cycle. As a result, the memory core 28 can be improved in operation efficiency.

The foregoing embodiments have dealt with the cases where the present invention is applied to an FCRAM. However, the present invention is not limited to such embodiments. For example, the present invention may be applied to pseudo SRAMs other than the FCRAM.

The invention is not limited to the above embodiments and various modifications may be made without departing from the spirit and scope of the invention. Any improvement may be made in part or all of the components.

What is claimed is:

1. A semiconductor memory comprising:
a memory core having a memory cell that requires a refresh for data retention;
a refresh control circuit that generates at predetermined intervals a refresh command to refresh said memory cell;
a sub state machine that issues a refresh permission, a read permission, and a write permission to operate said memory core, in accordance with the refresh command, and a read command and a write command supplied from exterior, respectively; and
a main state machine that makes said memory core perform a refresh operation according to the refresh permission, perform a read operation according to the read permission, and perform a write operation according to the write permission, wherein:
said sub state machine has a ready state and a reserve state, the ready state being a state to which the sub state machine makes a transition when no read command is supplied the reserve state being a state to which the sub state machine makes a transition from the ready state in response to the read command;
said main state machine has an idle state in which it puts said memory core in nonoperation, a read state in which it makes said memory core perform a read operation, a write state in which it makes said memory core perform a write operation, and a refresh state in which it makes said memory core perform a refresh operation.

2. The semiconductor memory according to claim 1, wherein:
said sub state machine issues a read permission a predetermined time after transiting from the ready state to the reserve state in response to the read command, and makes a transition from the reserve state to the ready state; and
said main state machine makes a transition from the idle state to the read state in order to perform the read operation in response to the read permission.

3. The semiconductor memory according to claim 2, wherein when receiving a new read command in the reserve state corresponding to the read command, said sub state machine resets the reserve state, and makes a transition to a new reserve state in order to measure the predetermined time again.

4. The semiconductor memory according to claim 2, wherein:
said sub state machine issues the read permission and refresh permission the predetermined time after receiving the refresh command in the reserve state; and
after the read operation in response to the read permission, said main state machine makes a transition from the idle state to the refresh state in order to perform the refresh operation in response to the refresh permission.

5. The semiconductor memory according to claim 2, wherein:
when receiving the refresh command and a new read command in succession in the reserve state before the predetermined time has elapsed, said sub state machine issues a refresh permission, resets the reserve state, and makes a transition to a new reserve state; and
said main state machine makes a transition from the idle state to the refresh state in order to perform the refresh operation in response to the refresh permission.

6. The semiconductor memory according to claim 2, wherein:
when receiving the write command in the reserve state before the predetermined time has elapsed, said sub state machine issues a write permission and makes a transition to the ready state; and
said main state machine makes a transition from the idle state to the write state in order to perform the write operation in response to the write permission.

7. The semiconductor memory according to claim 5, wherein
said main state machine makes a transition to the write state after the idle state when the write permission is issued in its transition to one of the refresh state and the read state.

8. The semiconductor memory according to claim 5, wherein
said main state machine makes a transition from the idle state to the write state in response to an end of the write command.

9. The semiconductor memory according to claim 5, wherein
said main state machine makes a transition from the idle state to the write state in response to a start of the write command.

10. The semiconductor memory according to claim 2, wherein
said main state machine makes a transition to the read state after the idle state when the read permission is issued in its transition to one of the read state, the write state and the refresh state.

11. The semiconductor memory according to claim 1, wherein:
when receiving the refresh command in the ready state, said sub state machine remains in the ready state and issues a refresh permission; and
said main state machine makes a transition from the idle state to the refresh state in order to perform the refresh operation in response to the refresh permission.

12. The semiconductor memory according to claim 10, wherein said main state machine makes a transition to the refresh state after the idle state when the refresh permission is issued in its transition to one of the read state and the write state.

13. The semiconductor memory according to claim 1, wherein when receiving, in the reserve state, a standby command to put said memory core in nonoperation, said sub state machine makes a transition from the reserve state to the ready state.

14. The semiconductor memory according to claim 13, wherein:

when receiving the refresh command and the standby command in the reserve state in succession, said sub state machine issues a refresh permission and makes a transition from the reserve state to the ready state; and said main state machine makes a transition from the idle state to the refresh state in order to perform the refresh operation in response to the refresh permission.

15. The semiconductor memory according to claim 14, wherein said main state machine makes a transition to the refresh state after the idle state when the refresh permission is issued in its transition to one of the read state and the write state.

16. The semiconductor memory according to claim 1, wherein:

when receiving the write command in the ready state, said sub state machine remains in the ready state and issues a write permission; and said main state machine makes a transition from the idle state to the write state in order to perform the write operation in response to the write permission.

17. The semiconductor memory according to claim 16, wherein said main state machine makes a transition to the write state after the idle state when the write permission is issued in its transition to one of the refresh state and the read state.

18. The semiconductor memory according to claim 16, wherein said main state machine makes a transition from the idle state to the write state in response to an end of the write command.

19. The semiconductor memory according to claim 16, wherein said main state machine makes a transition from the idle state to the write state in response to a start of the write command.

20. The semiconductor memory according to claim 1, wherein said main state machine makes a transition to the idle state from the read state after completion of the read operation, from the write state after completion of the write operation, and from the refresh state after completion of the refresh operation.

* * * * *